US012728540B2

(12) United States Patent
Rangarajan et al.

(10) Patent No.: US 12,728,540 B2
(45) Date of Patent: Sep. 8, 2026

(54) SUBSTRATE HANDLING DEVICE WITH VERTICAL AND HORIZONTAL RAILS FOR CLEANING MODULES

(71) Applicant: Applied Materials, Inc., Santa Clara, CA (US)

(72) Inventors: Jagan Rangarajan, San Jose, CA (US); Edward Golubovsky, San Jose, CA (US); Edwin Velazquez, Union City, CA (US); Adrian S. Blank, Gilroy, CA (US); Steven M. Zuniga, Soquel, CA (US); Balasubramaniam C. Jagannathan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 115 days.

(21) Appl. No.: 18/244,679

(22) Filed: Sep. 11, 2023

(65) Prior Publication Data

US 2024/0100713 A1 Mar. 28, 2024

Related U.S. Application Data

(60) Provisional application No. 63/462,461, filed on Apr. 27, 2023, provisional application No. 63/410,771, filed on Sep. 28, 2022.

(51) Int. Cl.
*B25J 9/04* (2006.01)
*B25J 11/00* (2006.01)
(Continued)

(52) U.S. Cl.
CPC .......... *B25J 11/0095* (2013.01); *B25J 9/042* (2013.01); *B25J 11/0085* (2013.01);
(Continued)

(58) Field of Classification Search
CPC .... B25J 11/0095; B25J 11/0085; B25J 9/042; B25J 15/0206; H01L 21/67718;
(Continued)

(56) References Cited

U.S. PATENT DOCUMENTS 2,998,680 A 9/1961 Lipkins
3,518,798 A 7/1970 Boettcher
(Continued)

FOREIGN PATENT DOCUMENTS

CN 101934491 B 7/2012
CN 103962936 A 8/2014
(Continued)

OTHER PUBLICATIONS

PCT International Search Report and Written Opinion dated Aug. 3, 2021, for International Application No. PCT/US2021/026895.
(Continued)

*Primary Examiner* — Gerald McClain
(74) *Attorney, Agent, or Firm* — Patterson + Sheridan, LLP

(57) ABSTRACT

A cleaning system includes a blade handling assembly configured to transport and clean a substrate. The blade handling assembly for handling a substrate in the cleaning system includes a gripping assembly including a pair of gripping blades, the blades operable with a gripping actuator to hold a substrate at its edges. The assembly includes a first blade actuator for moving the gripping assembly and substrate between a horizontal and a vertical orientation utilizing a first axis. The assembly includes a second blade actuator for moving the vertically oriented gripping assembly and substrate 180 degrees utilizing a second axis, thereby causing the substrate to face an opposite direction.

13 Claims, 38 Drawing Sheets

(51) Int. Cl.
*B25J 15/02* (2006.01)
*H10P 72/30* (2026.01)
*H10P 72/76* (2026.01)

(52) U.S. Cl.
CPC ....... *B25J 15/0206* (2013.01); *H10P 72/3211* (2026.01); *H10P 72/3402* (2026.01); *H10P 72/7602* (2026.01)

(58) Field of Classification Search
CPC ......... H01L 21/68707; H01L 21/67742; H01L 21/67766; H10P 72/3211; H10P 72/7602; H10P 72/33; H10P 72/3402
See application file for complete search history.

(56) References Cited

U.S. PATENT DOCUMENTS 3,659,386 A 5/1972 Goetz et al.
3,665,648 A 5/1972 Yamanaka
3,731,435 A 5/1973 Boettcher et al.
3,762,103 A 10/1973 Nielsen
3,913,271 A 10/1975 Boettcher
4,020,600 A 5/1977 Day
4,021,278 A 5/1977 Hood et al.
4,141,180 A 2/1979 Gill, Jr. et al.
4,502,252 A 3/1985 Iwabuchi
4,509,298 A 4/1985 Klievoneit
4,583,325 A 4/1986 Tabuchi
4,653,231 A 3/1987 Cronkhite et al.
4,944,119 A 7/1990 Gill, Jr. et al.
5,081,051 A 1/1992 Mattingly et al.
5,081,795 A 1/1992 Tanaka et al.
5,216,843 A 6/1993 Breivogel et al.
5,224,304 A 7/1993 Cesna
5,232,875 A 8/1993 Tuttle et al.
5,246,525 A 9/1993 Sato
5,317,778 A 6/1994 Kudo et al.
5,329,732 A 7/1994 Karlsrud et al.
5,361,545 A 11/1994 Nakamura
5,421,768 A 6/1995 Fujiwara et al.
5,443,416 A 8/1995 Volodarsky et al.
5,456,627 A 10/1995 Jackson et al.
5,478,435 A 12/1995 Murphy et al.
5,486,131 A 1/1996 Cesna et al.
5,498,199 A 3/1996 Karlsrud et al.
5,584,647 A 12/1996 Uehara et al.
5,649,854 A 7/1997 Gill, Jr.
5,692,947 A 12/1997 Talieh et al.
5,738,574 A 4/1998 Tolles et al.
5,804,507 A 9/1998 Perlov et al.
5,934,979 A 8/1999 Talieh
5,938,504 A 8/1999 Talieh
5,944,582 A 8/1999 Talieh
6,045,716 A 4/2000 Walsh et al.
6,080,046 A 6/2000 Shendon et al.
6,086,457 A 7/2000 Perlov et al.
6,095,908 A 8/2000 Torii
6,126,517 A 10/2000 Tolles et al.
6,155,768 A 12/2000 Bacchi et al.
6,156,124 A 12/2000 Tobin
6,159,080 A 12/2000 Talieh
6,179,690 B1 1/2001 Talieh
6,200,199 B1 3/2001 Gurusamy et al.
6,220,941 B1 4/2001 Fishkin et al.
6,220,942 B1 4/2001 Tolles et al.
6,227,948 B1 5/2001 Khoury et al.
6,227,950 B1 5/2001 Hempel et al.
6,231,428 B1 5/2001 Maloney et al.
6,241,592 B1 6/2001 Togawa et al.
6,283,822 B1 9/2001 Togawa et al.
6,293,849 B1 9/2001 Kawashima
6,309,279 B1 10/2001 Bowman et al.
6,322,427 B1 11/2001 Li et al.
6,332,826 B1 12/2001 Katsuoka et al.
6,343,979 B1 2/2002 Peltier et al.
6,350,188 B1 2/2002 Bartlett et al.
6,354,918 B1 3/2002 Togawa et al.
6,354,922 B1 3/2002 Sakurai et al.
6,354,926 B1 3/2002 Walsh
6,358,126 B1 3/2002 Jackson et al.
6,361,648 B1 3/2002 Tobin
6,398,625 B1 6/2002 Talieh
6,402,598 B1 6/2002 Ahn et al.
6,409,582 B1 6/2002 Togawa et al.
6,413,146 B1 7/2002 Katsuoka et al.
6,413,356 B1 7/2002 Chokshi et al.
6,413,873 B1 7/2002 Li et al.
6,435,941 B1 8/2002 White
6,447,385 B1 9/2002 Togawa et al.
6,475,914 B2 11/2002 Han
6,572,730 B1 6/2003 Shah
6,575,816 B2 6/2003 Hempel et al.
6,579,148 B2 6/2003 Hirokawa et al.
6,582,282 B2 6/2003 Somekh
6,586,336 B2 7/2003 Jeong
6,592,438 B2 7/2003 Tolles et al.
6,592,439 B1 7/2003 Li et al.
6,629,883 B2 10/2003 Katsuoka et al.
6,682,408 B2 1/2004 Sakurai et al.
6,716,086 B1 4/2004 Tobin
6,780,773 B2 8/2004 Li et al.
6,793,565 B1 9/2004 Chadda et al.
6,805,616 B2 10/2004 Kawashima
6,811,618 B2 11/2004 Kuroda
6,817,923 B2 11/2004 Smith
6,841,057 B2 1/2005 Wadensweiler et al.
6,842,932 B2 1/2005 Ishihara
6,848,976 B2 2/2005 Somekh
6,852,017 B2 2/2005 Brown
6,857,941 B2 2/2005 Emami et al.
6,869,345 B2 3/2005 Brown
6,872,129 B2 3/2005 Tobin
6,878,044 B2 4/2005 Sakurai et al.
6,916,231 B2 7/2005 Wakabayashi
6,918,814 B2 7/2005 Katsuoka et al.
6,935,934 B2 8/2005 Walsh
6,937,005 B2 8/2005 Hofer et al.
6,942,541 B2 9/2005 Togawa et al.
6,942,545 B2 9/2005 Jeong
6,949,466 B2 9/2005 Jeong
6,951,507 B2 10/2005 Talieh
6,969,305 B2 11/2005 Kimura et al.
6,977,036 B2 12/2005 Wadensweiler et al.
7,004,815 B2 2/2006 Jeong
7,011,569 B2 3/2006 Shimizu et al.
7,044,832 B2 5/2006 Yilmaz et al.
7,063,603 B2 6/2006 Moore et al.
7,066,791 B2 6/2006 Brown
7,070,475 B2 7/2006 Manens et al.
7,074,109 B1 7/2006 Bennett et al.
7,077,721 B2 7/2006 Hu et al.
7,084,064 B2 8/2006 Liu et al.
7,097,544 B1 8/2006 Tolles et al.
7,101,253 B2 9/2006 Olgado
7,101,255 B2 9/2006 Katsuoka et al.
7,104,867 B2 9/2006 Jeong
7,104,875 B2 9/2006 Birang et al.
7,166,016 B1 1/2007 Chen
7,198,551 B2 4/2007 Talieh
7,238,090 B2 7/2007 Tolles et al.
7,241,203 B1 7/2007 Chen et al.
7,255,632 B2 8/2007 Tolles et al.
7,273,408 B2 9/2007 Chen et al.
7,303,467 B2 12/2007 Birang et al.
7,390,744 B2 6/2008 Jia et al.
7,614,939 B2 11/2009 Tolles et al.
7,644,512 B1 1/2010 Liu et al.
7,651,384 B2 1/2010 Golden et al.
7,694,688 B2 * 4/2010 Lester .............. H01L 21/67766
134/140
8,079,894 B2 12/2011 Tolles et al.
8,137,162 B2 3/2012 Abrahamians et al.
8,172,643 B2 5/2012 Yilmaz et al.
8,202,140 B2 6/2012 Hong et al.

(56) References Cited

U.S. PATENT DOCUMENTS

| | | | |
|---|---|---|---|
| 8,211,242 B2 | 7/2012 | Inoue et al. | |
| 8,276,291 B2 | 10/2012 | Liu et al. | |
| 8,308,529 B2 | 11/2012 | D'Ambra et al. | |
| 8,322,963 B2 | 12/2012 | Hudgens et al. | |
| 8,967,935 B2 | 3/2015 | Goodman et al. | |
| 8,968,055 B2 | 3/2015 | Chen et al. | |
| 9,017,138 B2 | 4/2015 | Chen et al. | |
| 9,227,293 B2 | 1/2016 | David et al. | |
| 9,352,441 B2 | 5/2016 | Zuniga et al. | |
| 9,358,662 B2 | 6/2016 | Miyazaki et al. | |
| 9,421,617 B2 | 8/2016 | Goodman et al. | |
| 9,434,045 B2 | 9/2016 | Yeh et al. | |
| 9,570,311 B2 | 2/2017 | Kuo et al. | |
| 9,592,585 B2 | 3/2017 | Lin et al. | |
| 9,610,673 B2 | 4/2017 | Torikoshi | |
| 9,687,955 B2 | 6/2017 | Watanabe et al. | |
| 10,002,777 B2 | 6/2018 | Kweon et al. | |
| 10,008,380 B2 | 6/2018 | Ishibashi et al. | |
| 10,040,166 B2 | 8/2018 | Nabeya et al. | |
| 10,090,189 B2 | 10/2018 | Ishibashi | |
| 10,293,455 B2 | 5/2019 | Nabeya et al. | |
| 10,478,938 B2 | 11/2019 | Torikoshi | |
| 10,486,285 B2 | 11/2019 | Miyazaki et al. | |
| 10,513,006 B2 | 12/2019 | Wu et al. | |
| 10,518,382 B2 | 12/2019 | Kweon et al. | |
| 11,289,347 B2 | 3/2022 | Rangarajan et al. | |
| 11,705,354 B2 | 7/2023 | Hoey et al. | |
| 11,749,552 B2 | 9/2023 | Rangarajan et al. | |
| 2002/0003994 A1* | 1/2002 | Davis ................ | H01L 21/67766 414/222.01 |
| 2002/0009954 A1 | 1/2002 | Togawa et al. | |
| 2002/0115392 A1 | 8/2002 | Kawashima | |
| 2002/0197946 A1 | 12/2002 | Emami et al. | |
| 2003/0003848 A1 | 1/2003 | Tobin | |
| 2003/0017706 A1 | 1/2003 | Moore et al. | |
| 2003/0019855 A1 | 1/2003 | Schubert | |
| 2003/0022497 A1 | 1/2003 | Li et al. | |
| 2003/0026683 A1 | 2/2003 | Govzman et al. | |
| 2003/0198551 A1* | 10/2003 | Schmidt ............ | H01L 21/67259 414/749.1 |
| 2003/0202092 A1 | 10/2003 | Sadighi et al. | |
| 2004/0023495 A1 | 2/2004 | Butterfield et al. | |
| 2004/0053560 A1 | 3/2004 | Sun et al. | |
| 2004/0053566 A1 | 3/2004 | Tolles et al. | |
| 2004/0072445 A1 | 4/2004 | Sun et al. | |
| 2004/0072499 A1 | 4/2004 | Wakabayashi | |
| 2004/0097169 A1 | 5/2004 | Moore | |
| 2004/0137823 A1 | 7/2004 | Sakurai et al. | |
| 2005/0070210 A1 | 3/2005 | Jeong | |
| 2005/0176349 A1 | 8/2005 | Mlmaz et al. | |
| 2005/0178666 A1 | 8/2005 | Tsai et al. | |
| 2005/0227586 A1 | 10/2005 | Jeong | |
| 2005/0233578 A1 | 10/2005 | Jia et al. | |
| 2005/0272352 A1 | 12/2005 | Polyak et al. | |
| 2005/0282472 A1 | 12/2005 | Jeong | |
| 2006/0003672 A1 | 1/2006 | Yoshida et al. | |
| 2006/0003673 A1 | 1/2006 | Moore | |
| 2006/0030156 A1 | 2/2006 | Butterfield et al. | |
| 2006/0035563 A1 | 2/2006 | Kalenian et al. | |
| 2006/0046623 A1 | 3/2006 | Wang et al. | |
| 2006/0057812 A1 | 3/2006 | Liu et al. | |
| 2006/0070872 A1 | 4/2006 | Mavliev et al. | |
| 2006/0105680 A1 | 5/2006 | Jeong | |
| 2006/0172671 A1 | 8/2006 | Chen et al. | |
| 2006/0183407 A1 | 8/2006 | David | |
| 2007/0066200 A9 | 3/2007 | Li et al. | |
| 2007/0077861 A1 | 4/2007 | Chen | |
| 2007/0096315 A1 | 5/2007 | Manens et al. | |
| 2007/0128982 A1 | 6/2007 | Lee et al. | |
| 2008/0026681 A1 | 1/2008 | Butterfield et al. | |
| 2008/0035474 A1 | 2/2008 | Wang et al. | |
| 2008/0038993 A1 | 2/2008 | Jeong | |
| 2008/0047841 A1 | 2/2008 | Manens et al. | |
| 2008/0051014 A1 | 2/2008 | Jeong et al. | |
| 2008/0156657 A1 | 7/2008 | Butterfield et al. | |
| 2008/0166958 A1 | 7/2008 | Golden et al. | |
| 2008/0239308 A1 | 10/2008 | Ravid et al. | |
| 2008/0242202 A1 | 10/2008 | Wang et al. | |
| 2008/0274673 A1 | 11/2008 | Adachi | |
| 2008/0287240 A1* | 11/2008 | Hibino ..................... | B25J 9/102 475/11 |
| 2009/0068934 A1 | 3/2009 | Hong et al. | |
| 2009/0196724 A1 | 8/2009 | Chen et al. | |
| 2009/0270015 A1 | 10/2009 | D'Ambra et al. | |
| 2009/0305612 A1 | 12/2009 | Miyazaki et al. | |
| 2012/0064800 A1 | 3/2012 | Watanabe et al. | |
| 2012/0135148 A1 | 5/2012 | Deguchi et al. | |
| 2012/0322345 A1 | 12/2012 | Rangarajan et al. | |
| 2013/0115862 A1 | 5/2013 | Rangarajan et al. | |
| 2013/0199405 A1 | 8/2013 | Rangarajan et al. | |
| 2013/0288578 A1 | 10/2013 | Chen et al. | |
| 2014/0003890 A1 | 1/2014 | Goto | |
| 2014/0030048 A1* | 1/2014 | Kosuge ............. | H01L 21/67313 414/225.01 |
| 2014/0213157 A1 | 7/2014 | Torikoshi | |
| 2014/0220863 A1 | 8/2014 | Wu et al. | |
| 2015/0044944 A1 | 2/2015 | Chen | |
| 2015/0098773 A1 | 4/2015 | Rice et al. | |
| 2015/0318179 A1 | 11/2015 | Yeh et al. | |
| 2015/0367464 A1 | 12/2015 | Chen | |
| 2016/0096211 A1 | 4/2016 | Izaki | |
| 2018/0311784 A1 | 11/2018 | Trojan | |
| 2021/0323117 A1 | 10/2021 | Rangarajan et al. | |
| 2022/0013394 A1 | 1/2022 | Hoey et al. | |
| 2022/0111485 A1 | 4/2022 | Chae et al. | |
| 2022/0134505 A1 | 5/2022 | Golubovsky et al. | |
| 2023/0264319 A1 | 8/2023 | Golubovsky et al. | |
| 2023/0352337 A1 | 11/2023 | Rangarajan et al. | |

FOREIGN PATENT DOCUMENTS

| | | | |
|---|---|---|---|
| CN | 102725830 | B | 3/2016 |
| CN | 104303272 | B | 6/2017 |
| CN | 105904335 | B | 4/2019 |
| CN | 112570332 | A | 3/2021 |
| DE | 3411120 | A1 | 11/1984 |
| DE | 3737904 | A1 | 5/1989 |
| EP | 1738871 | B1 | 2/2009 |
| JP | 200276094 | A | 3/2002 |
| JP | 2019021859 | A | 2/2019 |
| JP | 202157378 | A | 4/2021 |
| JP | 2023518649 | A | 5/2023 |
| KR | 101484120 | B1 | 1/2015 |
| KR | 10-2022-0047160 | A | 4/2022 |
| KR | 10-2022-0122709 | A | 9/2022 |
| WO | 02089183 | A2 | 11/2002 |
| WO | 2019089467 | A1 | 5/2019 |
| WO | 2020150072 | A1 | 7/2020 |
| WO | 2022010555 | A1 | 1/2022 |

OTHER PUBLICATIONS

International Search Report and Written Opinion dated Jan. 25, 2024 for Application No. PCT/US2023/032244.

Office Action from South Korean Patent Application No. 10-2025-7013061 dated Feb. 2, 2026.

Office Action from Japanese Patent Application No. 2025-517585, dated Jun. 9, 2026.

* cited by examiner 106
105
112A
112B
161
161
161
160
107A
107
107B
109A
109C
109C
109B
110A
110C
108
D
110B
110A
111A
111B
111B
111C
111C
111D
111
102
100
X
Z
Y

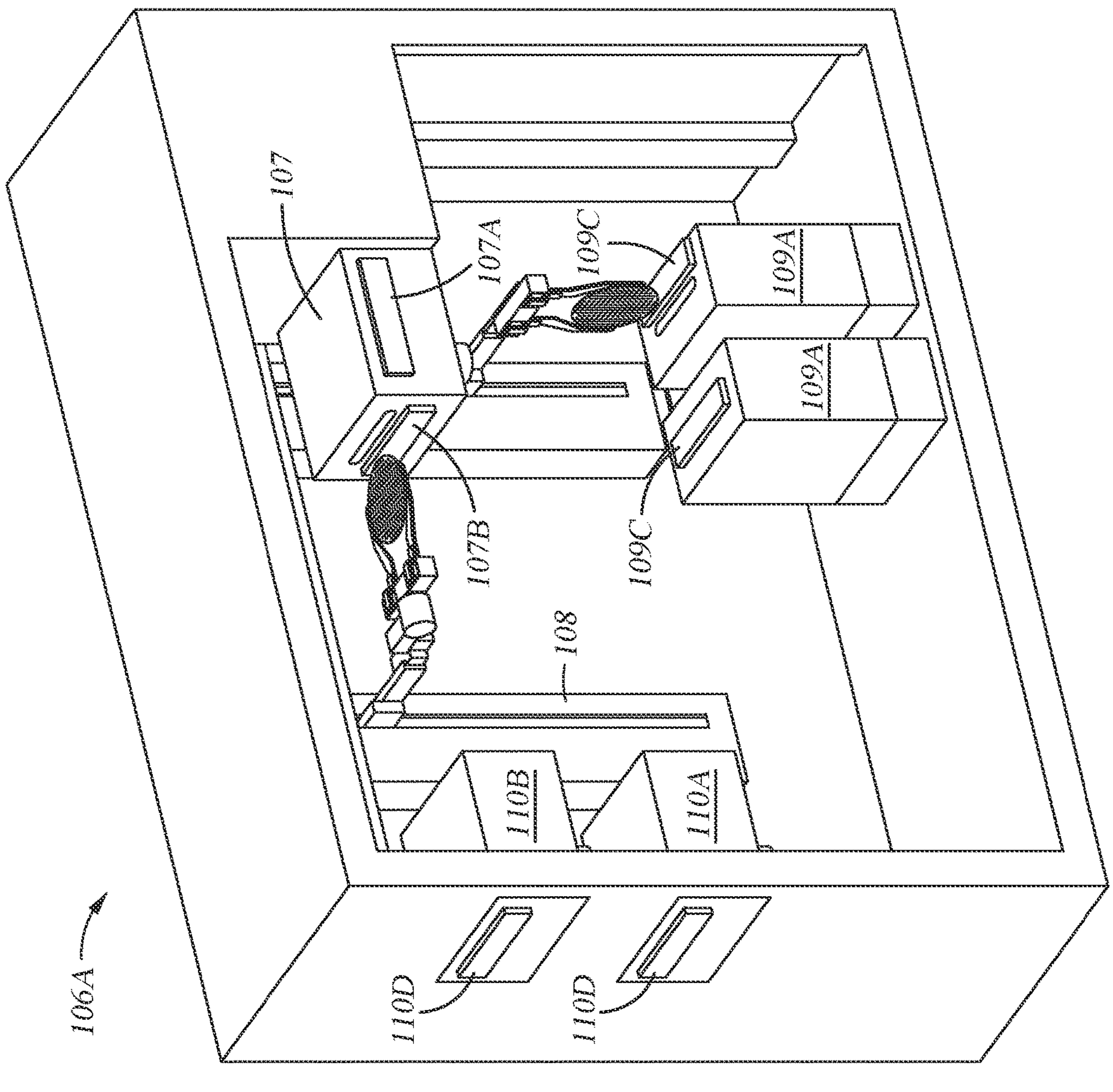
*Fig. 3*
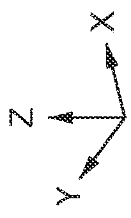

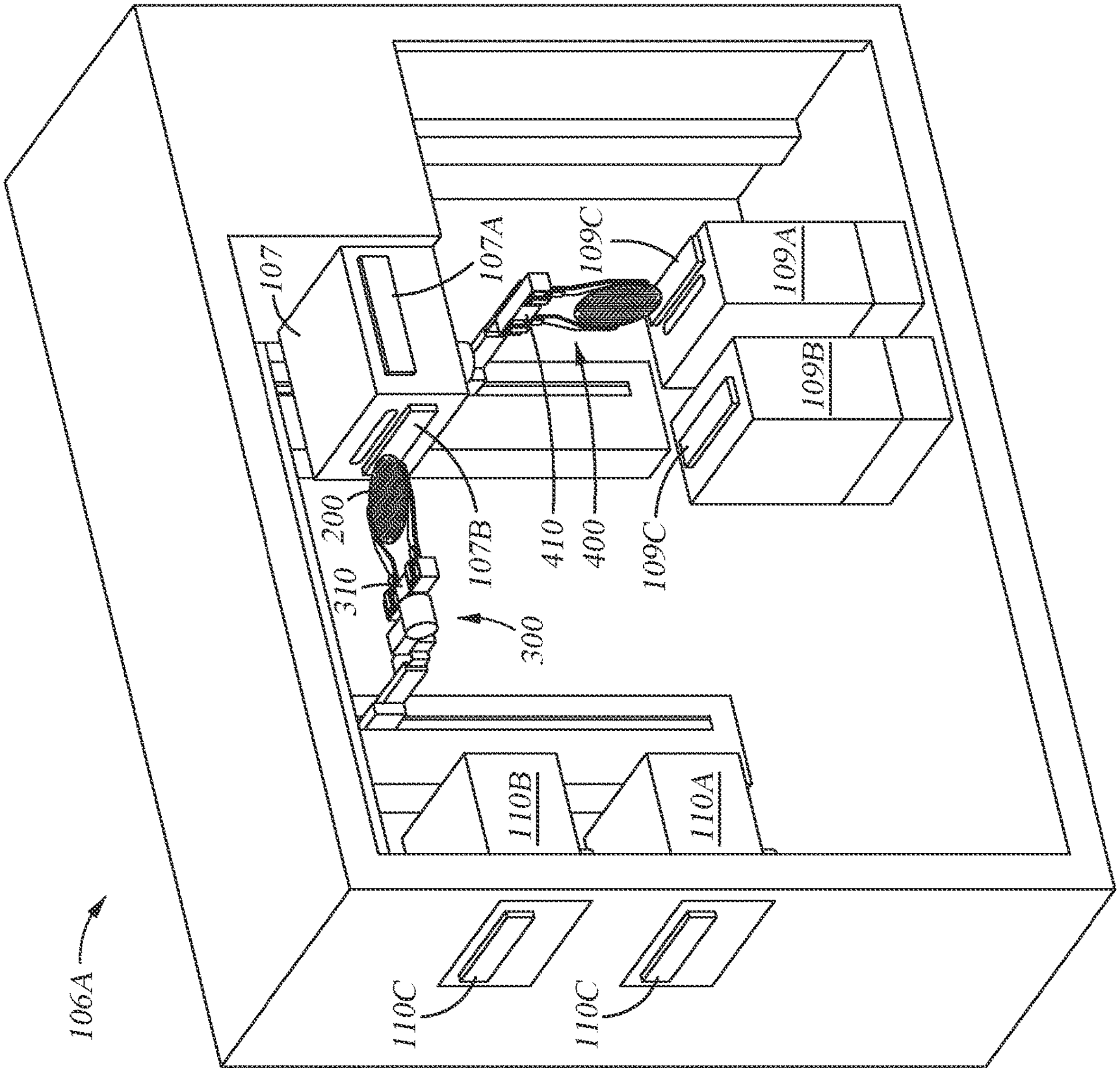
*Fig. 6*
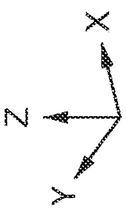

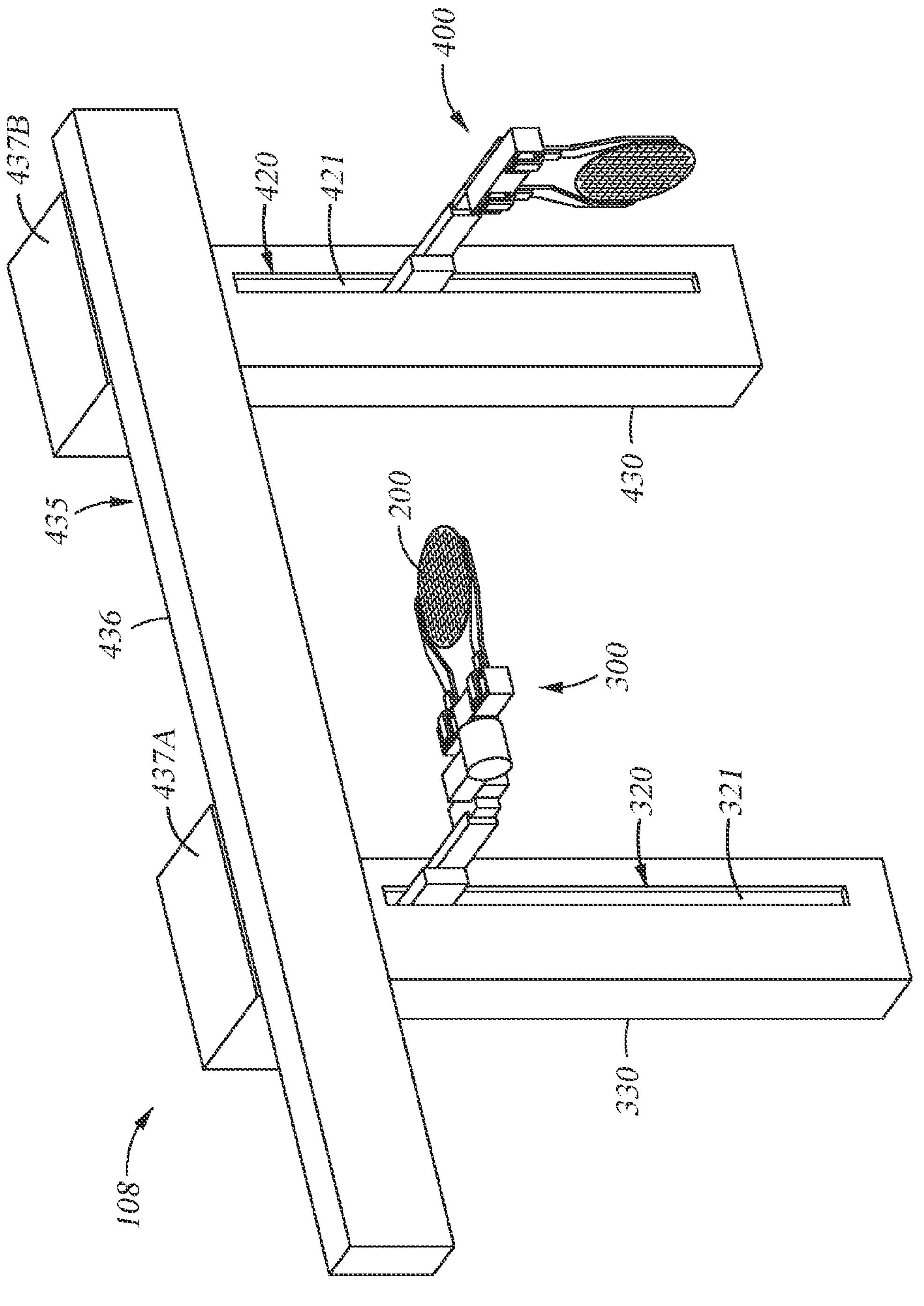
*Fig. 7*
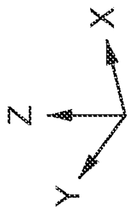

360

394
390
396
314A
314
$A2_1$
$A2_2$
300
312
392
312C
$A1_2$
312B
314C
$A1_1$
314B
312A
376
370
370
310
393
200

SUBSTRATE HANDLING DEVICE WITH VERTICAL AND HORIZONTAL RAILS FOR CLEANING MODULES

CROSS REFERENCE TO RELATED APPLICATIONS

This application claims the benefit of U.S. provisional patent application Ser. No. 63/410,771, filed Sep. 28, 2022, and U.S. provisional patent application Ser. No. 63/462,461, filed Apr. 27, 2023, which are both herein incorporated by reference.

BACKGROUND

Field

Embodiments described herein generally relate to equipment used in the manufacturing of electronic devices, and more particularly, to a substrate processing system which may be used to clean the surface of a substrate.

Description of the Related Art

Substrate processing units may perform chemical mechanical polishing (CMP), which is commonly used in the manufacturing of high-density integrated circuits to planarize or polish a layer of material deposited on a substrate. In a typical CMP process, a substrate is retained in a carrier head that presses the backside of the substrate towards a rotating polishing pad in the presence of a polishing fluid. Material is removed across the material layer surface of the substrate in contact with the polishing pad through a combination of chemical and mechanical activity which is provided by the polishing fluid and a relative motion of the substrate and the polishing pad. Typically, after one or more CMP processes are completed, a polished substrate is further processed by use of one or more post-CMP substrate processing operations in a CMP processing system. For example, the polished substrate may be further processed using one or more cleaning operations in a cleaning unit. Various cleaning operations may be performed in a cleaning unit having multiple cleaning stations, i.e., cleaning chambers. Once the post-CMP operations are complete, the substrate can be removed from a CMP processing system and then delivered to the next device manufacturing system, such as a lithography, etch, or deposition system.

In cleaning units having multiple cleaning chambers, limited space is available for transferring substrates between the various chambers. The space limitation problem is exacerbated when a substrate has to be manipulated between vertical and horizontal positions for insertion and removal from different types of chambers. For example, some first cleaning chambers require a substrate to be inserted in a horizontal orientation while some second cleaning chambers, such as those chambers typically encountered after being cleaned in the first cleaning chamber, necessitate a vertical orientation. Thereafter, transferring a substrate from a vertically oriented cleaning chamber to another horizontally oriented cleaning chamber requires it to be oriented back to a horizontal position. Additionally, each chamber requiring a substrate to be horizontally arranged requires the substrate to be oriented "device side up" meaning the side upon which semiconductor devices have been formed must be facing upwards. The ultimate challenge in cleaning enclosures is to minimize air exposure time in order to prevent the substrates from being exposed to oxidation and particulate matter between cleaning stations. For this reason, the chambers are arranged as closely together as possible, leaving little room for robot-like devices to grasp a substrate, change its orientation and insert it into another chamber.

Typically, a substrate enters a cleaning unit of a CMP tool from a polisher and is inserted and acted upon by a first cleaning chamber. Thereafter, the substrate is moved to one or more second cleaning chambers and then to a final cleaning chamber. Because the substrate becomes increasingly "clean" as it moves through the process, the last transfer from the second cleaning chambers to the final cleaning chamber is the most critical because time and manipulation creates the most opportunity for oxidation and a contamination.

What is needed is a device that can manipulate a substrate between two degrees of rotation at a predetermined step in a cleaning process, thereby reducing the footprint of the cleaning enclosure and with it, the time needed to move the substrate between chambers towards the end of the process. In one example, particles may become deposited on the substrate as the substrate is delivered from the second cleaning chamber to the dryer chamber. Accordingly, the post-CMP cleaning process may not provide optimum particle-free performance.

Accordingly, what is also needed is an improved final drying process in the final cleaning chamber. Accordingly, what is needed in the art are apparatus and methods for solving the problems described above.

SUMMARY

Embodiments described herein generally relate to equipment used in the manufacturing of electronic devices, and more particularly, to a cleaning system and related methods which may be used to clean the surface of a substrate in a semiconductor device manufacturing process.

In one embodiment, a substrate cleaning unit includes a pre-clean module configured to perform a pre-clean process on a substrate with the substrate in a horizontal orientation. The unit includes a first cleaning chamber configured to perform a first cleaning process on the substrate with the substrate in a vertical orientation. The unit includes a second cleaning chamber configured to perform a second cleaning process on the substrate with the substrate in the vertical orientation. The unit includes an integrated cleaning and drying module configured to perform a cleaning and drying process on the substrate in the horizontal orientation. The unit includes a substrate handler configured to transfer the substrate from the pre-clean module to the first cleaning chamber, from the first cleaning chamber to the second cleaning chamber, and from the second cleaning chamber to the integrated cleaning and drying module. The first cleaning chamber and the second cleaning chamber are positioned below the pre-clean module.

In another embodiment, a substrate cleaning system includes a first substrate cleaning unit, a second substrate cleaning unit, and a first substrate handler configured to transfer a substrate from a polishing system to one of the first substrate cleaning unit and the second substrate cleaning unit. Each of the units includes a pre-clean module configured receive the substrate form the first substrate handler and to perform a pre-clean process on the substrate with the substrate in a horizontal orientation. Each of the units includes a first cleaning chamber configured to perform a first cleaning process on the substrate with the substrate in a vertical orientation. Each of the units includes a second cleaning chamber configured to perform a second cleaning process on the substrate with the substrate in the vertical orientation. Each of the units includes an integrated cleaning and drying module configured to perform a cleaning and drying process on the substrate in the horizontal orientation. Each of the units includes a second substrate handler configured to transfer the substrate from the pre-clean module to the first cleaning chamber, from the first cleaning chamber to the second cleaning chamber, and from the second cleaning chamber to the integrated cleaning and drying module. The first cleaning chamber and the second cleaning chamber are positioned below the pre-clean module.

In yet another embodiment, a method of cleaning a substrate includes transferring, with a first substrate handler, a substrate to a pre-clean module in a substrate cleaning system. The method includes, in the pre-clean module, performing a pre-clean process on the substrate with the substrate in a horizontal orientation. The method includes transferring, with a second substrate handler, the substrate from the pre-clean module to a first cleaning chamber in the substrate cleaning system. The method includes, in the first cleaning chamber, performing a first cleaning process on the substrate with the substrate in a vertical orientation. The method includes transferring, with the second substrate handler, the substrate from the first cleaning chamber to a second cleaning chamber in the substrate cleaning system with the substrate in the vertical orientation. The method includes, in the second cleaning chamber, performing a second cleaning process on the substrate with the substrate in the vertical orientation. The method includes transferring, with the second substrate handler, the substrate from the second cleaning chamber to an integrated cleaning and drying module in the substrate cleaning system. The method includes performing, with the integrated cleaning and drying module, a cleaning and drying process on the substrate with the substrate in the horizontal orientation. The first cleaning chamber and the second cleaning chamber are positioned below the pre-clean module.

In another embodiment, a method for handling substrates in a substrate processing system includes translating a substrate retained by a first blade assembly from a processing region of a first cleaning chamber, wherein the first blade assembly is coupled to a first vertical motion actuator and a first horizontal motion actuator, and the substrate retained by the first blade assembly is oriented in a horizontal orientation with a device side up. The method includes rotating the substrate and the first blade assembly 90 degrees from a horizontal orientation to a vertical orientation using a first blade actuator of the first blade assembly. The method includes rotating the substrate and the first blade assembly 180 degrees while the substrate is positioned in or being positioned in the vertical orientation using a second blade actuator of the first blade assembly, causing the device side of the substrate to face an opposite direction. The method includes translating the vertically oriented substrate and the first blade assembly along a horizontal axis, using the first horizontal motion actuator, to a location above a second cleaning chamber. The method includes inserting the substrate into a processing region of the second cleaning chamber using the first vertical motion actuator. The method includes translating the blade assembly along the horizontal axis, using the first horizontal motion actuator, to a third cleaning chamber. The method includes transferring the substrate from the second cleaning chamber to the third cleaning chamber using a second blade assembly coupled to a second vertical motion actuator and a second horizontal motion actuator. The method includes retrieving the substrate from a processing region of the third cleaning chamber using the first blade assembly and the first vertical motion actuator. The method includes rotating the substrate and the first blade assembly 90 degrees from the vertical orientation to a horizontal orientation using the first blade actuator of the blade assembly, wherein the horizontally oriented substrate is oriented with the device side up. The method includes inserting the substrate and the first blade assembly into a processing region of a fourth cleaning chamber using the first horizontal motion actuator.

In another embodiment, a blade handling assembly for handling a substrate includes a gripping assembly including a pair of gripping blades, the blades operable with a gripping actuator to hold a substrate at its edges. The assembly includes a first blade actuator for moving the gripping assembly and substrate between a horizontal and a vertical orientation utilizing a first axis. The assembly includes a second blade actuator for moving the gripping assembly and substrate 180 degrees utilizing a second axis, thereby causing the substrate to face an opposite direction. Movement utilizing the first axis results in rotation of the gripping actuator and second blade actuator and movement utilizing the second axis results in rotation of only the gripping actuator.

In another embodiment, a blade handling assembly for handling a substrate includes a gripping assembly including a pair of gripping blades, the blades operable with a gripping actuator to hold a substrate at its edges. The assembly includes a first blade actuator for moving the gripping assembly and substrate between a horizontal and a vertical orientation. The assembly includes a second blade actuator for moving the gripping assembly and substrate 180 degrees, thereby causing the substrate to face an opposite direction. The assembly includes a first cleaning chamber disposed on a first side of the assembly. The assembly includes a second cleaning chamber disposed on a second side of the assembly. The horizontal distance between the chambers is between 115% and 150% the length of the assembly and substrate when oriented in a horizontal position.

Embodiments of the disclosure may also include a substrate handling device, comprising: a first blade assembly; a first vertical actuator assembly comprising a first vertical rail and a first vertical actuator, wherein the first blade assembly is coupled to a portion of the first vertical rail and is configured to be positioned along the first vertical rail by the first vertical actuator; and a horizontal actuator assembly comprising a horizontal rail and a first rail actuator, wherein the first vertical actuator assembly is coupled to a first portion of the horizontal rail and is configured to be positioned along the horizontal rail by the first rail actuator. The first blade assembly comprising: a gripping assembly comprising a pair of gripping blades and a gripping actuator, wherein the gripping actuator is configured to cause a substrate to be retained between the pair of gripping blades during a first transferring process; a first blade actuator for rotating the gripping assembly about a first axis; and a second blade actuator configured for rotating the gripping assembly about a second axis, wherein the second axis is substantially parallel to a front surface of the substrate, wherein the rotation about the first axis by the first blade actuator results in rotation of the second blade actuator and the gripping assembly, and rotation about the second axis by the second blade actuator results in rotation of the gripping assembly.

Embodiments of the disclosure may also include a substrate handling device, comprising: a gripping assembly including a pair of gripping blades, the blades operable with a gripping actuator to retain a substrate at its edges; a first blade actuator for rotating the gripping assembly and the substrate about a first axis, wherein the first axis is substantially parallel to a front side of the substrate that is held at its edges; a second blade actuator for rotating the gripping assembly and the first blade actuator about a second axis; a first cleaning module having a first side; and a second cleaning module having a first side. The gripping assembly is disposed between the first side of the first cleaning module and the first side of the second cleaning module, and a distance between the first side of the first cleaning module and the first side of the second cleaning module is between 102% and 150% an overall length of the gripping assembly and the retained substrate when the first axis is oriented perpendicular to the first side of the first cleaning module and the first side of the second cleaning module.

Embodiments of the disclosure may also include a substrate handling device, comprising: a first blade assembly; a first vertical actuator assembly comprising a first vertical rail and a first vertical actuator, wherein the first blade assembly is coupled to a portion of the first vertical rail and is configured to be positioned along the first vertical rail by the first vertical actuator; a second blade assembly; a second vertical actuator assembly comprising a second vertical rail and a second vertical actuator, wherein the second blade assembly is coupled to a portion of the second vertical rail and is configured to be positioned along the second vertical rail by the second vertical actuator; and a horizontal actuator assembly. The first blade assembly comprises: a gripping assembly comprising a pair of gripping blades and a gripping actuator, wherein the gripping actuator is configured to cause a substrate to be retained between the pair of gripping blades during a first transferring process; a first blade actuator for rotating the gripping assembly about a first axis, wherein rotating the gripping assembly about the first axis is configured to cause the substrate to be rotated between a horizontal and a vertical orientation during the first transferring process; and a second blade actuator configured for rotating the gripping assembly about a second axis, wherein the second axis is substantially parallel to a front surface of the substrate, and rotating the gripping assembly about a second axis is configured to cause the front surface of the substrate to face an opposite direction during the first transferring process, wherein rotation about the first axis by the first blade actuator results in rotation of the second blade actuator and the gripping assembly, and rotation about the second axis by the second blade actuator results in rotation of the gripping assembly. The second blade assembly comprises: a gripping assembly comprising a pair of gripping blades and a gripping actuator, wherein the gripping actuator is configured to cause a substrate to be retained between the pair of gripping blades during a second transferring process. The horizontal actuator assembly comprises a horizontal rail; a first horizontal rail actuator; and a second horizontal rail actuator, wherein the first vertical actuator assembly is coupled to a first portion of the horizontal rail and is configured to be positioned along the horizontal rail by the first horizontal rail actuator, and the second vertical actuator assembly is coupled to a second portion of the horizontal rail and is configured to be positioned along the horizontal rail by the second horizontal rail actuator.

Embodiments of the disclosure may also include a substrate cleaning system, comprising: a first substrate cleaning unit; and a first substrate handler disposed between the first substrate cleaning unit, and configured to transfer a substrate from a polishing system to the first substrate cleaning unit. The first substrate cleaning unit comprises: a first cleaning chamber configured receive the substrate from the first substrate handler and to perform a first cleaning process on the substrate with the substrate in a horizontal orientation; a second cleaning chamber configured to perform a second cleaning process on the substrate with the substrate in a vertical orientation; a third cleaning chamber configured to perform a third cleaning process on the substrate with the substrate in the vertical orientation; a fourth cleaning chamber configured to perform a fourth cleaning process on the substrate in the horizontal orientation; and a second substrate handler configured to transfer the substrate from the first cleaning chamber to the second cleaning chamber, from the second cleaning chamber to the third cleaning chamber, and from the third cleaning chamber to the fourth cleaning chamber.

Embodiments of the disclosure may also include a substrate cleaning system, comprising: a first substrate cleaning unit; a second substrate cleaning unit; and a first substrate handler disposed between the first substrate cleaning unit and the second substrate cleaning unit, and configured to transfer a substrate from a polishing system to one of the first substrate cleaning unit and the second substrate cleaning unit. The first substrate cleaning unit and the second substrate cleaning unit each comprise: a first cleaning module configured receive the substrate from the first substrate handler and to perform a first cleaning process on the substrate with the substrate in a horizontal orientation; a second cleaning module configured to perform a second cleaning process on the substrate with the substrate in a vertical orientation; a third cleaning module configured to perform a third cleaning process on the substrate with the substrate in the vertical orientation; a fourth cleaning module configured to perform a fourth cleaning process on the substrate in the horizontal orientation; and a second substrate handler configured to transfer the substrate from the first cleaning module to the second cleaning module, from the second cleaning module to the third cleaning module, and from the third cleaning module to the fourth cleaning module. The first substrate cleaning unit and the second substrate cleaning unit may each further comprise a fifth cleaning module configured to perform a fifth cleaning process on the substrate with the substrate in the vertical orientation, wherein the fifth cleaning process is performed in a sequence between performing the third cleaning process in the third cleaning module and performing the fourth cleaning process in the fourth cleaning module.

Embodiments of the disclosure may also include a method of cleaning a substrate by use of the following activities. Transferring, using a first substrate handler, a substrate to a first cleaning module in a substrate cleaning system. Performing, in the first cleaning module, a first cleaning process on the substrate with the substrate in a first orientation. Transferring, using a second substrate handler, the substrate from the first cleaning module to a second cleaning module in the substrate cleaning system, wherein transferring the substrate comprises causes the orientation of the substrate to change from the first orientation to a second orientation; and performing, in the second cleaning module, a second cleaning process on the substrate with the substrate in the second orientation. Transferring, using the second substrate handler, the substrate from the second cleaning module to a third cleaning module in the substrate cleaning system. Performing, in the third cleaning module, performing a third cleaning process on the substrate with the substrate in the second orientation. Transferring, using the second substrate handler, the substrate from the third cleaning module to a fourth cleaning module in the substrate cleaning system, wherein transferring comprises causes the orientation of the substrate to change from the second orientation to the first orientation. Then, performing, with the fourth cleaning module, a fourth cleaning process on the substrate with the substrate in the first orientation, wherein the second cleaning module or the third cleaning module is positioned vertically below the first cleaning module.

Embodiments of the disclosure may also include a method of cleaning a substrate by use of the following activities. Transferring, using a first substrate handler, a substrate to a first cleaning module in a substrate cleaning system. Performing, in the first cleaning module, a first cleaning process on the substrate with the substrate in a first orientation. Transferring, using a second substrate handler, the substrate from the first cleaning module to a second cleaning module in the substrate cleaning system, wherein transferring comprises rotating the substrate about a first axis, which causes the orientation of the substrate to change from the first orientation to a second orientation; and translating the substrate in a first direction. Performing, in the second cleaning module, a second cleaning process on the substrate with the substrate in the second orientation. Transferring, using the second substrate handler, the substrate from the second cleaning module to a third cleaning module in the substrate cleaning system with the substrate in the second orientation, wherein transferring comprises translating the substrate in a second direction, wherein the second direction is opposite to the first direction. Performing, in the third cleaning module, performing a third cleaning process on the substrate with the substrate in the second orientation. Transferring, using the second substrate handler, the substrate from the third cleaning module to a fourth cleaning module in the substrate cleaning system, wherein transferring comprises rotating the substrate about a first axis, which causes the orientation of the substrate to change from the second orientation to a third orientation. Then, performing, with the fourth cleaning module, a fourth cleaning process on the substrate with the substrate in the first orientation.

Embodiments of the disclosure may also include a method of cleaning a substrate by use of the following activities. Transferring, using a first substrate handler, a substrate to a first cleaning module in a substrate cleaning system. Performing, in the first cleaning module, a first cleaning process on the substrate with the substrate in a horizontal orientation. Transferring, using a second substrate handler, the substrate from the first cleaning module to a second cleaning module in the substrate cleaning system. Performing, in the second cleaning module, a second cleaning process on the substrate with the substrate in a vertical orientation. Transferring, using the second substrate handler, the substrate from the second cleaning module to a third cleaning module in the substrate cleaning system with the substrate in the vertical orientation. Performing, in the third cleaning module, performing a third cleaning process on the substrate with the substrate in the vertical orientation. Transferring, using the second substrate handler, the substrate from the third cleaning module to a fourth cleaning module in the substrate cleaning system, and performing, with the fourth cleaning module, a fourth cleaning process on the substrate with the substrate in the horizontal orientation, wherein the second cleaning module or the third cleaning module is positioned vertically below the first cleaning module.

Embodiments of the disclosure may also include a method of cleaning a substrate by use of the following activities. Transferring, using a first substrate handler, a substrate to a first cleaning module in a substrate cleaning system. Performing, in the first cleaning module, a first cleaning process on the substrate with the substrate in a first orientation. Transferring, using a second substrate handler, the substrate from the first cleaning module to a second cleaning module in the substrate cleaning system, wherein transferring comprises rotating the substrate about a first axis, which causes the orientation of the substrate to change from the first orientation to a second orientation, and translating the substrate in a first direction. Performing, in the second cleaning module, a second cleaning process on the substrate with the substrate in the second orientation. Transferring, using the second substrate handler, the substrate from the second cleaning module to a third cleaning module in the substrate cleaning system with the substrate in the second orientation, wherein transferring comprises translating the substrate in a second direction, wherein the second direction is opposite to the first direction. Performing, in the third cleaning module, performing a third cleaning process on the substrate with the substrate in the second orientation. Transferring, using the second substrate handler, the substrate from the third cleaning module to a fourth cleaning module in the substrate cleaning system, wherein transferring comprises rotating the substrate about a first axis, which causes the orientation of the substrate to change from the second orientation to a third orientation, and performing, with the fourth cleaning module, a fourth cleaning process on the substrate with the substrate in the first orientation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a perspective view of portions of an exemplary cleaning system in the CMP processing system, specifically an enclosure with a number of substrate cleaning chambers, according to one or more embodiments.

FIG. 6 is a perspective view of a portion of an enclosure that includes a number of substrate cleaning chambers.

FIG. 7 is a perspective view of horizontal and vertical actuators for moving substrates between chambers.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to equipment used in the manufacturing of electronic devices, and more particularly, to a cleaning system which may be used to clean the surface of a substrate following chemical mechanical polishing of the substrate in a semiconductor device manufacturing process.

Figure 1A:
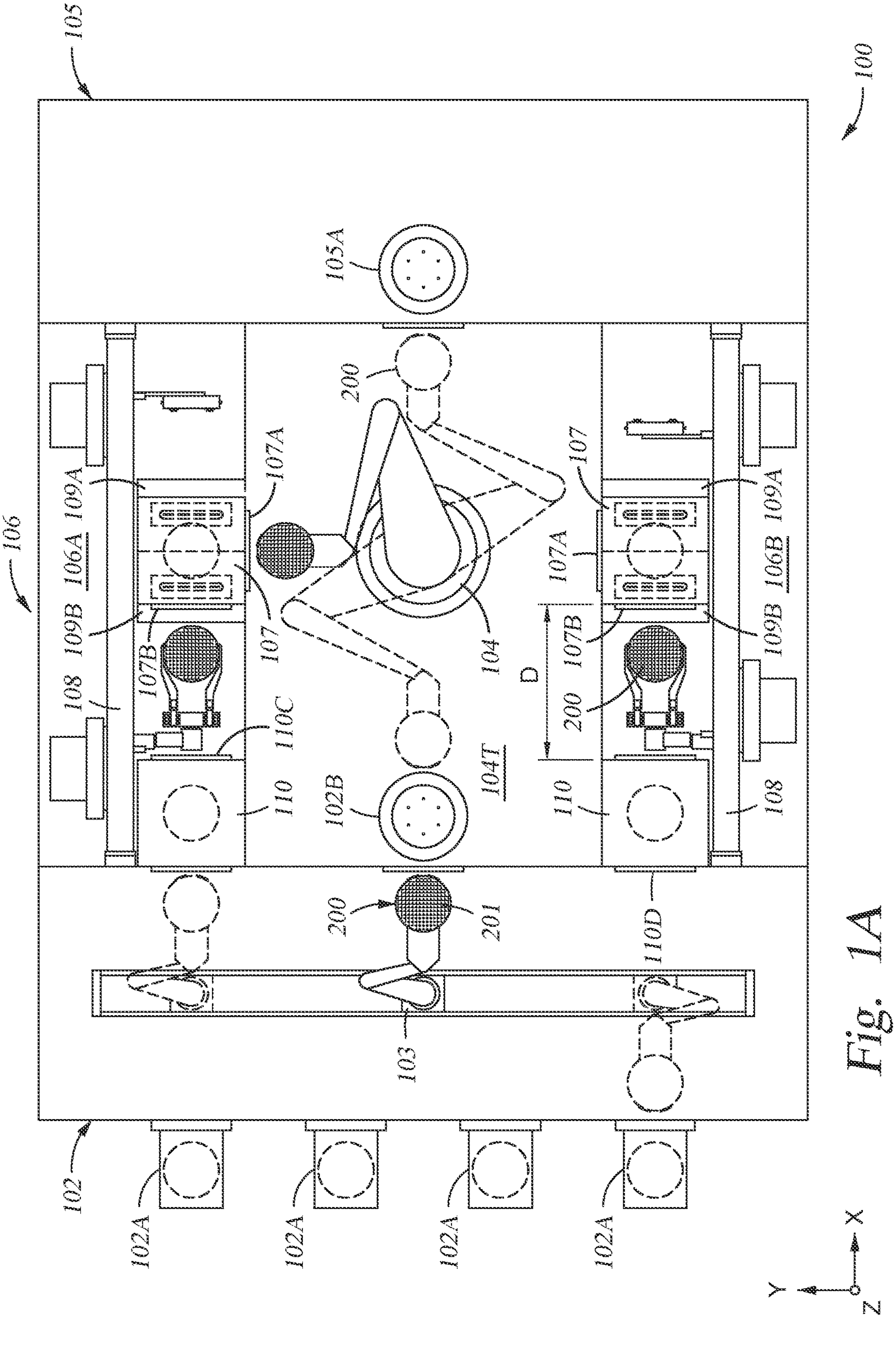
FIG. 1A is a schematic top view of an exemplary chemical mechanical polishing (CMP) processing system according to one or more embodiments.
Figure 1B:
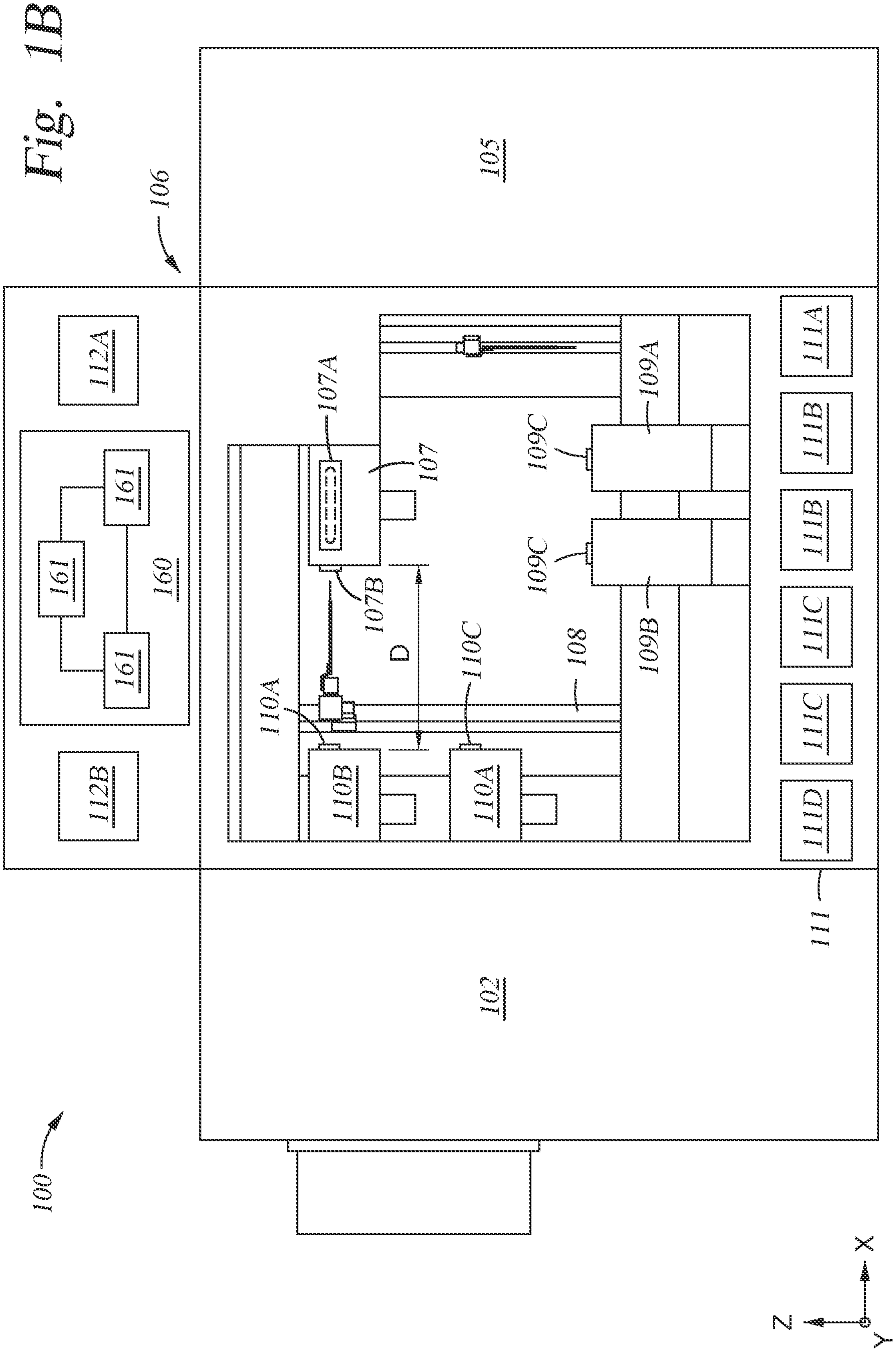
FIG. 1B is a schematic side view of the CMP processing system, according to one or more embodiments.

FIG. 1A is a schematic top view of an exemplary chemical mechanical polishing (CMP) processing system 100 described herein, according to one or more embodiments. FIG. 1B is a schematic side view of the CMP processing system 100, according to one or more embodiments. While the disclosure provided herein primarily discusses various embodiments that can be used in conjunction with a CMP device, such as a polishing station 105, this configuration is not intended to be limiting as to the scope of the disclosure provided herein.

In the figures, certain parts of the housing and certain other internal and external components are omitted to more clearly show aspects of the CMP processing system 100. Here, the CMP processing system 100 is connected to a factory interface 102. The factory interface 102 may include one or more loading stations 102A. The loading stations 102A may be, for example, FOUPs or cassettes. Each loading station 102A may include one or more substrates 200 for CMP processing in the CMP processing system 100.

The CMP processing system 100 may include a polishing station 105, a first substrate handler 103 of the factory interface 102 and a cleaning system 106 that includes a second substrate handler 104. The first substrate handler 103 is positioned to transfer a substrate 200 to and from one or more of the loading stations 102A. For example, the first substrate handler 103 transfers a substrate 200 from a loading station 102A to the cleaning system 106, e.g., to a cleaner pass-through 102B, where the substrate 200 can be picked up by the second substrate handler 104. As another example, the first substrate handler 103 transfers a substrate 200 from the cleaning system 106, e.g., from the cleaning module 110 or cleaner pass-through 102B, to the loading station 102A.

Generally, a substrate 200 that is initially positioned in a loading station 102A has been subject to a prior manufacturing process or processes—such as, for example, wafering, lithography, etching, and/or deposition processes—on a processing surface 201 thereof. The first substrate handler 103 transfers the substrate to and from the loading station 102A with the processing surface 201 facing up.

The second substrate handler 104 may be, for example, a cleaner wet robot. The second substrate handler 104 is positioned to transfer a substrate 200 to and from the polishing station 105 with the processing surface 201 facing in an up or down orientation. For example, the second substrate handler 104 receives a substrate 200 from the cleaner pass-through 102B or the first substrate handler 103 and then transfers the substrate 200 to a transfer station 105A within the polishing system 105. As another example, the second substrate handler 104 retrieves a substrate 200 from the transfer station 105A within the polishing station 105 and then transfers the substrate 200 to a first cleaning chamber, that comprises a first cleaning module 107 in the cleaning system 106. In some embodiments, the first cleaning module 107 could be replaced with a horizontal input station 117 (FIG. 2G) or vertical input station 119 (FIG. 2H). In some embodiments, the second substrate handler 104 can include a substrate flipping capability (e.g., rotating blade wrist assembly) that allows the orientation of a substrate to be flipped from a polished surface of a substrate facing up to the polished surface of the substrate facing down orientation, or vice versa. This ability to flip the substrate during a cleaning process sequence can be useful to allow the cleaning processes performed in the cleaning system 106 to be performed on the front side of the substrate, backside of the substrate, or sequentially performed on both sides of the substrate.

The polishing station 105 is a substrate polishing system that may include a plurality of polishing stations (not shown). The polishing station 105 includes one or more polishing assemblies that are used to polish a substrate 200 received from the second substrate handler using one or more CMP processes. Typically, each of the one or more polishing assemblies will include the use of a polishing platen (not shown) and polishing head (not shown), which is configured to urge the substrate 200 against a polishing pad (not shown) disposed on the polishing platen. Residual abrasive particles and/or liquids such as acidic or basic chemicals may remain on the substrate 200 after undergoing CMP processing in the polishing station 105. Accordingly, the cleaning system 106 is positioned between the polishing station 105 and the factory interface 102 in order to clean the substrate 200 prior to returning the substrate 200 to the loading station 102A.

Figure 4:
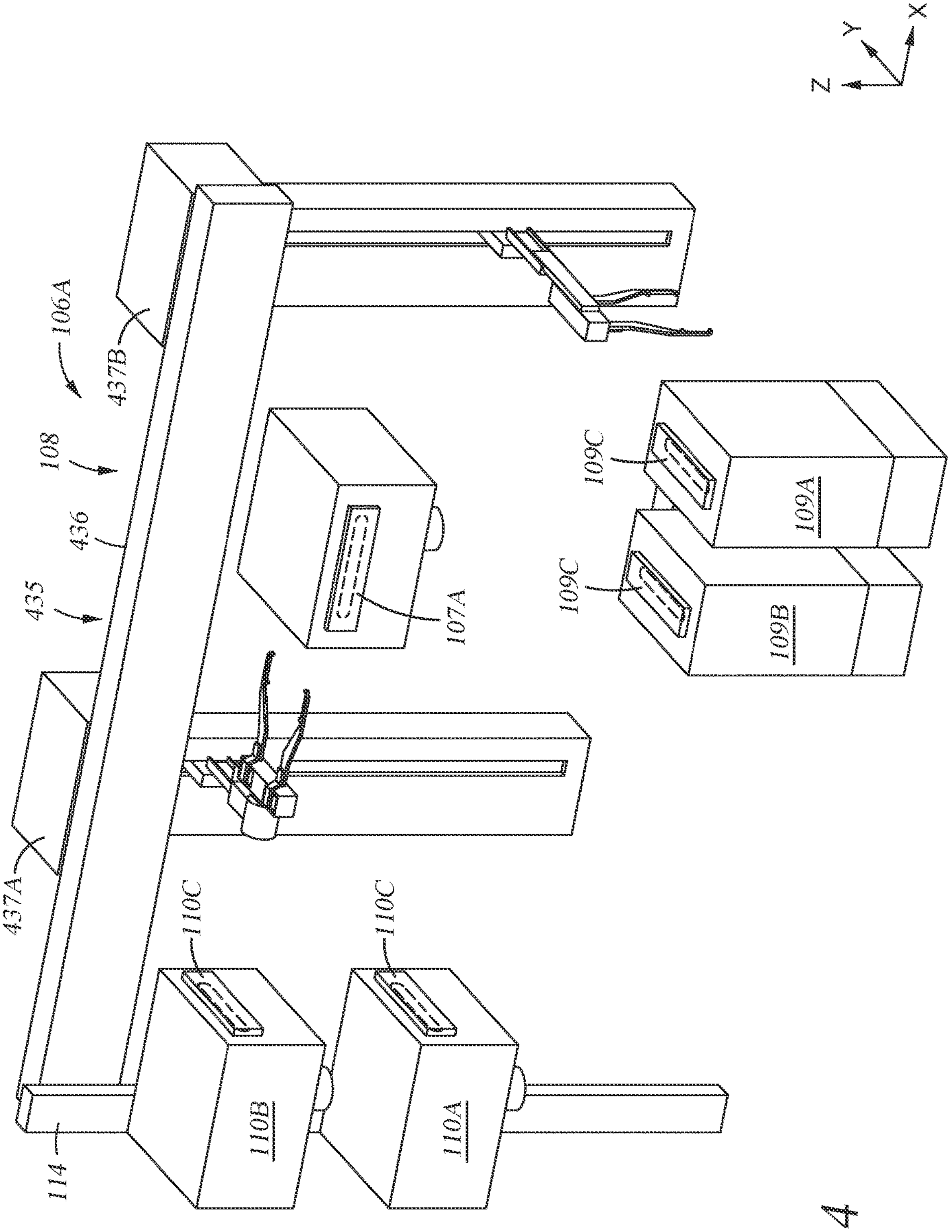
FIG. 4 is another perspective view of portions of the cleaning system, similar to FIG. 3 with the enclosure omitted, according to one or more embodiments.

As shown in FIG. 1A, the cleaning system 106 may be comprised of two cleaning units 106A, 106B disposed in parallel to one another on opposite sides of the second substrate handler 104. The cleaning units 106A, 106B include a plurality of cleaning chambers. The cleaning chambers positioned within the cleaning system 106 can be include one or more first cleaning modules, one or more second cleaning modules, one or more third cleaning modules, one or more fourth cleaning modules, one or more fifth cleaning modules, one or more sixth cleaning modules and/or one or more seventh cleaning modules, as discussed below. FIG. 3 is a top isometric view of cleaning unit 106A, with a partition between the robot tunnel 104T (FIG. 1A) and the cleaning unit 106B (and other internal and external components) omitted for clarity. FIG. 4 is another top isometric view of cleaning unit 106A, with a housing (and other internal and external components) omitted for clarity. The cleaning system 106 configurations illustrated in FIGS. 3, 4 and 12A-12J, for ease of discussion purposes, include three different types of cleaning modules that are positioned in various cleaning chamber positions. As will be discussed further below, FIG. 13A illustrates a configuration that can include six different cleaning modules of different types that can be used in a cleaning process sequence described herein. FIG. 13B illustrates a configuration that can include seven different cleaning modules of different types that can be used in a cleaning process sequence described herein. As can be appreciated from FIG. 1A and as described above, cleaning unit 106B is essentially a duplicate of the cleaning unit 106A. Accordingly, the description herein and the depiction of cleaning unit 106A in the Figures is to be understood inferentially as also a description and depiction of cleaning unit 106B. However, while the disclosure provided herein primarily illustrates and discloses a configuration where the cleaning unit 106A and the cleaning unit 106B are duplicates, this configuration is not intended to be limiting as to the scope of the disclosure provided herein, since the cleaning units can include different types and/or different numbers of cleaning modules without deviating from the scope of the disclosure provided herein.

The cleaning units 106A, 106B may be separated by a robot tunnel 104T in which the second substrate handler 104 is positioned. In some embodiments, each cleaning unit 106A, 106B includes a first cleaning module 107, a third substrate handler 108, a second cleaning module 109, a third cleaning module 110, and optionally a fourth cleaning module 115. In some embodiments, the first cleaning module, while not intending to be limiting as to the scope of the disclosure provided herein is often referred to herein as the horizontal pre-clean module 107. However, as noted above, the first cleaning module 107 could be replaced by a vertical input station 119 (FIG. 2H) or a horizontal input station 117 (FIG. 2G) that are each generally configured to support a substrate in a desired physical orientation while assuring that the surfaces of the substrate remain wet prior to subsequent cleaning processes being performed thereon. In some embodiments, the second cleaning module 109, while not intending to be limiting as to the scope of the disclosure provided herein is often referred to herein as the vertical cleaning module 109. In some embodiments, the third cleaning module 110, while not intending to be limiting as to the scope of the disclosure provided herein, is often referred to herein as the integrated clean and dry (ICD) module 110. In some embodiments, the vertical cleaning module 109 may be provided as a first vertical cleaning module 109A and a second vertical cleaning module 109B. In some embodiments, the integrated clean and dry module 110 may be provided as a first integrated clean and dry module 110A and a second integrated clean and dry module 110B. In some embodiments, as illustrate in FIG. 1A, the third substrate handler 108 within each of the cleaning unit 106A, 106B is positioned such that it is at an external edge of the cleaning unit 106A, 106B of the CMP processing system 100. In this configuration, the substrate handler 108 is positioned on an external side of the cleaning chambers, such as the first, second, and third cleaning modules as shown, which is opposite to an internal side of the first, second, and third cleaning modules that faces the robot tunnel 104T and the second substrate handler 104 of the CMP processing system 100.

The horizontal pre-clean module 107 is configured to process a substrate 200 disposed in a substantially horizontal orientation, i.e., in the X-Y plane, with the processing surface 201 facing up. In some embodiments, each cleaning unit 106A, 106B includes two vertical cleaning modules 109A, 1096 configured to process a substrate 200 disposed in a substantially vertical orientation, i.e., in the Z-Y plane, with the processing surface 201 facing the factory interface 102.

As noted above, in some embodiments of the cleaning system 106, the horizontal pre-clean module 107 receives a substrate 200 that has been polished from the second substrate handler 104 through a first door 107A formed in a first side panel of the horizontal pre-clean module 107. The first door 107A may be, for example, a slit valve that is configured to isolate an interior region of the horizontal pre-clean module 107 from the exterior region of the horizontal pre-clean module 107. The substrate 200 is received in a horizontal orientation by the horizontal pre-clean module 107 for positioning on a horizontally disposed substrate support surface therein. The horizontal pre-clean module 107 then performs a pre-clean process, such as a buffing process, on the substrate 200 before the substrate 200 is transferred therefrom using the third substrate handler 108, which is also sometimes referred to herein as the third substrate handling device 108. In some embodiments, the buffing process will include sweeping a buffing pad across a surface of the substrate that is positioned on the horizontally disposed substrate support surface to remove left over slurry, scratches and other imperfections found on the surface of the substrate. The buffing pad may include a material such as a polyurethane, acrylate or other polymeric material.

Figure 2A:
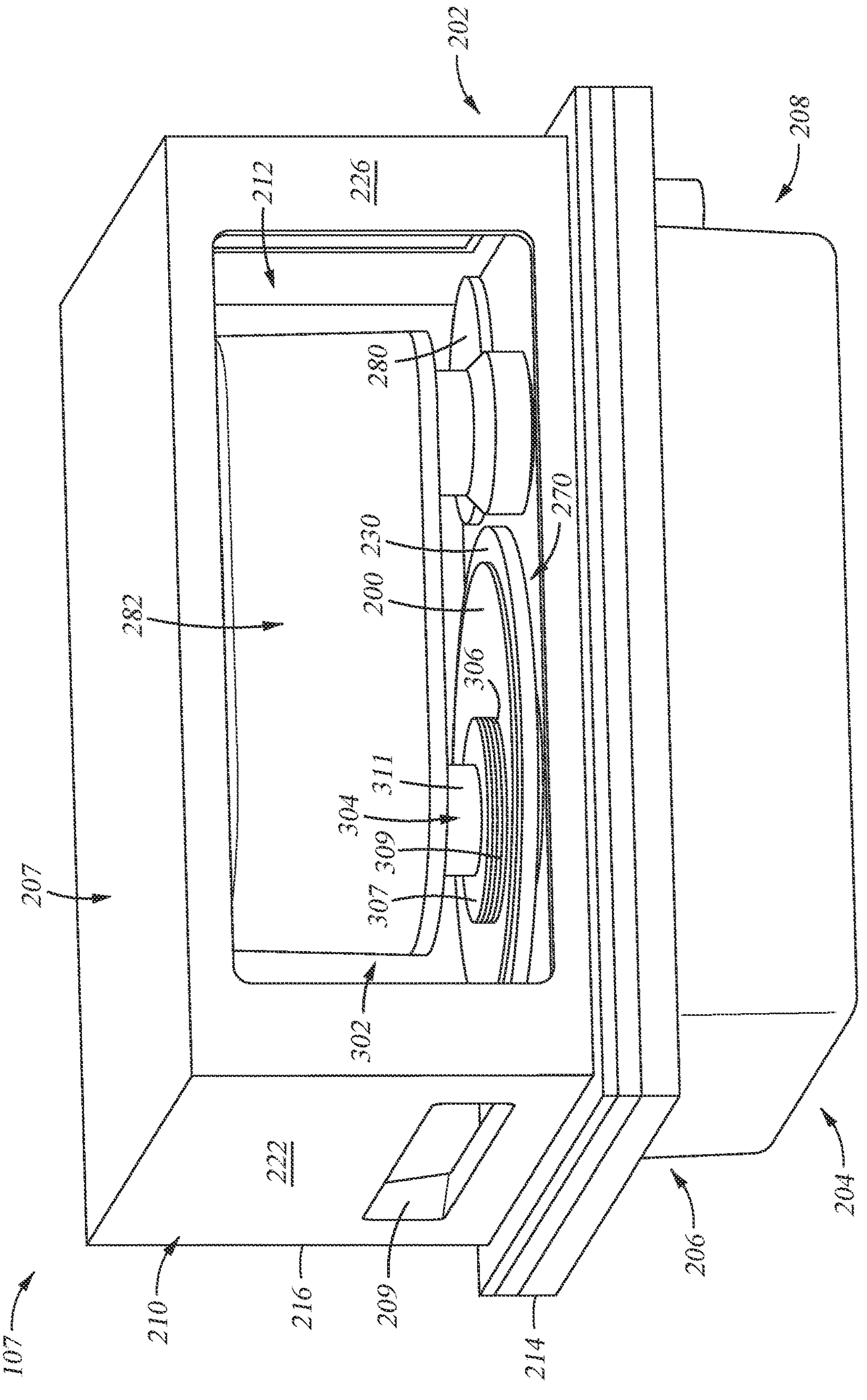
FIG. 2A is a perspective view of an example of a first cleaning module utilized in the CMP processing system, according to one or more embodiments.

FIG. 2A is a top isometric view of a horizontal pre-clean module 107, which may be positioned within a cleaning chamber in the CMP processing system 100 described herein. In FIG. 2A, a service access panel is omitted to more clearly show the internal components of the horizontal pre-clean module 107. Generally, the horizontal pre-clean module 107 includes a chamber 210, a basin 214, and a lid 216, formed of a plurality of side panels, which collectively define a processing area 212.

A first side panel 226 is formed on a first side 208 of the horizontal pre-clean module 107 facing the second substrate handler 104, and includes the first door 107A (e.g., slit valve not shown in FIGS. 2A, 2B) that is configured to selectively cover an opening that is used for positioning the substrate 200 on a rotatable vacuum table 230 by use of the second substrate handler 104. A second side panel 222 is formed on the second end 204 of the horizontal pre-clean module 107 facing away from the polishing station 105. The second side panel 222 includes a second door 107B (e.g., slit valve not shown in FIGS. 2A, 2B) that is configured to selectively cover an opening 209 that is used for removing the substrate 200 from the rotatable vacuum table 230 by use of the third substrate handler 108. The horizontal pre-clean module 107 can be configured and installed in both of the cleaning units 106A, 106B, and thus be positioned on either side of the CMP processing system 100 in opposite orientations, as illustrated in FIG. 1A.

Disposed within the processing area 212 of the horizontal pre-clean module 107, the horizontal pre-clean module 107 further includes a rotatable vacuum table 230 for vacuum chucking a substrate 200, an annular substrate lift mechanism 270 disposed radially outward of the rotatable vacuum table 230, a pad conditioning station 280 disposed proximate the rotatable vacuum table 230, and a pad carrier positioning arm 282 movable between a first position over the rotatable vacuum table 230 and a second position over the pad conditioning station 280. The rotatable vacuum table 230, the annular substrate lift mechanism 270, the pad conditioning station 280, and the pad carrier positioning arm 282 are each independently mounted to the basin 214.

Figure 2B:
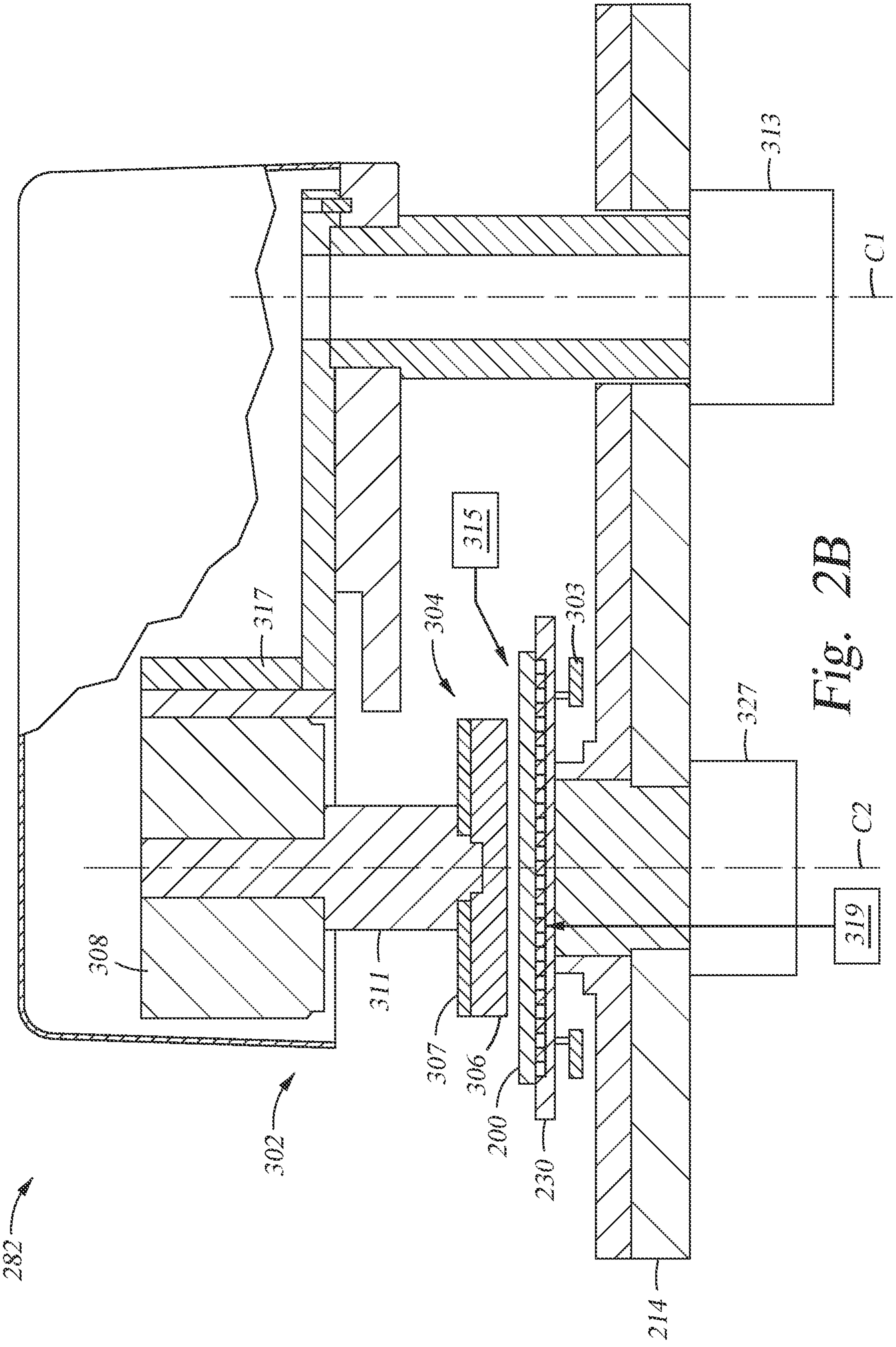
FIG. 2B is a cross-sectional view of the first cleaning module of FIG. 2A, according to one or more embodiments.

FIG. 2B is a side sectional view of the pad carrier positioning arm 282 which may be used in the horizontal pre-clean module 107 of FIG. 2A. As illustrated in FIG. 2B the pad carrier positioning arm 282 is disposed proximate to the rotatable vacuum table 230. A distal end 302 of the pad carrier positioning arm 282 includes a vertically movable pad carrier assembly 304 for supporting a buffing pad 306 at a lower end thereof. The pad carrier assembly 304 is moved vertically relative to the rotatable vacuum table 230 by use of an actuator assembly 317. The distal end 302 of the pad carrier positioning arm 282 can also be positioned over the pad conditioning station 280 (FIG. 2A) by use of a rotational actuator 313 that is configured to rotate the pad carrier positioning arm 282 about an axis c1.

The pad carrier assembly 304 includes a head motor 308 for rotating the buffing pad 306 about an axis c2 which is substantially aligned in the direction of gravity. The pad carrier assembly 304 includes a coupling base 307, which is coupled to the head motor 308 via shaft 311. In some embodiments, the coupling base 307 is sized to support one or more buffing pads 306. In one example, as shown in FIGS. 2A-2B, a single buffing pad 306 is utilized, which has a diameter of between about 40 mm and 150 mm, which is larger than conventional buffing pads used in similar cleaning modules.

In some embodiments, the buffing pad 306 is formed of polyvinyl alcohol (PVA) material. PVA material is hydrophilic, and can absorb and retain water. When wet, PVA material is elastic, flexible, and soft, having mechanical strength and abrasion resistance. Compared to conventional material used as a buffing pad, such as poromeric material or filled or unfilled polymer material, PVA material provides high shear force for chemical and mechanical cleaning of a previously CMP polished surface of the substrate. The buffing pad 306 formed of PVA material has a diameter, which is smaller than the diameter of the substrate that is to be processed in the horizontal pre-clean module 107. A larger buffing pad improves performance and reduces buffing time during a chemical mechanical cleaning process. The coupling base 307 is designed to support a large and thick water absorbent buffing pad 306 while including retaining features that are configured to prevent the buffing pad 306 from sagging by use of a mechanical clamping mechanism.

During processing in the horizontal pre-clean module 107 a substrate is positioned on the rotatable vacuum table 230 by transferring the substrate 200 through the opening formed in the first side panel 226 by use of the second substrate handler 104 and positioning the substrate 200 on a plurality of lift pins within a lift pin assembly 303. The lift pin assembly 303 includes the plurality of lift pins that can be raised and lowered by use of a lift pin actuator (not shown) so as to allow the substrate 200 to be positioned on and removed from the surface of the rotatable vacuum table 230. A vacuum is then created between the substrate 200 and openings formed in the surface of the rotatable vacuum table 230 by use of a pump 319. A rotating buffing pad 306 is then brought into contact with a surface of the substrate by use of the head motor 308 and actuator assembly 317. In some embodiments, the rotatable vacuum table 230 and substrate 200 are also rotated by use of a rotational actuator 327 during processing. The rotating buffing pad 306 can then be translated across the surface of the substrate 200 in an oscillating arcuate motion by use of the rotational actuator 313. In some embodiments, the rotational actuator 313 can rotate the buffing pad 306 in an oscillating rotational motion that covers an angle that is less than a full 360 degrees rotation. A first processing fluid, such as DI water and/or one or more first cleaning fluids (e.g., TMAH, PlanarClean®), can be applied to the surface of the substrate 200 from a fluid source 315 while the rotating buffing pad 306 is translated across the surface of the substrate 200. The cleaning process is effective to remove residual scratches and abrasive particles from the surface of the substrate. After processing for a desired period of time, the processing is stopped and the substrate is removed from the horizontal pre-clean module 107 by performing the above mentioned steps in reverse order. However, as will be explained below, the substrate will be beneficially removed from the horizontal pre-clean module 107 through the opening 209 by use of portions of the third substrate handler 108.

In some alternate embodiments of the cleaning system 106, a horizontal input module 117 (FIG. 2G) is positioned in place of the horizontal pre-clean module 107 so that the horizontal input module 117 can receive a substrate 200 that has been polished from the second substrate handler 104. The enclosure of the horizontal input module 117 is similarly configured as the horizontal pre-clean module 107, and thus includes the first door 107A formed in a first side panel of the enclosure and a second door 107B formed on a second side panel. The horizontal input module 117 generally includes a substrate support assembly 288, which can include a plurality of support pins 289, and one or more rinsing nozzles 286A, 286B that are positioned to deliver a flow of a rinsing fluid (e.g., DI water) received from a fluid source 287 to the exposed surfaces (e.g., upper and lower surface) of a substrate during processing. The horizontal input module 117 is configured to keep a substrate wet and remove any residual slurry or other residual materials left on the surfaces of the substrate after being polished in the polishing station 105.

In another alternate embodiment of the cleaning system 106, a vertical input module 119 (FIG. 2H) is positioned in place of the horizontal pre-clean module 107 so that the vertical input module 119 can receive a substrate 200, which has been polished, from the second substrate handler 104. The enclosure of the vertical input module 119 includes the first door 107A formed in a first side panel of the enclosure and a second door 107B formed on a second side panel. The vertical input module 119 generally includes a substrate support assembly 297, which can include a plurality of support features 294, and one or more rinsing nozzles 286A, 286B that are positioned to deliver a flow of a rinsing fluid (e.g., DI water) received from a fluid source 287 to the exposed surfaces (e.g., front side and back side surface) of a substrate during processing. The vertical input module 119 is configured to keep a substrate wet and remove any residual slurry or other residual materials left on the surfaces of the substrate after being polished in the polishing station 105. The vertical input module 119 will also include an actuator that is configured to rotate a substrate 200, which is positioned on the substrate support assembly 297, about the vertical axis (i.e., Z-axis) to rotationally orient the substrate 200 so that the substrate 200 can be accessed at different times by the central robot 104 and a blade assembly 300 (FIG. 7) of the third substrate handler 108 from their respective sides of the vertical input module 119. As illustrated in FIG. 2H, in some embodiments, during a transfer process, a robot blade 298 is inserted through a door (e.g., second door 107B) and positioned behind a substrate that has been positioned on a portion of the substrate support assembly 297. The robot blade 298 includes a clamp assembly 298A and a retaining element 298B that are configured to grip the vertically oriented substrate during a substrate transfer process. The process of gripping the substrate can include the use of an actuator (not shown) within the clamp assembly 298A that is configured exert a force on the substrate edges so that the edges of the substrate can be supported and retained between the clamp assembly 298A components and the retaining element 298B.

As will be discussed further below in connection with FIGS. 6-12K, the third substrate handler 108 includes two separate blade assemblies 300, 400 for separate handling of the substrate 200 at different stages of cleaning in the cleaning system 106. Accordingly, it is understood that the description of handling of the substrate 200 by the third substrate handler 108 may refer to the movement of one or more of the blade assemblies 300, 400 of the substrate handler 108 handling the substrate 200 as discussed further below.

Referring to FIGS. 1A and 1B, the third substrate handler 108 transfers substrate 200 from the horizontal pre-clean module 107 via a second door 107B that cover the opening 209 formed in a second side panel 222 of the horizontal pre-clean module 107. The second side panel 222 may be, for example, orthogonal to the first side panel 226. The substrate 200 is still in a horizontal orientation, i.e., oriented in the X-Y plane, as it is removed from the horizontal pre-clean module 107. After the substrate 200 is transferred from the horizontal pre-clean module 107, the third substrate handler 108 manipulates the substrate 200 to a vertical orientation, i.e., orientated in the Y-Z plane and the processing surface 201 facing the factory interface 102 for further processing in the vertical cleaning modules 109A, 109B of the cleaning system 106. For example, after the substrate 200 is transferred from the horizontal pre-clean module 107, the third substrate handler 108 may rotate the substrate 200 about the Y-axis by 90 degrees to change the orientation to the vertical position, and also rotate the substrate about the Z-axis by 180 degrees so that the processing surface 201 faces the factory interface 102. The Y-axis rotation and Z-axis rotation may be completed serially or with overlapping time intervals.

After manipulating the substrate so that the processing surface 201 faces the factory interface 102, the third substrate handler 108 transfers the substrate 200 to the vertical cleaning module 109A through a door 109C (FIG. 1B). The transferring process may include the movement of the third substrate handler 108 in at least one direction, such as the X-direction. The door 109C may be, for example, a slit valve. Each cleaning unit 106A, 106B may include two vertical cleaning modules 109A, 109B. The two vertical cleaning modules 109A, 109B may be arranged linearly, i.e., in the X direction, in each respective cleaning unit 106A, 106B. The two vertical cleaning modules 109A, 109B may also be arranged substantially below the horizontal pre-clean module 107, i.e., in the Z direction, in each respective cleaning unit 106A, 106B. Such an arrangement of the vertical cleaning modules 109A, 109B below the horizontal pre-clean module 107 may provide for a reduced footprint of the overall cleaning system 106 and also help to reduce the transfer time between these modules to improve throughput and importantly reduce a wet substrate's ability to dry and reduce the substrate's air exposure time between cleaning steps.

In some embodiments, the vertical cleaning modules 109A, 109B may be any one or combination of contact and non-contact cleaning systems for removing polishing byproducts from the surfaces of a substrate, e.g., spray boxes and/or scrubber brush boxes.

Figure 2C:
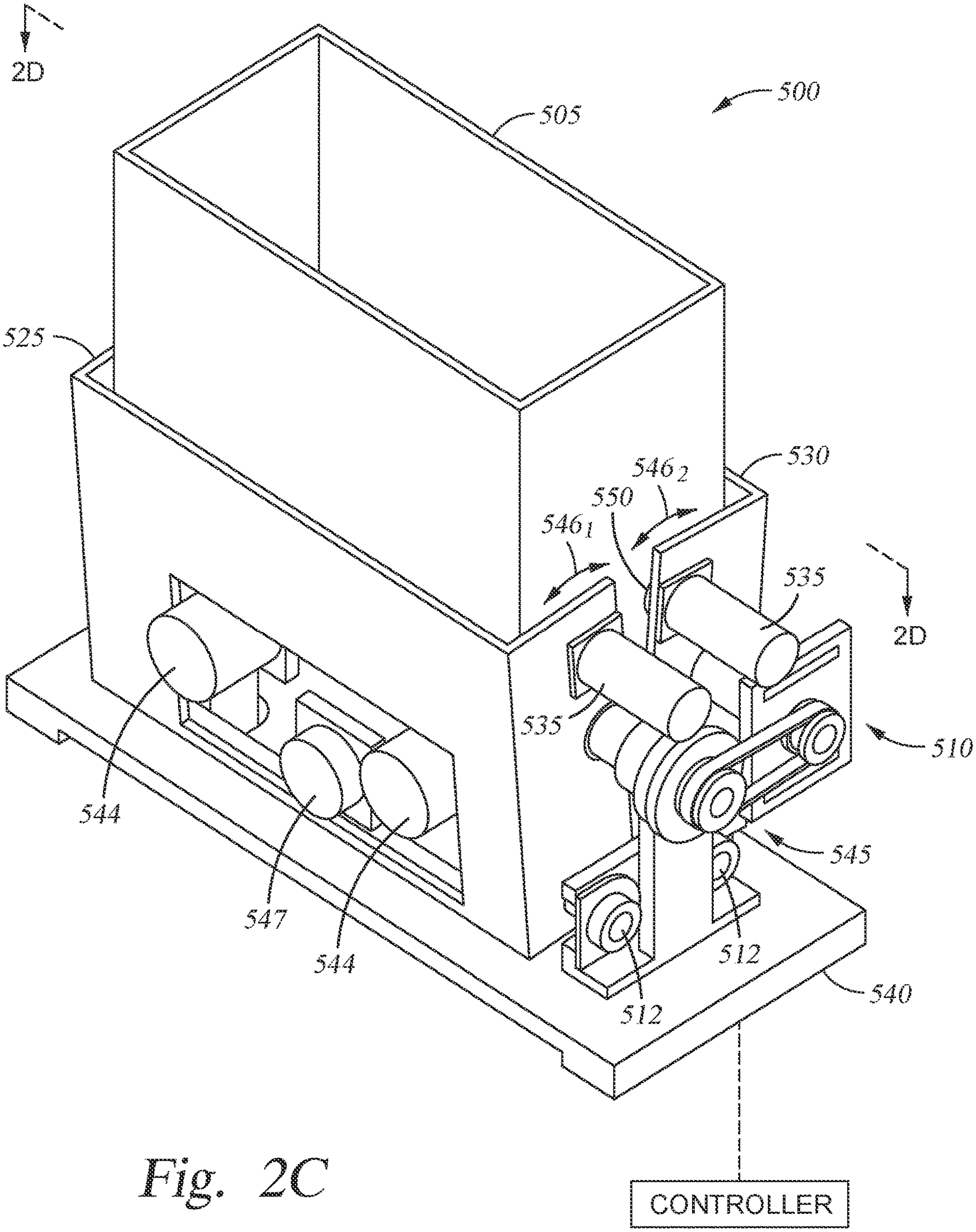
FIG. 2C is a perspective view of an example of a second cleaning module utilized in the CMP processing system, according to one or more embodiments.

FIG. 2C is an isometric view of an example vertical cleaning module 109 that is representative of the vertical cleaning modules 109A, 109B and that may be utilized in a cleaning unit as described above. The lid portion of the vertical cleaning module 109, which includes the door 109C, has been removed from FIGS. 2C and 2D for ease of discussion. The vertical cleaning module 109 shown in FIG. 2C may be a scrubber brush box-type vertical cleaner. The example vertical cleaning module 109 includes a tank 505 that is supported by a first support 525 and a second support 530. The vertical cleaning module 109 includes actuators 535 that are each coupled to a cylindrical roller 515, 520 (shown in FIG. 2D) located inside the tank 505. The actuators 535 may each include a drive motor, such as direct drive servo motor, that is adapted to rotate the respective cylindrical rollers 515, 520 about axes A' and A". Each of the actuators 535 are coupled to a controller adapted to control the rotational speed of the cylindrical rollers 515, 520.

Figure 2D:
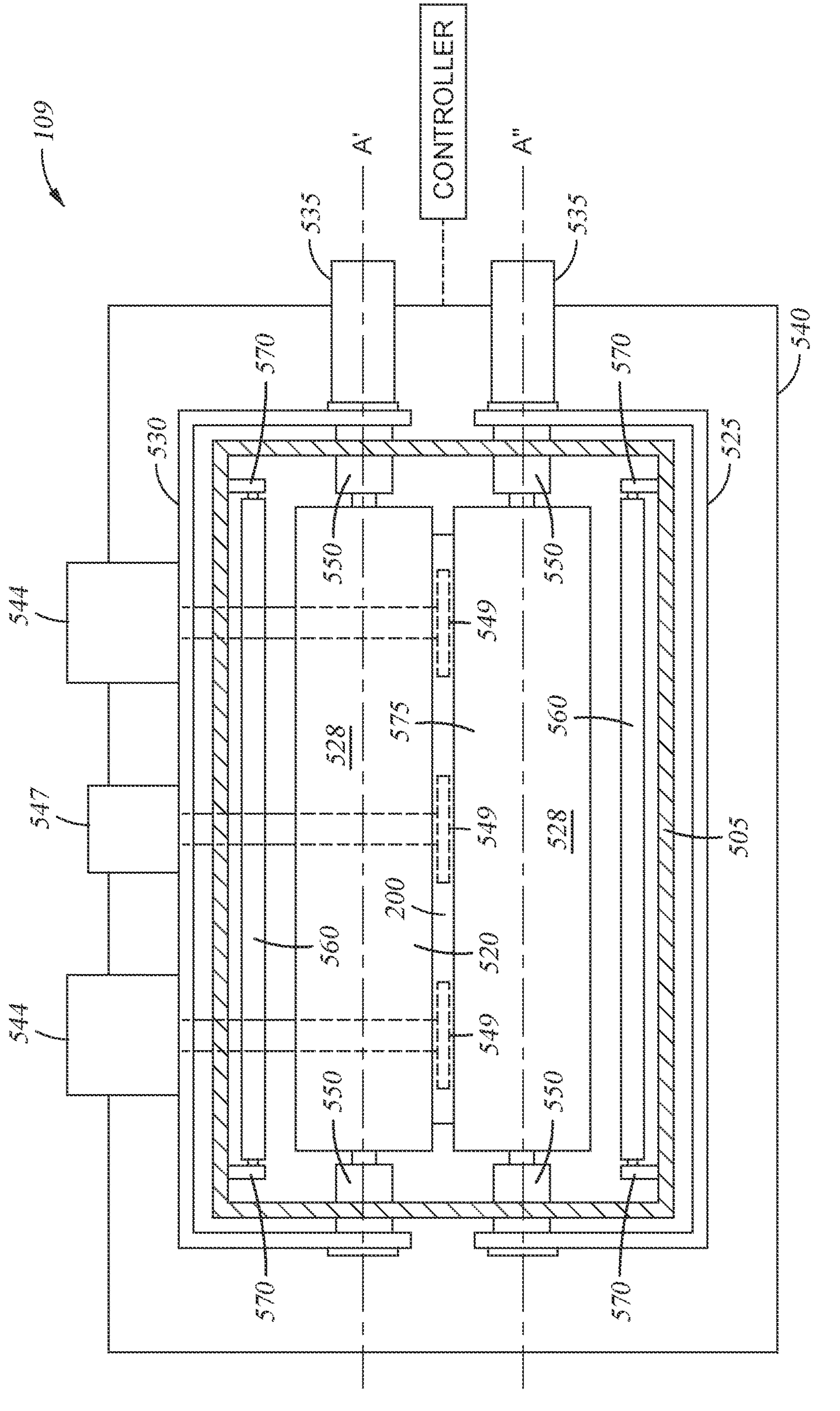
FIG. 2D is a cross-sectional view of the second cleaning module of FIG. 2C, according to one or more embodiments.

The linkage 510 and actuator 545 are configured to allow movement of the cylindrical rollers 515, 520 located inside the tank 505 relative to the major surfaces of a substrate 200 (shown in FIG. 2D). The actuator 545 is coupled to the controller to control the movement of the linkage 510 relative to a substrate disposed between the cylindrical rollers 515, 520. In operation, the first and second supports 525, 530 may be moved simultaneously relative to the base 540. Such movement may cause the first and second cylindrical rollers 515, 520 to close against the substrate 200 as shown in FIG. 2C, or to cause the first and second cylindrical rollers 515, 520 to be spaced apart to allow insertion and/or removal of the substrate 200 from the vertical cleaning module 109.

FIG. 2D is a top view of the vertical cleaning module 109 in FIG. 2C showing the cylindrical rollers 515, 520 in a processing position where the cylindrical rollers 515, 520 are closed or pressed against major surfaces of the substrate 200. The vertical cleaning module 109 also includes one or more drive motors 544 and a rotational device 547. Each of the drive motors 544 and the rotational device 547 include a roller 549, which is disposed at the end of an output shaft of each drive motor 544 and rotational device 547 and are configured to support and/or engage the substrate 200 and facilitate rotation of the substrate 200 about an axis that is parallel to the horizontal plane (i.e., X-Y plane).

Each of the cylindrical rollers 515, 520 include a tubular cover 528 disposed thereon. The tubular cover 528 may be a removable sleeve made of a pad material utilized to polish the substrate 200 or a brush body adapted to clean the substrate 200. During processing in the vertical cleaning module 109 the tubular covers 528 of the cylindrical rollers 515, 520 are brought into contact with a substrate while they are rotated by the actuators 535, and while the substrate 200 is rotated by use of the supporting rollers 549 that are coupled to the output shafts of the drive motors 544 and rotational device 547. A second processing fluid, such as DI water and/or one or more second cleaning fluids (e.g., acid or base containing aqueous solution), is applied to the surface of the substrate 200 from a second fluid source while the substrate 200 and cylindrical rollers 515, 520 are rotated by the various actuators and motors. In some embodiments, the second processing fluid provided to the surface of the substrate has a different composition from the first processing fluid provided to the surface of the substrate in the horizontal pre-clean module 107. During cleaning processing in each vertical cleaning module 109A, 109B, the substrate 200 may be positioned so that the processing surface 201 faces the factory interface 102. In another embodiment, the vertical cleaning modules 109A and 109B are oriented within the cleaning units 106A, 106B so that the processing surface 201 during a cleaning process faces an orientation that is substantially perpendicular to the factory interface 102 (e.g., parallel to the X-Z plane). In another embodiment, the vertical cleaning modules 109A and 109B are oriented within the cleaning units 106A, 106B so that the processing surface 201 of the substrate 200 during a cleaning process face an orientation that is at an angle between parallel to the X-Z plane and parallel to Y-Z plane.

According to an embodiment, a dedicated conditioning device 560 may be provided for each of the cylindrical rollers 515, 520. The conditioning device 560 is mounted adjacent a sidewall of the tank 505 by one or more support members 570. The conditioning device 560 is positioned away from the center of the tank 505 so as to not interfere with substrate transfer and/or substrate polishing or cleaning processes. However, the conditioning device 560 is positioned to contact each of the cylindrical rollers 515, 520 when the first and second supports 525, 530 are actuated downward and outward away from one another. In one embodiment, the movement of the first and second supports 525, 530 brings the cylindrical rollers 515, 520 into contact with a respective conditioning device 560. In this position, the processing surface of the tubular cover 528 on each of the cylindrical rollers 515, 520 may be conditioned during relative movement between the cylindrical rollers 515, 520 and the conditioning device 560.

According to an embodiment, the cleaning units 106A, 106B may each be configured to sequentially process each substrate 200 through two vertical cleaning modules 109A, 1096 as a two-step cleaning process. That is, after the substrate 200 undergoes cleaning processing in the vertical cleaning module 109A closest to the polishing station 105, the third substrate handler 108 transfers the substrate 200 to the vertical cleaning module 109B closest to the factory interface 102 for further cleaning processing. During a cleaning process sequence, after processing for a first period time in the first vertical cleaning module 109A the substrate is then transferred to the second vertical cleaning module 1096 and then processed for a second period of time, which is typically substantially similar to the first period of time. The processes performed in the first vertical cleaning module 109A and second vertical cleaning module 109B can include using similar fluid chemistries and mechanical processing parameters (e.g., cylindrical roller rotation speeds and application forces). In some embodiments, the first vertical cleaning module 109A is adapted to perform a rough cleaning step to remove the bulk of the remaining contaminants (e.g., particles, abrasive particles, chemical residue, etc.) remaining on the surface of the substrate after performing the first cleaning process in the first cleaning module, and the second vertical cleaning module 109B is configured to perform a cleaning process that is adapted to remove any remaining contaminants leftover from the process performed in the first vertical cleaning module 109A.

The third substrate handler 108 then transfers the substrate 200 to an available one of the integrated clean and dry modules 110A, 110B through a first door 110C (FIGS. 1A and 2E) formed in a first side panel of the available one of the integrated clean and dry modules 110A, 110B. The door 110C may be, for example, a slit valve.

As shown in FIGS. 1A-1B, each cleaning unit 106A, 106B may include two integrated clean and dry modules 110A, 110B arranged vertically, i.e., in the Z direction. Each of the integrated clean and dry modules 110A, 110B performs cleaning and drying processing on the substrate 200. In one example, the integrated clean and dry modules 110A, 110B may rinse and dry the substrate 200. For example, the integrated clean and dry modules 110A, 110B may apply chemistries while rinsing the substrate 200 with DI water to clean and/or adjust the liquid surface tension and thereby decrease adhesion of liquid to the substrate 200 during rinsing and drying processing. In another example, at least one of the integrated clean and dry modules 110A, 110B is configured to only perform a rinse and dry process the substrate 200. For example, the integrated clean and dry modules 110A, 110B may rinse the substrate 200 with DI water while also applying a surface tension adjusting fluid (e.g., IPA vapor) to dry the substrate by use of a Marangoni type process.

The horizontal arrangement of the integrated clean and dry modules 110A, 110B may provide for an increased throughput of substrates 200 for cleaning and drying processing while maintaining a reduced footprint of the overall cleaning system 106. Such an arrangement of the integrated clean and dry modules 110A, 110B in the CMP system 100 will help to reduce the transfer time between the vertical cleaning modules 109B and the integrated clean and dry modules 110A, 110B to improve throughput and importantly reduce a wet substrate's ability to dry and reduce the substrate's air exposure time between cleaning steps.

In some configurations, each cleaning unit 106A, 106B may only include a single integrated clean and dry module 110. For example, one integrated clean and dry module 110 may require servicing. In such an instance, the integrated clean and dry module 110 that requires servicing can be taken down and/or removed from the cleaning unit 106A or 106B, and the remaining integrated clean and dry module 110 can remain in the cleaning unit 106A or 106B so that CMP processing on substrates 200 in the polishing station 105 and subsequent cleaning of the substrate 200 in the cleaning unit 106A or 106B (as the case may be) may continue.

Figure 5:
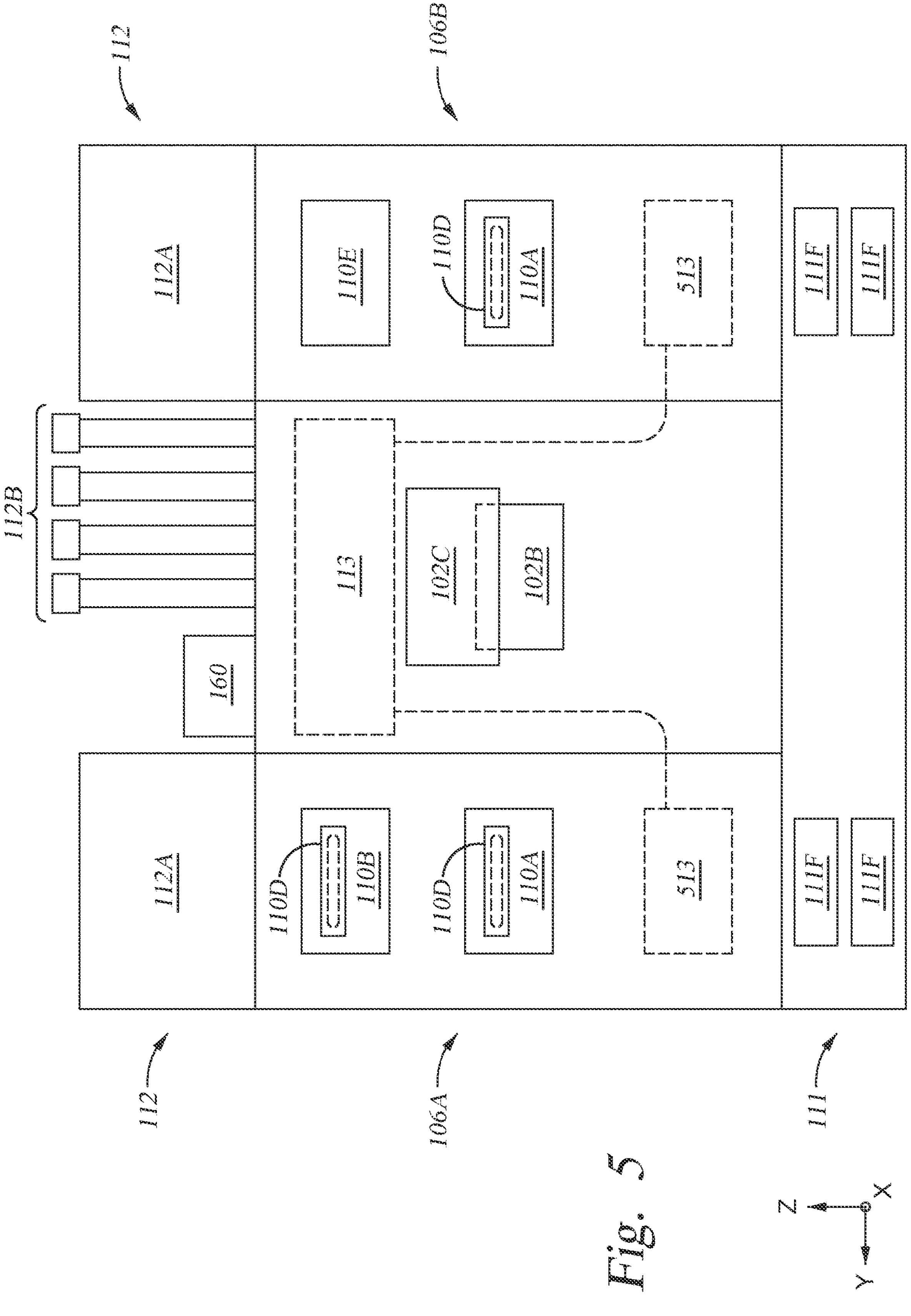
FIG. 5 is a schematic front view of the exemplary cleaning system viewed from the inside the factory interface of FIG. 1A, according to one or more embodiments.

As can be seen in FIG. 5, for example, in the case of only one integrated clean and dry module 110A being used in the cleaning unit 106B, a door blank 110E may be placed on the wall of the cleaning unit 106B facing the factory interface 102. The door blank 110E may maintain the isolation between the interior of the cleaning unit 106B and the factory interface 102 even when only one integrated clean and dry module 110A is being used and the other integrated clean and dry module 110B is not installed in the cleaning unit 106B. It will be appreciated that cleaning unit 106A can be configured in the same way. That is, the cleaning system 106 can be operated with two, three or four integrated clean and dry modules 110. However, it is contemplated for most applications that the cleaning system 106 will be operated with two or four integrated clean and dry modules 110. That is, both cleaning units 106A, 106B may be operated with the same number (one or two) of integrated clean and dry modules 110. In some embodiments, each of the cleaning units 106A, 106B include two integrated clean and dry modules 110 that are stacked vertically.

Figure 2E:
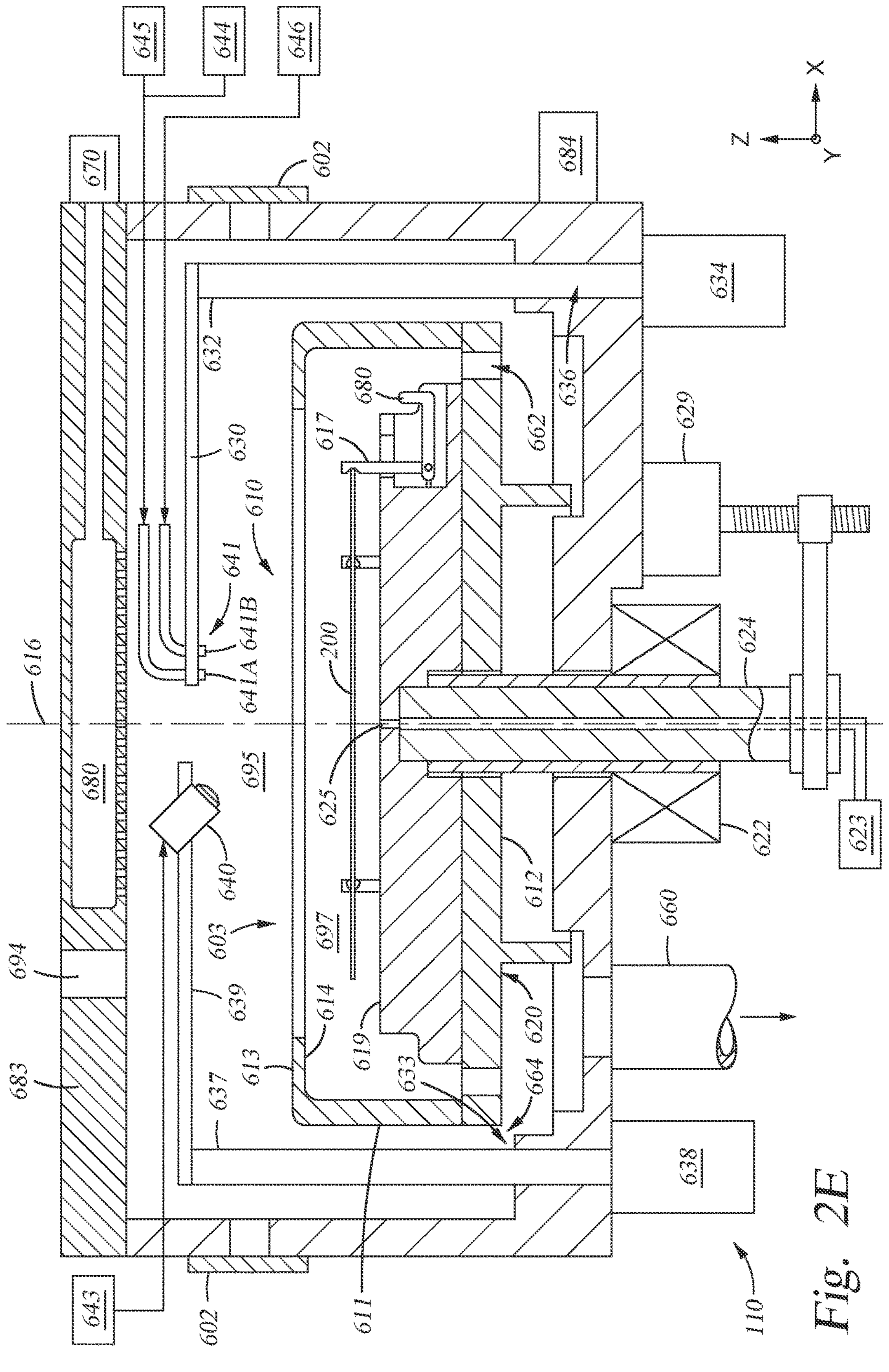
FIG. 2E is a cross sectional view of a third cleaning module utilized in the CMP processing system, according to one or more embodiments.

FIG. 2E is a schematic illustration of a cross sectional view of an integrated clean and dry module 110 that is representative of the integrated clean and dry modules 110A, 110B and that may be utilized in a cleaning unit 106A, 106B, as described above. The integrated clean and dry module 110 may receive a substrate 200 to be cleaned after the substrate 200 has been cleaned within one or more of the horizontal pre-clean module 107 and the vertical cleaning modules 109A, 109B, final clean module 115 and before the substrate 200 is received by the first substrate handler 103 in the factory interface 102. The integrated clean and dry module 110 may be utilized to remove contamination from the substrate 200 that, if not removed, may lead to a corresponding substrate 200 not meeting cleanliness requirements for subsequent processing steps and being discarded. In one example, the integrated clean and dry module 110 is configured to perform a cleaning and drying process that prevents the formation of water droplet marks on a surface of the substrate 200. In general, the processes performed in each integrated clean and dry module 110 are the last cleaning processes performed in a cleaning sequence performed on the substrate in the CMP system 100. The processes performed in each integrated clean and dry module 110 can include one or more cleaning steps in which a cleaning fluid or rinsing fluid (e.g., DI water) is supplied to the top side and/or bottom side of the substrate and then a drying process is performed on the substrate. The drying process can include the separate and sequential delivery of a stream of de-ionized water and a flow of an IPA vapor containing inert gas mixture that is scanned across the surface of the processing side (i.e., top surface in FIG. 2E) and/or backside surface of the substrate 200 by use of rotatable arm.

The integrated clean and dry module 110 includes a substrate gripping device 603, a first sweep arm 639, a second sweep arm 630, a first nozzle mechanism 640, a second nozzle mechanism 641, plenum 680, exhaust 660, drain 684, and gas source 670. The integrated clean and dry module 110 may further include a sensing device 694, such as a camera to detect the state of the cleaning process or retroreflective position sensing device to sense the position of the substrate within the interior volume 695.

The substrate gripping device 603 is configured to support, hold and/or retain the substrate 200 in a horizontal orientation. For example, the substrate gripping device 603 is configured to support the substrate 200 in a horizontal orientation that is perpendicular to a vertically oriented rotational axis 616. The substrate gripping device 603 includes a catch cup 610 and a gripper assembly 620. The catch cup 610 may include a first catch cup 611 and a second catch cup 612. The first catch cup 611 may be coupled to the second catch cup 612. For example, the first catch cup 611 may be coupled to the second catch cup 612 via one or more bolts. One or more of the first catch cup 611 and the second catch cup 612 may include one or more threaded portions configured to receive a threaded bolt.

The catch cup 610 may include drain holes 662 positioned in an array along the edge of the catch cup 610 such that moisture flows into the drain 684 while the substrate 200, the gripper assembly 620, and the catch cup 610, are rotated by the drive motor 622. Further, a labyrinth 664 may be formed between the catch cup 610 and the housing of the integrated clean and dry module 110. The labyrinth 664 may be configured to at least partially limit moisture from flowing back through the labyrinths 664 and into the interior volume 695.

The catch cup 610 includes a wall 613 having an annular inner surface 614. The annular inner surface 614 defines a processing volume 697 within the substrate gripping device 603. The annular inner surface 614 has an angled portion that is symmetric about a central axis, e.g. rotational axis 616 of the substrate gripping device 603. For example, the substrate 200 may be cleaned within the processing volume 697.

The gripper assembly 620 holds the substrate 200 while DI water and/or a third cleaning fluid is applied to the substrate 200 for cleaning. The gripper assembly 620 may also include gripping pins 617 that are couple to a plate 619. In one or more embodiments, each gripping pin 617 may be coupled to an element 680 that is configured to contact the housing of the first catch cup 611 when the plate 619 is positioned relative to the catch cup 610 by use of the actuator 629. The contact between the element 680 and the surface of the first catch cup 611 imparts a translation motion onto the gripping pins 617. For example, in response to the element 680 contacting the annular inner surface 614 of the first catch cup 611, when the plate 619 and gripper assembly 620 are moved in the +Z direction by the actuator 629, the elements 680 contact the annular inner surface 614 of the first catch cup 611 and pivot. In response, a pivoting and/or translation motion is imparted onto the gripping pins 617 coupled to the elements 680. In one embodiment, the elements 680 continue to pivot until movement of the gripper assembly 620 in the +Z direction is stopped. In one embodiment, the elements 680 and gripping pins 617 are positioned in an open position after movement of the plate 619 in the +Z direction has stopped.

A spring element, such as a leaf spring or other suitable spring design (not shown), may further return the element 680 to a starting position, moving the gripping pin 617 to a gripping position in response to the element 680 no longer contacting the annular inner surface 614 of the first catch cup 611, such as when the substrate 200 is positioned in a processing position as shown in FIG. 2B. A biasing force from the spring element may load the element 680, such that the element 680 returns to the starting position, and the gripping pin 617 returns to the gripping position, when the element 680 is no longer contacting the housing of the first catch cup 611.

One or more fluids may be applied to the processing side 201 of the substrate 200 by a first nozzle mechanism 640 and a second nozzle mechanism 641. For example, a first fluid supply 643 may supply de-ionized water, an inert gas and/or IPA vapor to the second nozzle mechanism 641 that is positioned to deliver the fluid to the processing side (i.e., top surface in FIG. 2E) of the substrate 200. The first nozzle mechanism 640 may also apply de-ionized (DI) water and/or cleaning chemistries to the processing side of the substrate 200.

The first nozzle mechanism 640 may be, for example, include components that are configured to perform a non-contact cleaning process, such as a cleaning process that utilizes a megasonic nozzle or jet-nozzle. In one example, the first nozzle mechanism 640 includes one or more elements such as a megasonic actuator configured to alternatively apply megasonic energy in the form of waves within the cleaning fluid in an alternating fashion according to a sinusoidal or other pattern to generate a megasonic actuated fluid. The cleaning fluid can be delivered from a first fluid source 643 that is adapted to deliver DI water and/or a cleaning solution (i.e., acid or base solution). For example, the first nozzle mechanism 640 may be configured to alternatively apply megasonic energy in a sinusoidal pattern at a rate of between about 430 kHz to 5 MHz, such as 950 kHz to generate the megasonic actuated DI water that is provided to the surface of the substrate 200. The first nozzle mechanism 640 may be configured to deliver megasonic energy at multiple frequencies, such as delivering at least two differing frequencies.

Fluids may be applied to the backside of the substrate 200 via an opening 625 formed in the shaft 624, which is coupled to a fluid source 623, while the gripper assembly 620 and the catch cup 610 are rotated. The shaft 624 may include one or more tubes (not shown) that are configured to deliver DI water, cleaning fluids and/or a gas to the backside of the substrate 200.

A drive motor 622 may be coupled to the gripper assembly 620 via shaft 624. The drive motor 622 rotates the gripper assembly 620 and the catch cup 610 about rotational axis 616. Further, the drive motor may be one of a hydraulic, pneumatic, electro-mechanical, and a magnetic motor. The gripper assembly 620, substrate 200 and the catch cup 610 are configured to be rotated together (e.g., simultaneously), so that relative velocity between the substrate 200 and the catch cup 610 are substantially the same to reduce the chances of droplets flung off of the surface of a rotating substrate, due to the delivery of a fluid to the front or backside of the substrate, from rebounding off of the inner surface of the catch cup 610 and landing on a surface of the substrate.

The lid 602 may cover an opening formed in the wall (e.g., enclosure wall) 683 and provide access to the interior volume 695 of the integrated clean and dry module 110 for inserting and removing the substrate 200 from the integrated clean and dry module 110. When the lid 602 is in a closed position, the interior volume 695 of the integrated clean and dry module 110 may be referred to as an isolated environment. For example, when the lid 602 is closed, the interior volume 695 of the integrated clean and dry module 110 is isolated from the external environment, such that fumes (e.g., IPA vapor) and liquids generated and/or used during cleaning of the substrate 200 do not escape from the integrated clean and dry module 110 during the cleaning process. Any fumes and cleaning liquids used and/or generated during the cleaning process are removed from the integrated clean and dry module 110 in a controlled manner via the exhaust 660 and/or the drain 684. Air may be provided to plenum 680 by gas source 670, and exhausted from the integrated clean and dry module 110 by exhaust 660. Further, the plenum 680 and exhaust 660 may be configured to control the flow of air within the integrated clean and dry module 110 to prevent particles from reattaching to the surface of the substrate 200. The air flow provided to the integrated clean and dry modules 110 can be provided at a desired pressure and flow rate to assure the removal of vapors (e.g., IPA vapor) and/or airborne particles and the like formed within the processing region of the integrated clean and dry modules 110 during processing. In some embodiments in which nitrogen gas is delivered into the integrated clean and dry modules 110, it may be desirable to eliminate the use of a HEPA filter from the system to reduce system and maintenance costs and reduce system complexity. In some embodiments, the gas source 670 is configured to provide filtered air or other gas so that a desired pressure (e.g., greater than atmospheric pressure) is maintained in the processing region of the integrated clean and dry module 110A.

The drain 684 may be utilized to remove excess moisture from the integrated clean and dry module 110. In one embodiment, the drain 684 removes excess cleaning fluids from the integrated clean and dry module 110 during a cleaning process.

The interior volume 695 of the integrated clean and dry module 110 may be defined as being between the catch cup 610 and the wall (e.g., enclosure wall) 683. Substrates (e.g., the substrate 200) may be inserted into the interior volume 695 when being loaded into the integrated clean and dry module 110 and removed from the interior volume 695 when being removed from the integrated clean and dry module 110.

The sensing device 694 may detect the substrate 200 within the integrated clean and dry module 110. For example, the sensing device 694 may detect the substrate 200 within the interior volume 695. Further, the sensing device 694 may detect the substrate 200, while the substrate 200 is being held by the gripper assembly 620. The sensing device 694 may detect when the substrate 200 has been properly or improperly loaded into the gripper assembly 620. Further, the sensing device 694 may detect when the substrate 200 has been dropped or fallen out of the gripper assembly 620. The sensing device 694 may further determine when the substrate 200 has been inserted into the integrated clean and dry module 110 and removed from the integrated clean and dry module 110.

The first sweep arm 639 is coupled to a sweep arm shaft 637 and a sweep arm drive motor 638. The sweep arm shaft 637 and the sweep arm drive motor 638 forms the first sweep arm drive assembly 633. The sweep arm drive motor 638 may be coupled to sweep arm shaft 637 and be configured to move the first nozzle mechanism 640 on the distal end of the first sweep arm 639 in an arcuate path that is parallel to a surface of the substrate 200. The first sweep arm 639 may include a one or more tubes to deliver fluids to the first nozzle mechanism 640. The first sweep arm drive assembly 633 is configured to move the first nozzle mechanism 640 over the surface of the substrate 200 during the cleaning process, such that the cleaning fluids output by the first nozzle mechanism 640 are evenly distributed over the surface of the substrate 200. The first sweep arm drive assembly 633 may also be configured to move the first sweep arm 639 vertically to set a distance between the lid of the integrated clean and dry module 110 and the surface of the substrate 200.

[ow oi] The second sweep arm 630 is coupled to a sweep arm shaft 632 and a sweep arm drive motor 634. The sweep arm shaft 632 and the sweep arm drive motor 634 forms the second sweep arm drive assembly 636. The sweep arm drive motor 634 may be coupled to the second sweep arm shaft 636 and be configured to move the second nozzle mechanism 641 on the distal end of the second sweep arm 630 in an arcuate path that is parallel to a surface of the substrate 200. The second sweep arm 630 may include a one or more tubes to deliver fluids to the second nozzle mechanism 641. The second sweep arm drive assembly 636 is configured to move the second nozzle mechanism 641 over the surface of the substrate 200 during the cleaning process, such that the cleaning fluids output by the second nozzle mechanism 641 are evenly distributed over the surface of the substrate 200. The second sweep arm drive assembly 636 may also be configured to move the second sweep arm 630 vertically to set a distance between the lid of the between the lid of the integrated clean and dry module 110 and the surface of the substrate 200.

In some embodiments, the second nozzle mechanism 641 is adapted to provide an IPA vapor to a surface of the substrate 200 while DI water is provided to the surface of the substrate 200 by the first nozzle mechanism 640 to create a "Marangoni" effect to dry the surface of the substrate 200. The IPA vapor is provided from an IPA vapor delivery assembly that can include an IPA vapor generation source 644 and a carrier gas delivery source 645. The IPA vapor generation source 644 can include an IPA liquid vaporizing device (not shown) that is configured to receive liquid IPA and convert it into a vapor, which is then mixed with a carrier gas (e.g., N2) provided from the carrier gas delivery source 645, and then provided to the surface of the substrate during the Marangoni drying process. During the horizontally oriented Marangoni drying process the sweep arm 639 moves the first nozzle mechanism 640 in an arcuate path from a center region to an edge region of the substrate to create a moving boundary of the DI water that moves outward from the center to the edge of the substrate. In this case, the first nozzle mechanism 640, which is providing DI water to the surface of the substrate, will lead the second nozzle mechanism 641, which is providing an IPA vapor carrier gas mixture to the surface of the substrate, as the sweep arm 630 moves the second nozzle mechanisms 641 in an arcuate path from a center region to an edge region.

The position of the sweep arms 630 and 639, and their respective nozzle mechanisms 640, 641, may be adjusted to ensure that the nozzle mechanisms 640, 641 each pass over the center of a rotating substrate 200 during processing. Further, at least one of the position of the sweep arms 630 and 639, and the position of their respective nozzle mechanisms 640, 641, may be adjusted such that the nozzle mechanisms 640, 641 each pass over a portion of the substrate 200 other than the center of the substrate 200. For example, the nozzle mechanisms 640 or 641 may be moved relative to the sweep arm 630 or 639, and/or the sweep arm 630 or 639 may be moved relative to sweep arm shaft 632 to vary the position of the nozzle mechanisms 640, 641 relative to surface of the substrate 200. Further, the axial distance between nozzle mechanisms 640, 641 and the surface of the substrate 200 may be varied to aid in the cleaning process.

According to an embodiment and as shown in FIG. 5, a shared gas feed module 113 may be provided in the robot tunnel 104T (FIG. 1). For example, the shared gas feed module 113 may be provided above the cleaner pass through 102B. The shared gas feed module 113 may be serviced and/or re-supplied via an access panel (not shown) in the robot tunnel 104T. The shared gas feed module 113 is configured to provide a gas (e.g. IPA vapor) to one of the integrated clean and dry modules 110 in cleaning unit 106A and one of the integrated clean and dry modules 110 in cleaning unit 106B. In one example, the shared gas feed module 113 is configured to supply gas (e.g., IPA vapor) to the lower integrated clean and dry module 110A in cleaning unit 106A and the lower integrated clean and dry module 110A in cleaning unit 106B.

The cleaning system 106 may also include a fluid and plumbing section 111. For example, as shown in FIGS. 1B and 5, the fluid and plumbing section 111 may be at the bottom of the cleaning units 106A, 106B, and below the robot tunnel 104T. The fluid and plumbing section 111 for each cleaning unit 106A, 106B may include liquid delivery modules 111A, 111B, and 111C (as well as conduits, valves, and the like, not shown) for supplying process liquids required by each individual module 107, 109, 110 in each cleaning unit 106A, 106B. For example, horizontal pre-clean liquid delivery module 111A may supply process liquids to the horizontal pre-clean module 107. Similarly, two different vertical brush box liquid delivery modules 111B may each supply process liquids to a respective one of the vertical cleaning modules 109A, 109B, and two different integrated clean and dry liquid delivery modules 111C may each supply process liquids to a respective one of the integrated clean and dry modules 110.

In some embodiments, each liquid delivery module 111A-111C may be a dedicated liquid delivery module for supplying a process liquid to a single, specific one of the modules 107, 109, 110. Accordingly, when one of the cleaning units 106A, 106B is configured with only a single integrated clean and dry module 110 (as described above), a single integrated clean and dry liquid delivery module 111C may be provided in the corresponding fluid and plumbing section 111 for supplying a process liquid to the single integrated clean and dry module 110.

The fluid and plumbing section 111 for each cleaning unit 106A, 106B may also include modules for delivering gas to or exhausting gas from, for example, the integrated clean and dry modules 110. According to an embodiment, the fluid and plumbing system 111 for each cleaning unit 106A, 106B includes an integrated clean and dry direct gas feed module 111D for delivering process gas to one of the integrated clean and dry modules 110. For example, the integrated clean and dry direct gas feed module 111D of each cleaning unit 106A, 106B supplies process gas to the respective upper integrated clean and dry module 110B. In some embodiments, the integrated clean and dry direct gas feed module may be omitted from the corresponding fluid and plumbing section 111, because the shared gas feed module 113 supplies the necessary process gas to the single integrated clean and dry module 110.

According to an embodiment, the fluid and plumbing section 111 for each cleaning unit 106A, 106B includes two integrated clean and dry inert gas feed modules 111F for delivering an inert gas such as N2 to each of the integrated clean and dry modules 110. For example, the integrated clean and dry inert gas feed modules 111F may be N2 pallets. Each integrated clean and dry inert gas feed module 111F may be a dedicated gas feed module for supplying inert gas to a single, specific integrated clean and dry module 110. Accordingly, when one of the cleaning units 106A, 106B is configured with only a single integrated clean and dry module 110 (as described above), a single integrated clean and dry inert gas feed module 111F may be provided in the corresponding fluid and plumbing section 111 for supplying inert gas to the single integrated clean and dry module 110.

The environment of the CMP system 100 is tightly controlled with respect to, for example, temperature, humidity, air flow, lighting and the like. In accordance with such tightly controlled environmental conditions, the cleaning system 106 may also include an air supply and exhaust section 112. For example, as shown in FIGS. 1B and 5, the air supply and exhaust section may be at the top of the cleaning units 106A, 106B, and above the robot tunnel 104T. The air supply and exhaust section 112 for each cleaning unit 106A, 106B may include air filtration system 112A. The air filtration system 112A for each cleaning unit 106A, 106B supplies air through the respective cleaning unit 106A, 106B, for example, according to conditions required by a particular application. For example, each air filtration system 112A may include a filter, such as a high efficiency particulate air (HEPA) filter that is configured to provide filtered air to a region of the CMP system 100. Each air filtration system 112A may be configured to control a temperature of the air delivered into the respective cleaning unit 106A, 106B. Each air filtration system 112A may also be configured to control a humidity of the air delivered into the respective cleaning unit 106A, 106B. Each air filtration system 112A may supply the air to the respective cleaning unit 106A, 106B through, for example, a duct. Each cleaning unit 106A, 106B may include an opening (not shown) at a base thereof so that air supplied by the air filtration system 112A flows out of the cleaning unit 106A, 106B through the base thereof. Such a configuration may ensure that a positive flow of environmentally controlled air is maintained through the cleaning unit 106A, 106B from top to bottom, which may, for example, minimize stray particles that may contaminate the substrate 200 and the processing surface 201 during handling of the substrate 200 within the cleaning unit 106A, 106B. In some embodiments, the gas source 670 forms part of the air filtration system 112A. In one embodiment, the air filtration system 112A is configured to provide a separate controlled airflow to each of the integrated clean and dry modules 110 disposed within each cleaning unit 106A, 106B. The separate controlled airflow can be provided by use of separate fan units within the air filtration system 112A that are connected by a fluid duct (not shown) to each plenum 680 in each integrated clean and dry module 110. In some embodiments of the air filtration system 112A, a HEPA filter is disposed at the exit of a fan filter unit that is positioned over the various cleaning modules (e.g., first cleaning module 107, second cleaning module(s) 109, third cleaning module 110, etc.) in each cleaning unit 106A, 106B so that a fan can cause a laminar air flow to pass through the open areas of the cleaning unit 106A, 106B during processing. Alternately, in some embodiments, a HEPA filter is disposed in one or more cleaning modules (e.g., third cleaning module 110) in each cleaning unit 106A, 106B so that a fan unit in the air filtration system 112A, which is coupled to cleaning module through a fluid duct, can cause a laminar air flow to pass through the interior region of the cleaning module during processing.

The air supply and exhaust section 112 for each cleaning unit 106A, 106B may also include an exhaust section 112B. The exhaust section 112B includes various exhaust conduits to vent exhaust from: the horizontal pre-clean modules 107, the vertical cleaning modules 109A, 109B, the integrated clean and dry modules 110A, 110B, the integrated clean and dry direct gas feed modules 111D, and the shared gas feed module 113.

According to embodiments, the exhaust section 112B may include a plurality of separate exhaust conduits for exhausting each of the horizontal pre-clean modules 107 and the vertical cleaning modules 109A, 109B of each of the cleaning units 106A, 106B, respectively. The exhaust section 112B may also include two separate exhaust conduits for venting exhaust from the main chamber area (i.e., return air from the air filtration system 112A) of each of the cleaning units 106A, 106B, respectively. The exhaust section 112B may further include one separate shared exhaust conduit for venting exhaust from the integrated clean and dry modules 110A, 110B and the shared gas feed module 113. In some embodiments, the exhaust section 112B may further include separate shared exhaust conduits for venting the shared gas feed module 113, which is adapted to provide fluids to at least one of the integrated clean and dry modules 110A, 110B within a cleaning unit 106A, 106B, and each of the auxiliary gas feed modules 513, which are each adapted to provide fluids to at least one of the integrated clean and dry modules 110A, 110B within a cleaning unit 106A, 106B. The exhaust section 112B may further include one separate exhaust conduit for venting exhaust from the fluid and plumbing section 111. The exhaust section 112B may further include one separate shared exhaust conduit for venting exhaust from the horizontal pre-clean liquid delivery modules 111A, the vertical brush box liquid delivery modules 111B, and the integrated clean and dry liquid delivery modules 111C. In some embodiments, a shared gas feed module 113 is used to deliver gases, such as an inert gas (e.g., nitrogen ($N_2$), argon (Ar)) and/or a process gas (e.g., IPA) to the clean and dry modules 110A (e.g., fourth cleaning chambers) in each cleaning unit 106A, 106B. Additionally, in some embodiments of the system, a direct feed gas box is used to supply gases to an individual module, such as each of the clean and dry modules 110B (e.g., fifth cleaning chambers), within each cleaning unit 106A, 106B, receive gases from separate gas feed boxes.

The integrated clean and dry modules 110A, 110B in each of the cleaning units 106A, 106B may require separate conduits for separately venting solvent exhaust, acid exhaust, and cabinet exhaust. That is, according to an embodiment, the exhaust section 1126 may further include one separate exhaust conduit for venting solvent exhaust from the two integrated clean and dry modules 110A, 110B of the cleaning unit 106A, one separate exhaust conduit for venting acid exhaust from the two integrated clean and dry modules 110A, 110B of the cleaning unit 106A, and one separate exhaust conduit for vending exhaust from the cabinets of the two integrated clean and dry modules 110A, 110B of the cleaning unit 106A. Similarly, the exhaust section 1126 may further include one separate exhaust conduit for venting solvent exhaust from the integrated clean and dry modules 110A, 110B of the cleaning unit 106B, one separate exhaust conduit for venting acid exhaust from the integrated clean and dry modules 110A, 110B of the cleaning unit 106B, and one separate exhaust conduit for venting exhaust from the cabinets of the integrated clean and dry modules 110A, 110B of the cleaning unit 106B. In some embodiments, one or more of the exhaust conduits of the exhaust section 112B are configured to evacuate the processing volume of the integrated clean and dry module 110A, 110B to one of two or more exhaust paths at different times during a process sequence performed in each of the integrated clean and dry modules 110A, 110B. In one example, at a first time a valve integrated in the exhaust section 112B is configured to divert flammable or toxic gases or vapors to a first type of exhaust path (e.g., scrubbed exhaust) and at a second time the valve is configured to divert other types of gases or vapors to a second type of exhaust path (e.g., non-scrubbed exhaust).

As noted above, the integrated clean and dry modules 110A, 110B in each of the cleaning units 106A, 106B may require separate conduits for separately venting solvent exhaust and acid exhaust. Accordingly, each integrated clean and dry module 110A, 110B may include a three way valve that operates to selectively—and separately—vent solvent exhaust or acid exhaust.

In order to prevent reverse air flow into the cabinet of the integrated clean and dry modules 110A, 110B, each integrated clean and dry module 110A, 110B may include a P-trap (not shown) leading to the appropriate conduit for venting exhaust from the corresponding cabinet. Each P-trap may include a drain port.

The various conduits of the exhaust section 112B may be positioned on the top side of the cleaning system 106 as required by the arrangement of the respective modules that are being vented and by the manufacturing facility. According to an embodiment, the various conduits for venting exhaust from the horizontal pre-clean modules 107, the vertical cleaning modules 109A, 109B, and the main chamber area of the cleaning units 106A, 106B may be arranged on a side of the exhaust section 112B closest to the polishing station 105. Also, the various conduits for venting exhaust from the integrated clean and dry modules 110A, 110B, the integrated clean and dry direct gas feed module 111D and the shared gas feed module 113, and the fluid and plumbing section 111 may be arranged on a side of the exhaust section 112B closest to the factory interface 102.

Figure 2F:
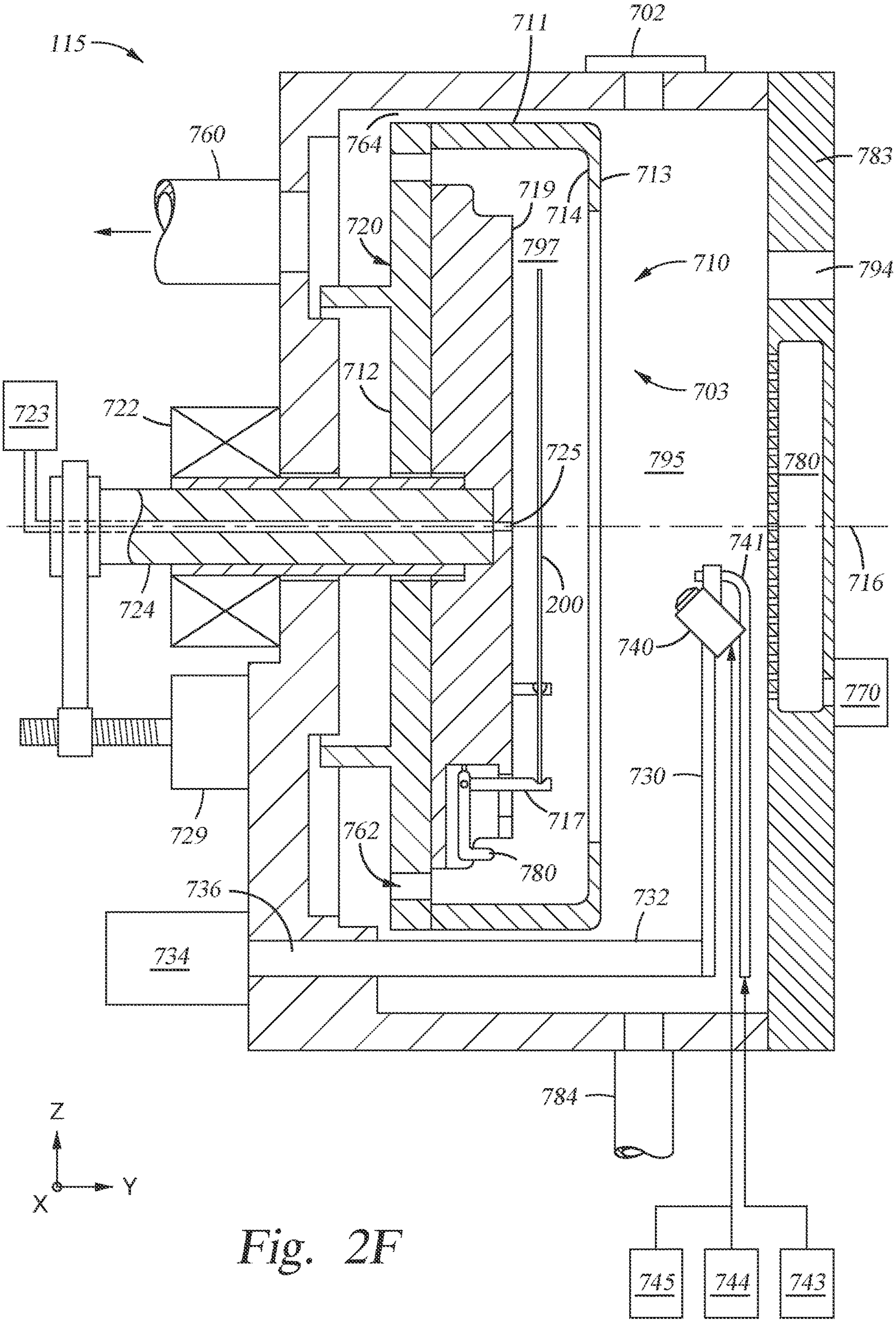
FIG. 2F is a cross sectional view of a fourth cleaning module utilized in the CMP processing system, according to one or more embodiments.
Figure 2G:
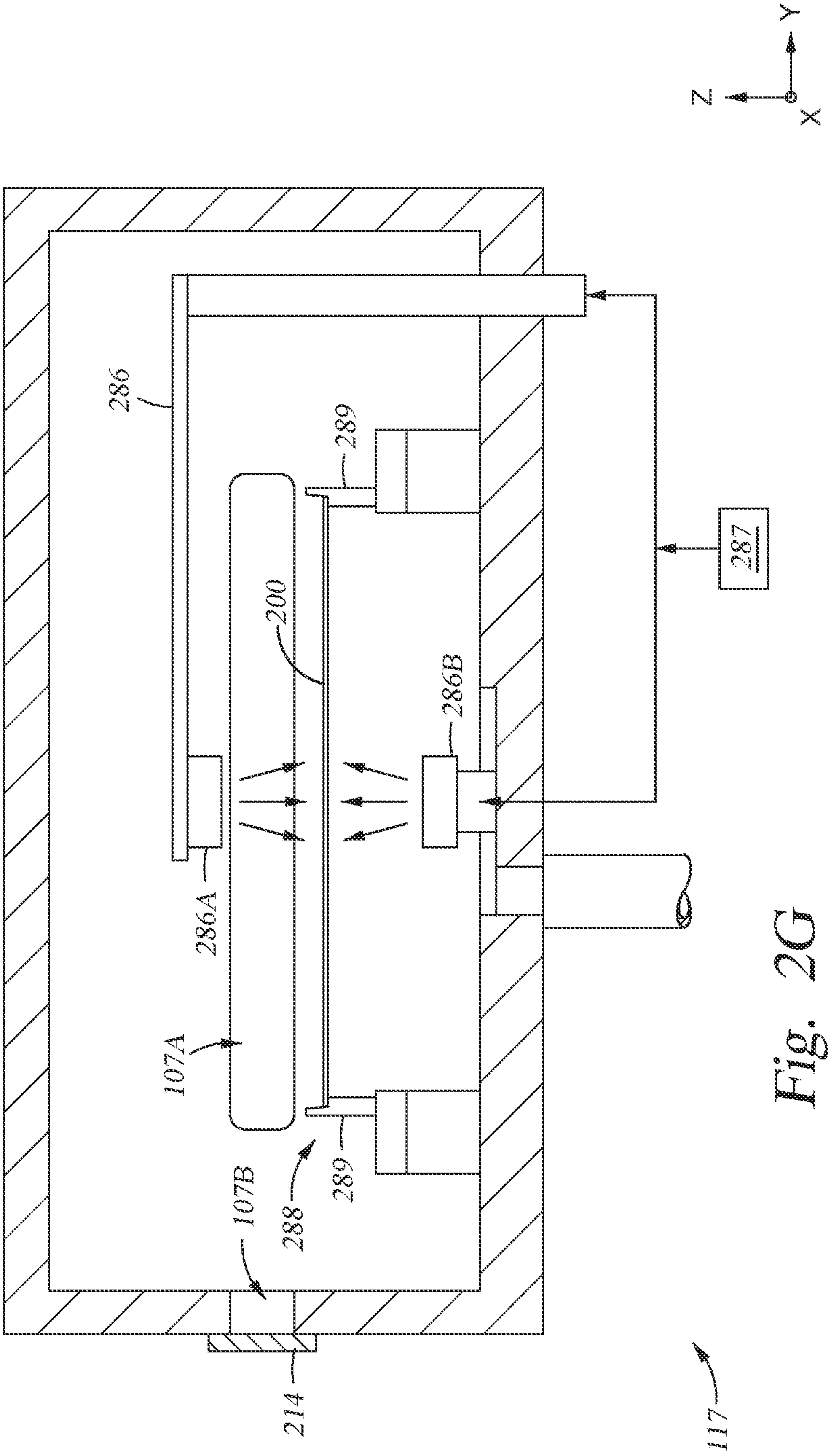
FIG. 2G is a cross sectional view of a fifth cleaning module utilized in the CMP processing system, according to one or more embodiments.
Figure 2H:
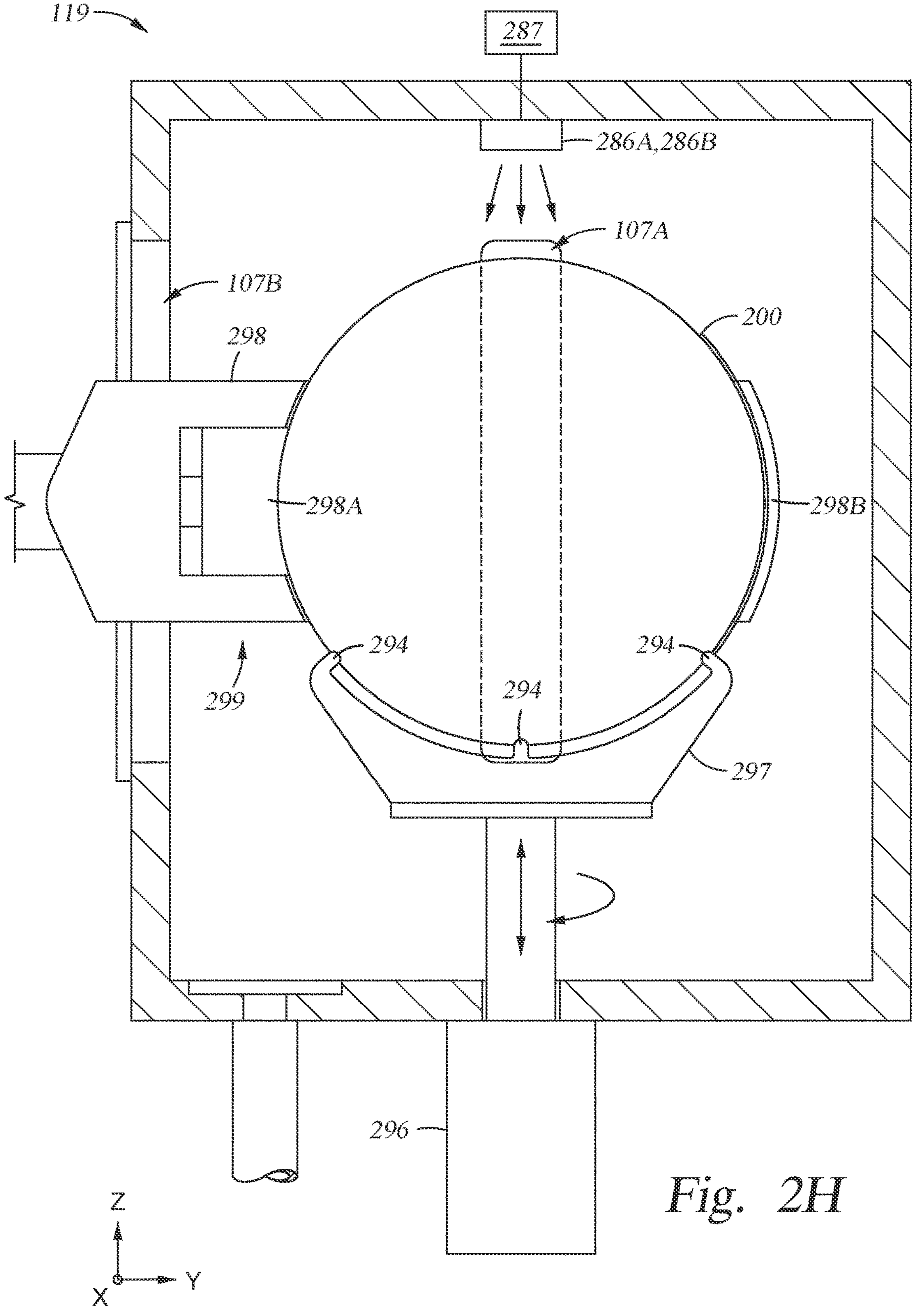
FIG. 2H is a cross sectional view of a sixth cleaning module utilized in the CMP processing system, according to one or more embodiments.

FIG. 2F is a side cross sectional view of a fourth cleaning module 115 that can be used in the CMP processing system, according to one or more embodiments. The fourth cleaning module 115, which is also referred to herein as the final clean module, includes an improved cleaning system and method for removing particles from a processed substrate. In various instances, the substrate cleaning process performed in the fourth cleaning module 115 is performed after a buffing and/or brush scrubbing, polishing or cleaning process (e.g., first and second cleaning module type processes) in which particle reattachment may occur after either of the buffing and/or brush scrubbing processes. As such, the yield for the processed wafers will be negatively impacted. The following description of fourth cleaning module 115 describes a non-contact cleaning method that is configured to remove any remaining particles on the substrate before it is dried.

The fourth cleaning module 115 includes a substrate gripping device 703, a first sweep arm 739, a first nozzle mechanism 740, a second nozzle mechanism 741, plenum 780, exhaust 760, drain 784, and gas source 770. The fourth cleaning module 115 may further include a sensing device 794.

The substrate gripping device 703 is configured to support, hold and/or retain the substrate 200 in a vertical orientation. For example, the substrate gripping device 703 is configured to support the substrate 200 in a vertical orientation that is perpendicular to a horizontally oriented rotational axis 716. The substrate gripping device 703 includes a catch cup 710 and a gripper assembly 720. The catch cup 710 may include a first catch cup 711 and a second catch cup 712. The first catch cup 711 may be coupled to the second catch cup 712.

The catch cup 710 may include drain holes 762 positioned in an array along the edge of the catch cup 710 such that moisture flows into the drain 784 while the substrate 200, the gripper assembly 720, and the catch cup 710, are rotated by the drive motor 722. Further, a labyrinth 764 may be formed between the catch cup 710 and the housing of the fourth cleaning module 115. The labyrinth 764 may be configured to at least partially limit moisture from flowing back through the labyrinths 764 and into the interior volume 795.

The catch cup 710 includes a wall 713 having an annular inner surface 714. The annular inner surface 714 defines a processing volume 797 within the substrate gripping device 703. The annular inner surface 714 has an angled portion that is symmetric about a central axis, e.g. rotational axis 716 of the substrate gripping device 703. For example, the substrate 200 may be cleaned within the processing volume 797.

The gripper assembly 720 holds the substrate 200 while DI water and/or a third cleaning fluid is applied to the substrate 200 for cleaning. The gripper assembly 720 may also include gripping pins 717 that are couple to a plate 719. In one or more embodiments, each gripping pin 717 may be coupled to an element 780 that is configured to contact the housing of the first catch cup 711 when the plate 719 is positioned relative to the catch cup 710 by use of the actuator 729. The contact between the element 780 and the surface of the first catch cup 711 imparts a translation motion onto the gripping pins 717. For example, in response to the element 780 contacting the annular inner surface 714 of the first catch cup 711, when the plate 719 and gripper assembly 720 are moved in the +Y direction by the actuator 729, the elements 780 contact the annular inner surface 714 of the first catch cup 711 and pivot. In response, a pivoting and/or translation motion is imparted onto the gripping pins 717 coupled to the elements 780. In one embodiment, the elements 780 continue to pivot until movement of the gripper assembly 720 in the +Y direction is stopped. In one embodiment, the elements 780 and gripping pins 717 are positioned in an open position after movement of the plate 719 in the +Y direction has stopped.

A spring element, such as a leaf spring or other suitable spring design (not shown), may further return the element 780 to a starting position, moving the gripping pin 717 to a gripping position in response to the element 780 no longer contacting the annular inner surface 714 of the first catch cup 711, such as when the substrate 200 is positioned in a processing position as shown in FIG. 2F. A biasing force from the spring element may load the element 780, such that the element 780 returns to the starting position, and the gripping pin 717 returns to the gripping position, when the element 780 is no longer contacting the housing of the first catch cup 711.

One or more fluids may be applied to the processing side 201 of the substrate 200 by a first nozzle mechanism 740 and a second nozzle mechanism 741. For example, a first fluid supply 743 may supply de-ionized water to the second nozzle mechanism 741 that is positioned to deliver the fluid to the processing side of the substrate 200. The first nozzle mechanism 740 may also apply de-ionized (DI) water and/or cleaning chemistries to the processing side of the substrate 200.

The first nozzle mechanism 740 may be, for example, include components that are configured to perform a non-contact cleaning process, such as a cleaning process that utilizes a megasonic nozzle or jet-nozzle. In one example, the first nozzle mechanism 740 includes one or more elements such as a megasonic actuator configured to alternatively apply megasonic energy in the form of waves within the cleaning fluid in an alternating fashion according to a sinusoidal or other pattern to generate a megasonic actuated fluid. The cleaning fluid can be delivered from a first fluid source 743 that is adapted to deliver DI water and/or a cleaning solution (i.e., acid or base solution). For example, the first nozzle mechanism 740 may be configured to alternatively apply megasonic energy in a sinusoidal pattern at a rate of between about 430 kHz to 5 MHz, such as 950 kHz to generate the megasonic actuated DI water that is provided to the surface of the substrate 200. The first nozzle mechanism 740 may be configured to deliver megasonic energy at multiple frequencies, such as delivering at least two differing frequencies.

Fluids may be applied to the backside of the substrate 200 via an opening 725 formed in the shaft 724, which is coupled to a fluid source 723, while the gripper assembly 720 and the catch cup 710 are rotated. The shaft 724 may include one or more tubes (not shown) that are configured to deliver DI water, cleaning fluids and/or a gas to the backside of the substrate 200.

A drive motor 722 may be coupled to the gripper assembly 720 via shaft 724. The drive motor 722 rotates the gripper assembly 720 and the catch cup 710 about rotational axis 716. Further, the drive motor may be one of a hydraulic, pneumatic, electro-mechanical, and a magnetic motor. The gripper assembly 720, substrate 200 and the catch cup 710 are configured to be rotated together (e.g., simultaneously), so that relative velocity between the substrate 200 and the catch cup 710 are substantially the same to reduce the chances of droplets flung off of the surface of a rotating substrate, due to the delivery of a fluid to the front or backside of the substrate, from rebounding off of the inner surface of the catch cup 710 and landing on a surface of the substrate.

The lid 702 may cover an opening formed in the wall (e.g., enclosure wall) 783 and provide access to the interior volume 795 of the fourth cleaning module 115 for inserting and removing the vertically oriented substrate 200 from the fourth cleaning module 115. When the lid 702 is in a closed position, the interior volume 795 of the fourth cleaning module 115 may be referred to as an isolated environment. For example, when the lid 702 is closed, the interior volume 795 of the fourth cleaning module 115 is isolated from the external environment, such that fumes (e.g., acids or base vapors) and liquids generated and/or used during cleaning of the substrate 200 do not escape from the fourth cleaning module 115 during the cleaning process. Any fumes and cleaning liquids used and/or generated during the cleaning process are removed from the fourth cleaning module 115 in a controlled manner via the exhaust 760 and/or the drain 784, which positioned on opposing ends of the module. Air may be provided to plenum 780 by gas source 770, and exhausted from the fourth cleaning module 115 by exhaust 760. Further, the plenum 780 and upper exhaust 760 may be configured to control the flow of air within the fourth cleaning module 115 to prevent particles from reattaching to the surface of the substrate 200. The airflow provided to the fourth cleaning module 115 can be provided at a desired pressure and flow rate to assure the removal of vapors and/or airborne particles and the like formed within the processing region of the fourth cleaning module 115 during processing. In some embodiments, the gas source 770 is configured to provide filtered air or other gas so that a desired pressure (e.g., greater than atmospheric pressure) is maintained in the processing region of the fourth cleaning module 115A.

The interior volume 795 of the fourth cleaning module 115 may be defined as being between the catch cup 710 and the wall 783. Substrates 200 may be inserted into the interior volume 795 when being loaded into the fourth cleaning module 115 and removed from the interior volume 795 when being removed from the fourth cleaning module 115.

The sensing device 794 may detect the substrate 200 within the fourth cleaning module 115. For example, the sensing device 794 may detect the substrate 200 within the interior volume 795. Further, the sensing device 794 may detect the substrate 200, while the substrate 200 is being held by the gripper assembly 720. The sensing device 794 may detect when the substrate 200 has been properly or improperly loaded into the gripper assembly 720. Further, the sensing device 794 may detect when the substrate 200 has been dropped or fallen out of the gripper assembly 720. The sensing device 794 may further determine when the substrate 200 has been inserted into the fourth cleaning module 115 and removed from the fourth cleaning module 115.

The sweep arm 730 is coupled to a sweep arm shaft 732 and a sweep arm drive motor 734. The sweep arm shaft 732 and the sweep arm drive motor 734 forms the first sweep arm drive assembly 736. The sweep arm drive motor 738 may be coupled to sweep arm shaft 732 and be configured to move the first nozzle mechanism 740 on the distal end of the first sweep arm 730 in an arcuate path that is parallel to a surface of the substrate 200. The first sweep arm 730 may include a one or more tubes to deliver fluids to the first nozzle mechanism 740. The first sweep arm drive assembly 736 is configured to move the first nozzle mechanism 740 over the surface of the substrate 200 during the cleaning process, such that the cleaning fluids output by the nozzle mechanism 740 are evenly distributed over the surface of the substrate 200. The first sweep arm drive assembly 736 may also be configured to move the sweep arm 730 vertically to set a distance between the lid of the fourth cleaning module 115 and the surface of the substrate 200.

The substrate cleaning process includes simultaneously rotating the catch cup 710, the gripper assembly 720, and the substrate 200 while cleaning fluids are applied to the first side (front surface) and second side (back surface) of the substrate 200. Simultaneously rotating the catch cup 710, the gripper assembly 720 and the substrate 200 while cleaning fluids are applied aids in minimizing and/or eliminating reattachment of particles to either surface of the substrate 200. For example, the drive motor 722 may be configured to rotate the catch cup 710, the gripper assembly 720 and the substrate 200. The substrate 200 is rotated at a speed in a range of about 500 RPM to about 1000 RPM such that the fluids are removed from the surface of the substrate 200. Further, the rate at which the substrate 200 is rotated may be varied during the cleaning process. Additionally, once the wafer gripper 710 has been placed in the cleaning position, the cleaning cycle may be initiated. First cleaning fluids may be applied to a back surface of the substrate 200 via fluid source 723, shaft 724 and aperture 725. Further, second fluids may be applied to front surface of the substrate 200 via the nozzle mechanism 740. The sweep arm drive motor 734 moves the sweep arm 730 such that the nozzle mechanism 740 is moved over the front surface of the substrate 200 in an arcuate path. The nozzle mechanism 740 may be configured to apply cleaning fluids to the front surface of the substrate 200 during the cleaning process. The fluids may include cleaning chemistries and/or rinsing agents. In one embodiment, the cleaning fluids may be applied to the front surface and the back surface of the substrate 200 at substantially the same time or during one or more overlapping and non-overlapping time periods. While in the cleaning position, splashing of the cleaning fluids back onto the substrate 200 is at least reduced and, in various embodiments, eliminated. During at least one of the cleaning process, the loading process and the unloading process airflow within the fourth cleaning module 115 mitigates re-circulation from occurring, preventing particles from reattaching the surface of the substrate 200.

Cleaning System Configurations

The various cleaning chambers, which can include one or more cleaning modules 107, 109, 110, 115, 117 and 119, within the cleaning system 106 are modular. Accordingly, the modules 107, 109, 110, 115, 117 and 119 can be changed as required by, for example, service and/or routine maintenance, or by a particular application.

Referring back to FIGS. 1A-1B and 5, according to an embodiment in which either cleaning unit 106A, 106B is configured with two integrated clean and dry modules 110A, 110B, the third substrate handler 108 may transfer the substrate 200 from the vertical cleaning module 109B to an available one of the integrated clean and dry modules 110A, 110B. That is, while one substrate 200 is subject to a cleaning and drying process in one of the integrated clean and dry modules 110A, 110B, the third substrate handler 108 may transfer the substrate 200 to the other one of the integrated clean and dry modules 110A, 110B (generically, integrated clean and dry module 110) that is not currently performing cleaning and drying processing on a substrate 200. During transfer of the substrate 200 from the vertical cleaning module 109B to the available integrated clean and dry module 110, the third substrate handler 108 may rotate the substrate 200 by 90 degrees about the Y-axis so that the processing side 201 of the substrate 200 is facing upward, i.e., in the Z-direction, when positioned in the integrated clean and dry module 110.

The first substrate handler 103 may transfer the substrate 200 from the integrated clean and dry module 110 via a second door 110D formed in a second side panel of the integrated clean and dry module 110. The first side panel of the integrated clean and dry module 110 and the second side panel of the integrated clean and dry module 110 may parallel to one another and on opposite sides of the integrated clean and dry module. The door 110D may be, for example, a slit valve. The first substrate handler 103 may transfer the substrate 200 from the integrated clean and dry module 110 to one of the loading stations 102A.

In one example of a cleaning process sequence, substrates 200 are moved between the horizontal pre-clean module 107 and the vertical cleaning modules 109A, between individual ones of the cleaning modules 109A, 109B, and between the cleaning modules 1096 and the integrated clean and dry modules 110A, 110B using the third substrate handler 108. The arrangement of the various modules 107, 109, 110, 115, 117 and 119 and the substantial range in the Z-direction of the substrate handler 108 may provide for improved cleaning due to, for example, reduced time and distance that a substrate 200 is handled by the third substrate handler 108.

As noted above and will be described now, the third substrate handler 108 may have two separate blade assemblies for separate handling of the substrate 200 at different stages of cleaning in the cleaning system 106.

Figure 8:
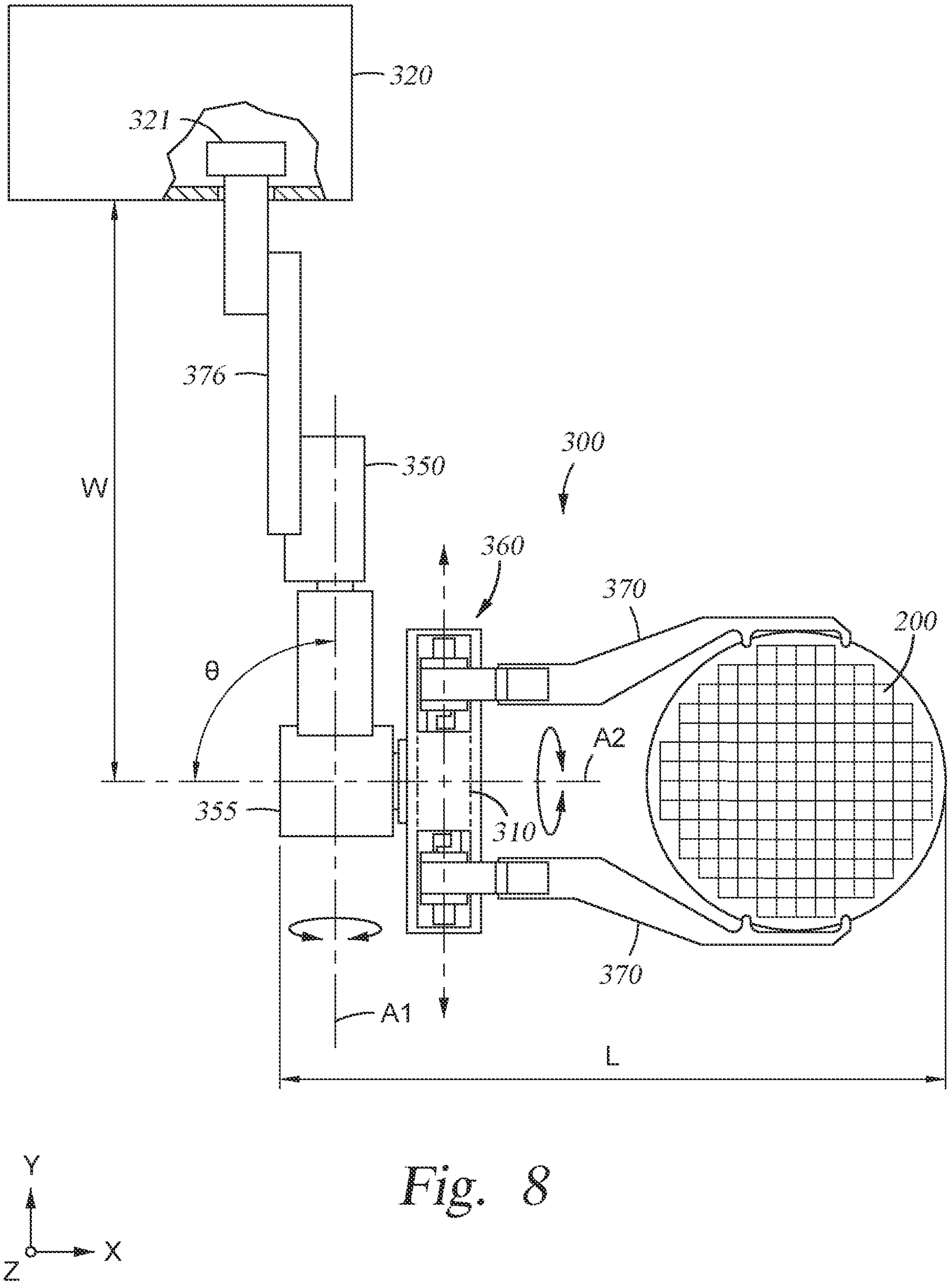
FIG. 8 is a top view of a first blade assembly, according to one or more embodiments.
Figure 10:
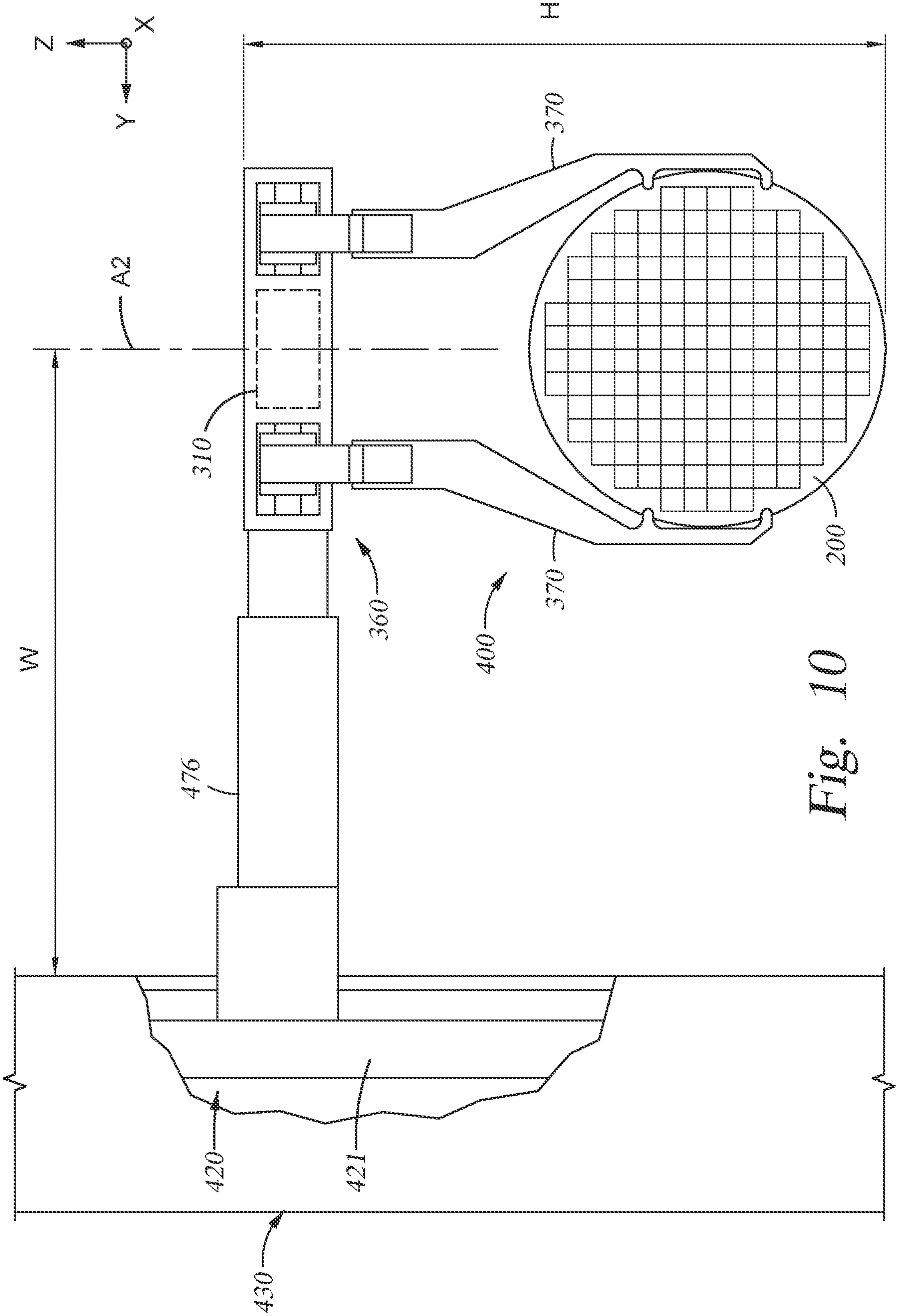
FIG. 10 is a side view of a second blade assembly, according to one or more embodiments.

FIG. 6 is another version of FIG. 3 with identification and description of other components of the substrate handler 106A. Specifically, the handler includes a first and second blade assembly 300, 400 each having a gripping actuator 310, 410 to permit a pair of blades 370 on each assembly to open and close around the edge of a substrate 200. As best seen in FIG. 7, each blade assembly is provided with a vertical actuator 320, 420 disposed within a vertical actuator assembly 330, 430 and a horizontal actuator assembly 435 for moving the blade assemblies 300, 400 to various horizontal and vertical locations and positions within the substrate handler enclosure. As illustrated in FIGS. 7-8 and 10, each blade assembly 300, 400 is coupled to a translatable portion of a vertical rail 321, 421 (e.g., linear guide, linear ball slide, etc.) that is aligned in a vertical direction (i.e., Z-direction). Each of the rails 321, 421 are disposed within a vertical actuator assembly 330, 430, respectively, that are each movable along a horizontal rail 436 (e.g., linear guide, linear ball slide, etc.) within the horizontal actuator assembly 435 by use of a horizontal actuator 437A, 437B that is adapted to position the respective blade assembly 300, 400, in a horizontal direction (i.e., X-direction). In some embodiments, the horizontal actuators 437A, 437B and vertical actuators 320, 420 may each include a linear actuator or motorized ball screw actuator assemblies that are configured to drive and position the respective components by use of commands from the system controller 160.

As shown in FIG. 8, the first blade assembly 300 is also provided with a first blade actuator motor 350 for permitting movement of the blade assembly and the substrate between a horizontal position (as shown) and a vertical position and a second blade actuator motor 355 for rotating the first blade assembly and substrate 180 degrees, causing the vertically positioned substrate 200 to face an opposite direction. As shown, actuator motors 350, 355 permit the blade assembly to rotate about two axis A1, A2. In operation, as will be shown herein, the first blade actuator 350 operates first to move the substrate from a horizontal to a vertical position utilizing axis A1. Thereafter, the second actuator motor 355 rotates the substrate 180 degrees utilizing axis A2. As illustrated in FIG. 8, axis A2 is aligned such that axis A2 is substantially parallel to the front side (e.g., device side) of the substrate 200, and axis A1 is aligned such that it is substantially perpendicular to axis A2. In the embodiment shown, the first movement causes the second actuator motor 355 to be rotated along with the substrate and blade assembly 300 whereas in the second movement, the 180 degree movement, only the substrate and blade assembly 300 are rotated.

In some embodiments, the entire blade assembly 300 can optionally be set to a predetermined distance "W" from its vertical actuator 320 using a slide mechanism 376 between the first blade actuator and the vertical actuator. The slide mechanism ensures the gripping blades 370 are properly aligned with access doors of each cleaning chamber. In practice, substrates are manipulated and repositioned between the cleaning chambers utilizing the blade assemblies 300, 400. Also visible in FIG. 8 are gripping blades 370 for holding and/or retaining a substrate 200. In embodiments herein, the gripping blades are part of a gripping assembly 360 and are opened and closed by a gripping actuator 310. A substrate 200 is shown held between the blades 370 by its edges. The substrate 200 is depicted with its "device side up" meaning the side shown (i.e., front side) is the side upon which semiconductor devices have been formed. In this disclosure, the device side is illustrated with a schematic representation of semiconductor die formed on the front surface of the substrate, which is also referred to herein as the front side or the device side of the substrate. Unlike the first blade assembly 300, the second assembly 400 operates only to transfer a substrate from the first vertical cleaning module 109A to the second vertical cleaning module 109B and therefore utilizes only its vertical and horizontal actuators 420, 430 along with a gripping actuator (not shown) to grasp and release a substrate 200.

Figure 9A:
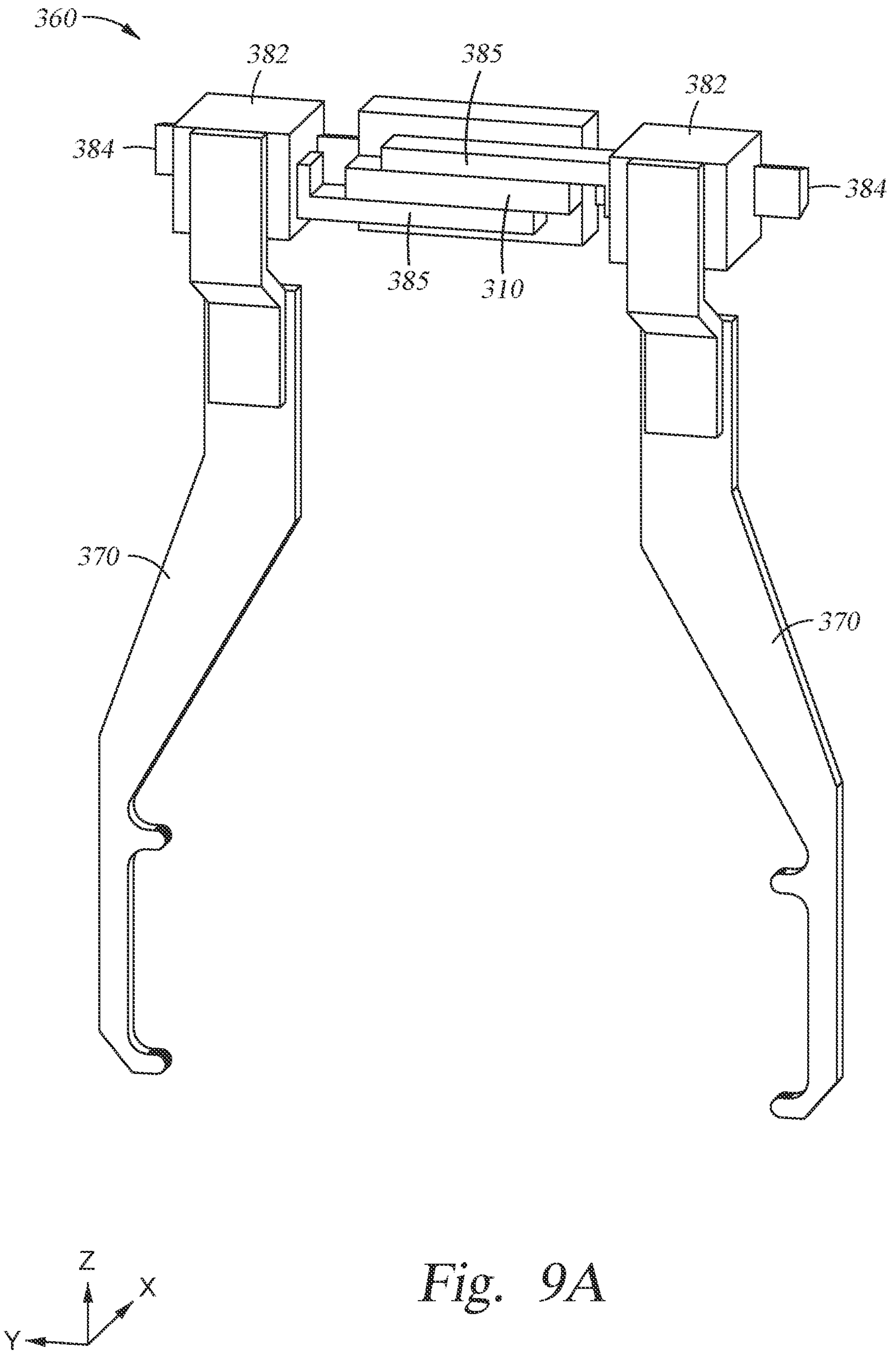
FIG. 9A is a top view of a gripping assembly, according to one or more embodiments.
Figure 9B:
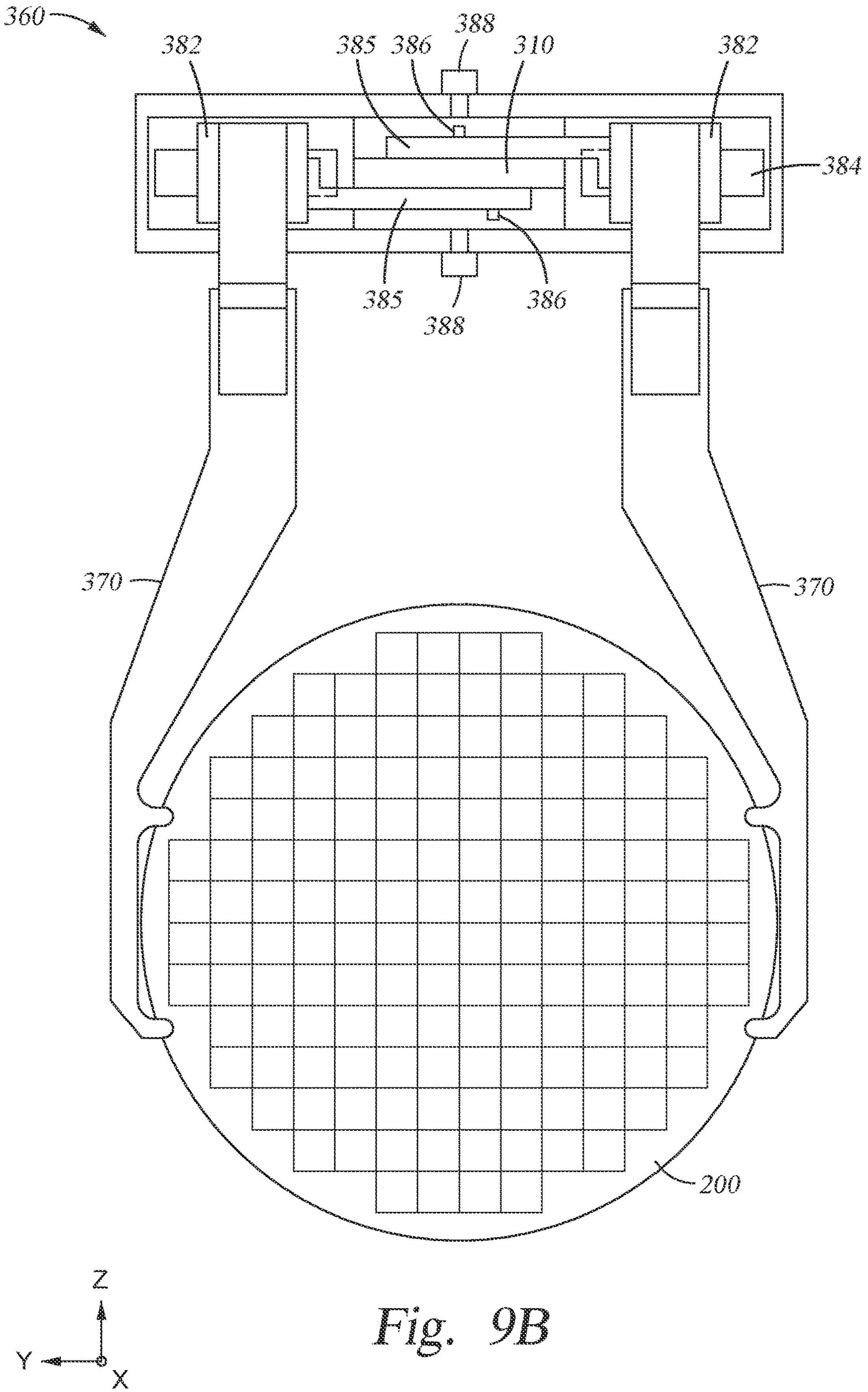
FIG. 9B is another embodiment of a gripping assembly, according to one or more embodiments.

FIG. 9A is a top isometric view of a specific embodiment of the gripping assembly 360. For clarity, the cover has been removed. Shown are the two gripping blades 370 that are arranged to move towards and away from each other due to operation of a gripping actuator 310. In this embodiment, each blade 370 is mounted on a block 382 and each block is mounted on a rail 384. The blocks 382 attached to the rail 384 are moved in opposing directions as the gripping actuator 310 causes motion in the blocks 382 by use of the brackets 385 to cause the gripping assembly 360 to move between an opened or closed position. FIG. 9B is a side view of a vertically oriented gripping assembly 360 that provides a visual indication of the position of the gripping blades 370 relative to the substrate 200 to be gripped. Each blade 370 has been supplied with a "target" 386 (FIG. 9B). The target moves with the blade 370 as the gripping actuator 310 operates to bring the blades together and apart. Mounted at the housing are optical sensors 388 (FIG. 9B) each of which is arranged to provide a signal when aligned with its corresponding target 386. The basics of optical sensors are well known in the art. In FIG. 9B, the upper sensor is aligned with its target while the lower sensor is out of target alignment. This arrangement represents a situation wherein the gripping assembly 360 has successfully gripped a substrate. In cases where the blades 370 are separated to a point where the internal diameter of the blades exceeds the outer diameter of the substrate 200, the lower sensor 388 and target 386 are aligned and the upper target and sensor are out of alignment, an "open" condition is indicated. In a case where the blades 370 are closed beyond the outer diameter of a substrate 200 neither sensor is aligned with its target, a "missed" condition is indicated.

FIG. 10 is a side view of the second blade assembly 400. The second blade assembly 400 will generally include a gripping assembly 360 that is attached to the vertical rail 421 of the vertical actuator 420 by use of a slide mechanism 476. In operation, the second blade assembly 400 is coupled to a translatable portion of the vertical rail 412 and adapted to move vertically by use of a vertical actuating device (not shown), such as a linear motor or motorized balls screw, disposed within the vertical actuator 420. The second blade assembly 400 is also adapted to move horizontally by use of the horizontal actuator 437B found within the horizontal actuator assembly 435 (FIG. 7). In some embodiments, the entire blade assembly 400 can be set to the predetermined distance "W" from its vertical actuator 420 using the slide mechanism 476. The slide mechanism 476 ensures the gripping blades 370 are properly aligned with access doors of each of the second cleaning modules 109A, 109B. In practice, substrates are manipulated and repositioned between the second cleaning modules utilizing both of the blade assemblies 300, 400. Also visible in FIG. 10 are gripping blades 370 for holding and/or retaining a substrate 200. In one example, the blade assembly 400 includes gripping blades 370 that are configured to hold and retain the substrate 200 in a vertical orientation, such as the front face of the substrate 200 being parallel to the Y-Z plane as shown in FIG. 10. In embodiments herein, as similarly discussed in relation to FIG. 8, the gripping blades 370 are part of a gripping assembly 360 and are opened and closed by a gripping actuator 310. A substrate 200 is shown held between the blades 370 by its edges, and is depicted with its device side facing away from the polishing station 105. Unlike the first blade assembly 300, the second assembly 400 operates only to transfer a substrate from the first vertical cleaning module 109A to the second vertical cleaning module 109B and therefore, in some embodiments, utilizes only its vertical actuator 420 along with a gripping assembly 360 to position and grasp and release a substrate 200. In some embodiments, the second blade assembly 400 has an overall height "H", which is defined as the distance from furthest most point on the edge of substrate 200 to the furthest most point on the opposing side of the second blade assembly 400. In some embodiments, the overall height H is configured to be equal to or smaller than the overall length "L" of the first blade assembly 300 (FIG. 8), which is discussed further below.

While, for reduced system complexity and cost considerations it is generally desirable to form the second blade assembly 400 without the added ability to rotate the gripping blades 370 about one or more rotational axes, in some cases it may be desirable to provide this additional ability. Therefore, in some embodiments of the third substrate handler 108, the second blade assembly 400 will additionally include one or more actuators that are configured to rotate the gripping blades 370 about one or more axes, such as an axis similar to axis A1 and/or axis A2 discussed herein in relation to first blade assembly 300. In one example, it is desirable for the second blade assembly 400 to alter the orientation of the device side of a substrate as it transfers the substrate between cleaning chambers, and in this case the second blade assembly 400 includes a second actuator motor 355, which is adapted to rotate a substrate about the axis A2. In another example, the second blade assembly 400 is configured similarly to the first blade assembly 300, and thus is configured to perform similar movements as the first blade assembly 300 described herein.

Figure 11:
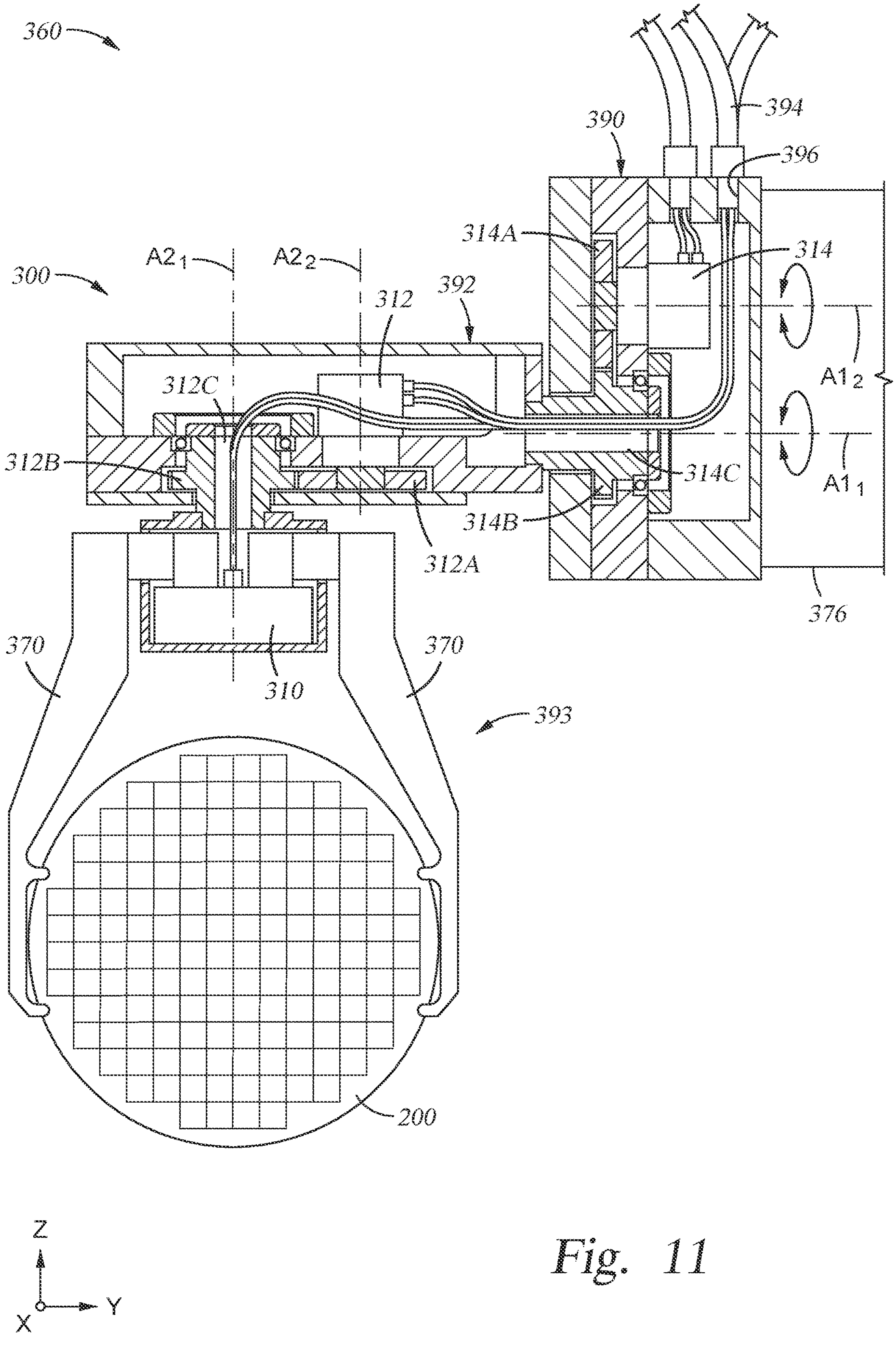
FIG. 11 is another embodiment of a gripping assembly, according to one or more embodiments.

FIG. 11 is an alternative embodiment of a first blade assembly 300 that includes a first 390 and second housing 392 housings to ensure cabling elements 394 associated with each actuator 310, 312, 314 are enclosed and thereby protected from contaminants during processing of the substrates. In this configuration, the first housing 390 is coupled to the slide mechanism 376. In some embodiments, the cabling elements 394 can each include electrical cables and/or pneumatic tubing that is used by one or more of the components in the first blade assembly 330. Cabling elements 394 enter through a number of apertures 396 in the first housing. From there, each cabling element is threaded along to its assigned actuator 310, 312, 314 using protected pathways that include the centerlines A1$_1$, A2$_1$ of bores 310C, 312C respectively, that provide rotational movement of the gripping assembly 360 and substrate 200. As illustrated in FIG. 11, axis A2$_1$ is aligned such that axis A21 is substantially parallel to the front face (e.g., device side) of the substrate 200, and axis A1$_1$ is oriented such that it is substantially perpendicular to axis A2$_1$. Actuator motors 312 and 314 each have an output shaft that is coupled to a concentric/coaxial gear 312A and 314A, respectively, that interact with offset gears 312B and 314B to cause rotation of the components coupled to the offset gears 312B and 314B. As illustrated in FIG. 11, the actuator 314 is configured to cause gear 314A (drive gear) to rotate, which causes gear 314B (off-set gear) to rotate about the axis A1$_1$, and causes the second housing 392, actuator 312, and blade assembly 393 to rotate about axis A1$_1$. The actuator 312 is configured to cause gear 312A (drive gear) to rotate, which causes gear 312B (off-set gear) to rotate about the axis A2$_1$, and causes the blade assembly 393 to rotate about axis A2$_1$. In some embodiments, the blade assembly 393 can include the same components as the blade assembly 360 discussed herein. Offset gears 312B and 314B include openings, such as concentric/coaxial bores 312C and 314C on the gear's axis of rotation represented by centerlines A1$_1$, A2$_1$ respectively, that provide a path for the electrical cabling (e.g., sensor wires and AC or DC power cables) and/or pneumatic tubing elements to be routed through the gear 314B while allowing rotational movement of the second housing 392 and the gripping assembly 360.

Cleaning Process Sequence Example

Figure 12A:
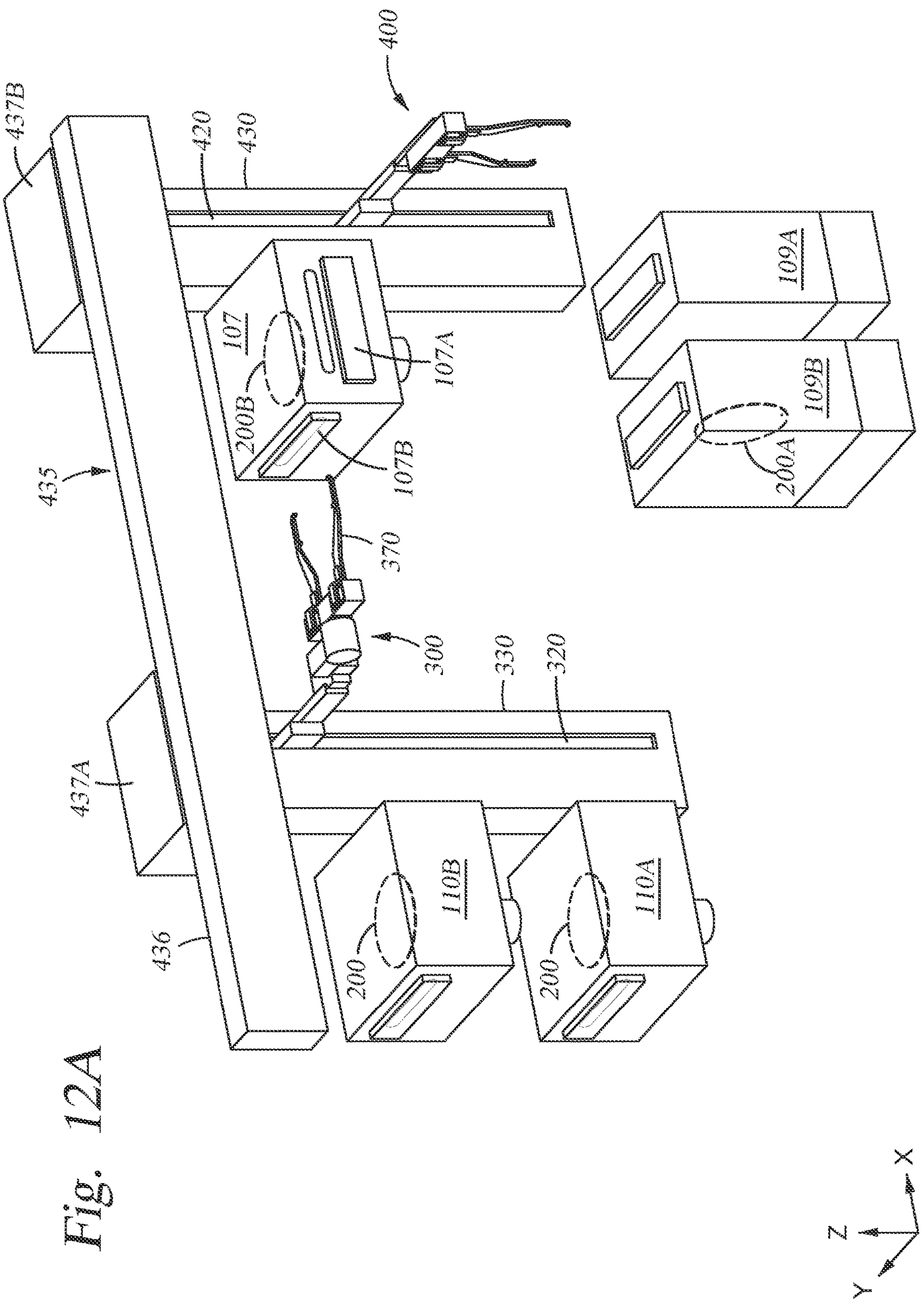
FIGS. 12A-12K show the progression of substrates as they are moved by a first and second blade assemblies through a cleaning process including multiple chambers, according to one or more embodiments.

FIGS. 12A-K illustrate one example of a sequence of movements of the blade assemblies 300, 400 and multiple substrates 200 within multiple cleaning chambers that include different types of cleaning modules used during a cleaning process sequence. The transfer sequence utilizes the various apparatus and methods disclosed herein to perform the most time and space saving manipulations during a processing sequence performed within the CMP processing system 100. The cleaning processes performed in each cleaning module within the cleaning process sequence are described above. It should be understood that the cleaning process sequence described herein is an on-going process such that during steady state operation substrates will typically be disposed in all of the cleaning modules at any one time. For that reason, substrates in modules are illustrated in FIGS. 12A-K are shown in dotted lines. In FIG. 12A, for example, substrates 200 are shown in every module with the exception of the first vertical cleaning module 109A. As will be shown in the Figures, that box is waiting to receive the substrate currently shown in the horizontal pre-clean module 107. To better illustrate the operation of the blade assemblies the substrate in vertical cleaning module 109B will be referred to as the first substrate 200A and the substrate shown in the horizontal pre-clean module 107 will be referred to as the second substrate 200B. The second substrate 200B in the horizontal pre-clean module 107 was placed there utilizing a first door 107A on the front of the module by the central robot (e.g., the second substrate handler 104), which is not shown in FIGS. 12A-K, after a polishing operation has been performed on the substrate. The first blade assembly 300 is visible with its gripping blades 370 open to extract substrate 200B through a door 107B on a side of the first cleaning module. As shown, the blade assembly 300 is vertically aligned with the door 107B and needs only horizontal movement provided by the horizontal actuator 435A in the horizontal actuator assembly 435 to reach the substrate.

Notably, in reference specifically to FIGS. 12B-12F, the horizontal space between the module 107 and module 110B for example, is minimized to reduce the footprint of the cleaning system and need for large horizontal movements of the first vertical actuator assembly 330, and thus first blade assembly 300. Thus, the motions shown in 12B-12F are made so as to reduce the footprint of the system. Also, FIGS. 12A-12F illustrate a spacing that is adapted to clearly illustrate the robot motions. However, the actual distance between module 107 and module 110B is about or nearly equal to the overall length L (FIG. 8) of the blade assembly 300 holding a substrate as more clearly described herein.

Figure 12B:
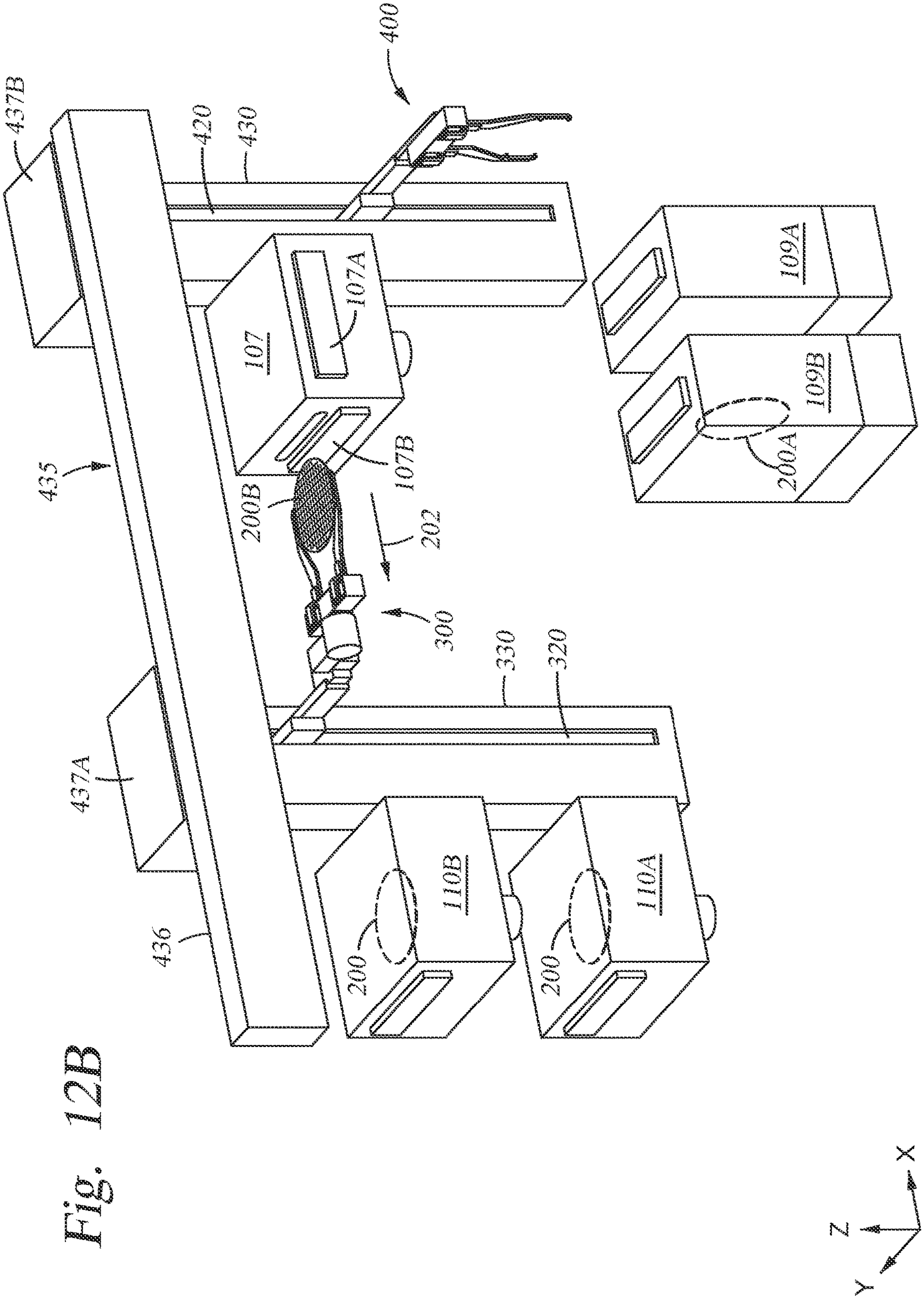
Figure 12C:
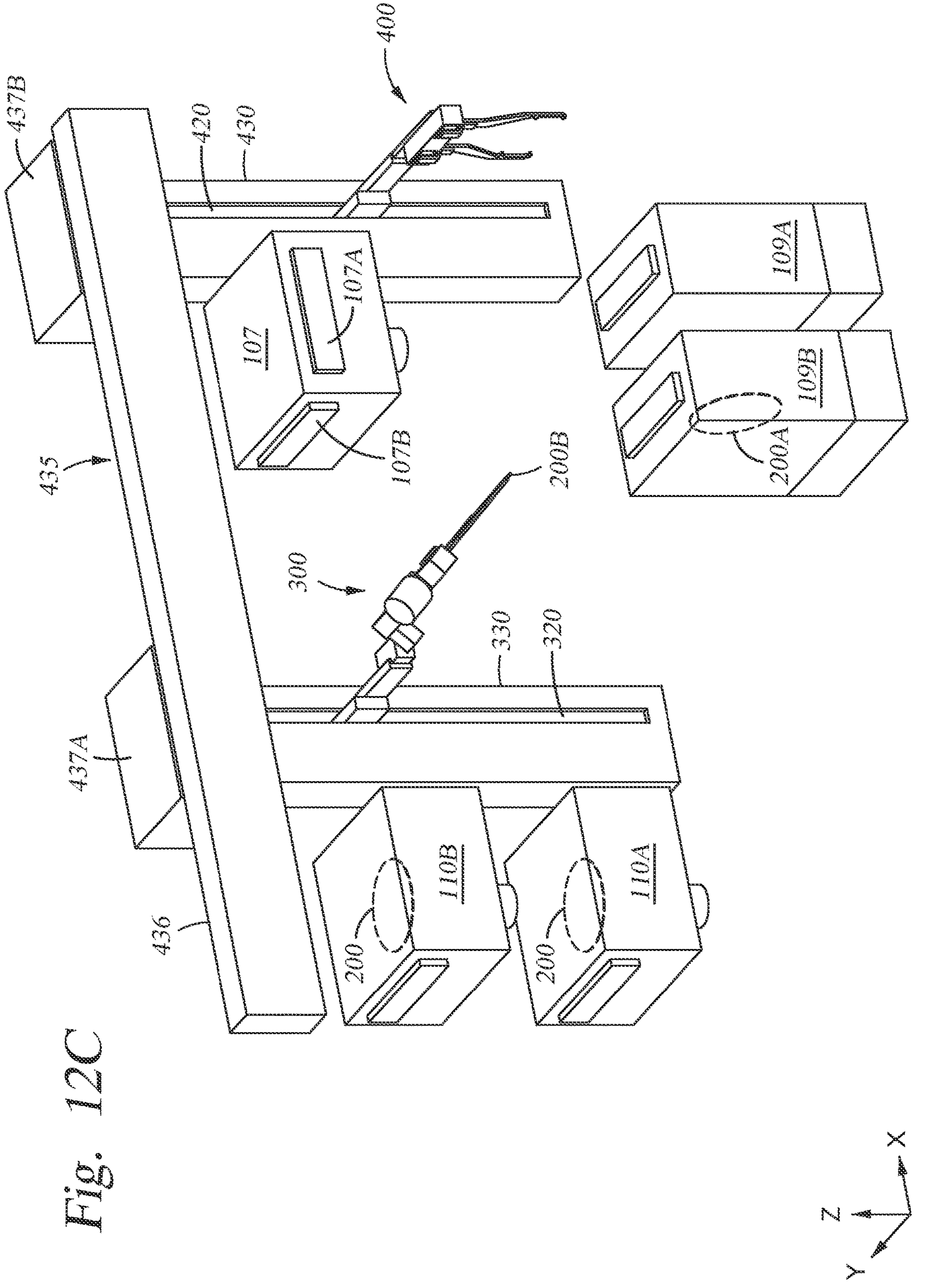
Figure 12D:
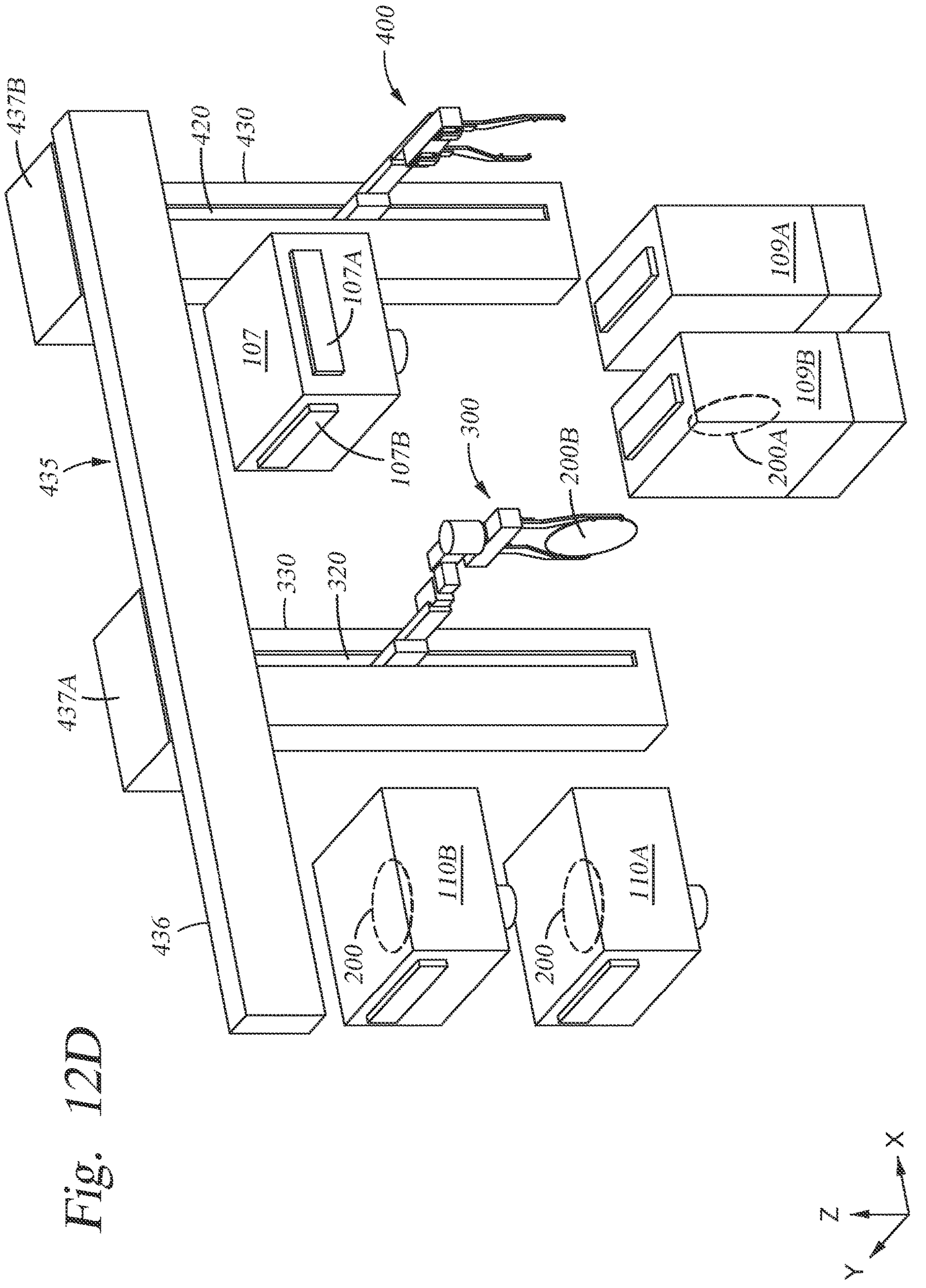
Figure 13A:
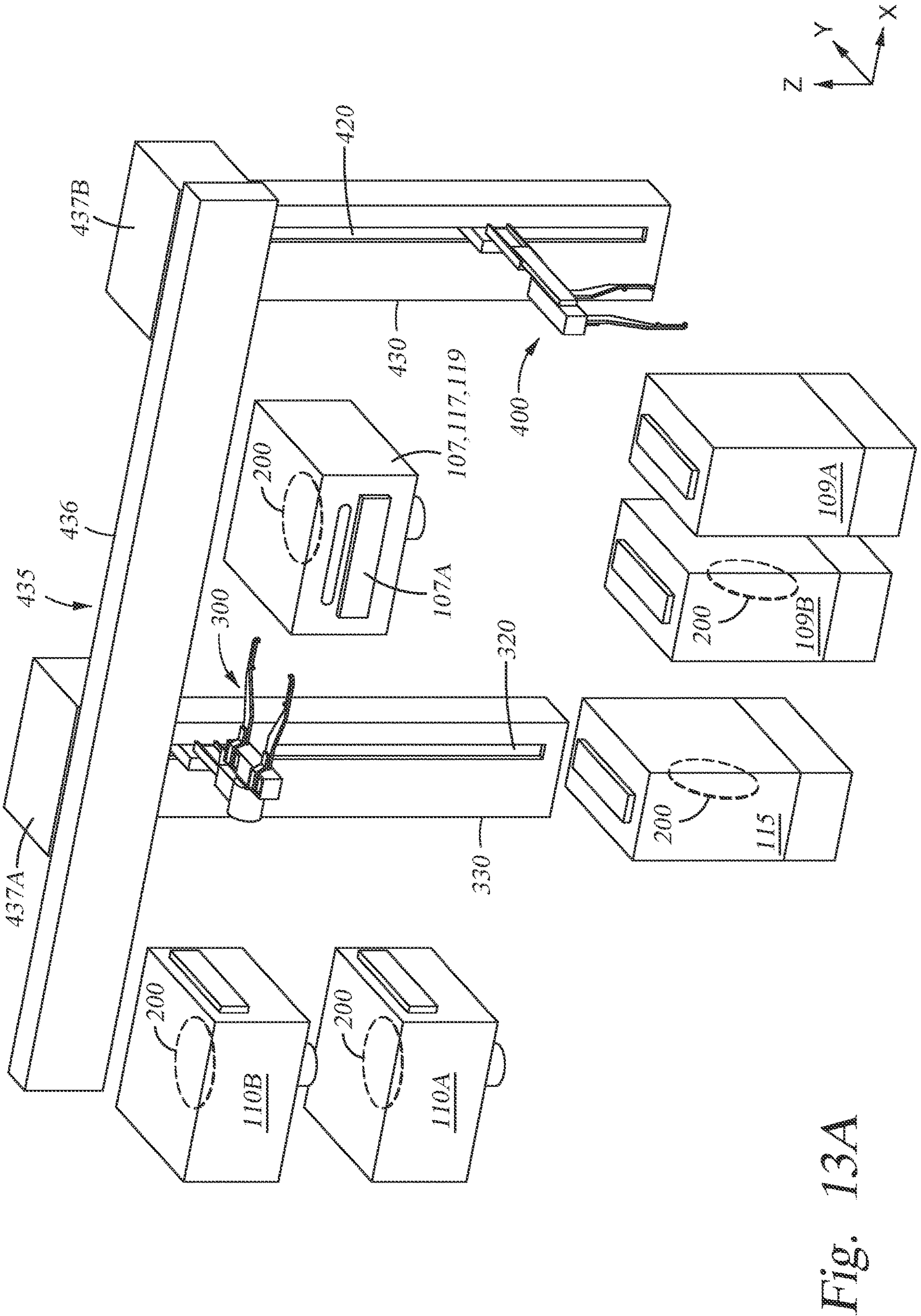
FIG. 13A is a perspective view of a portion of an enclosure that includes a number of substrate cleaning chambers, according to one or more embodiments.
Figure 13B:
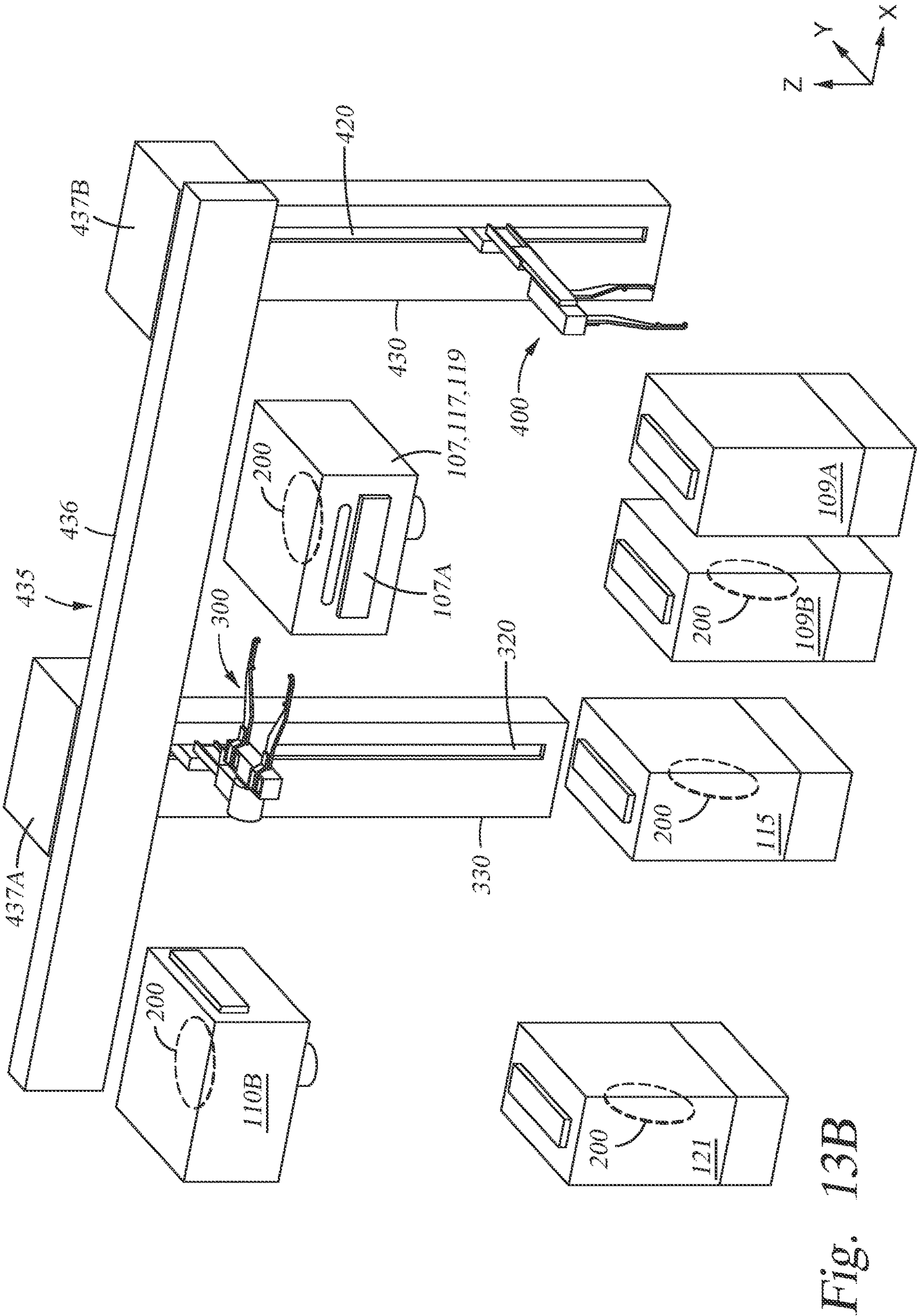
FIG. 13B is a perspective view of a portion of an enclosure that includes a number of substrate cleaning chambers, according to one or more embodiments.

In FIG. 12B, substrate 200B has been removed from the module 107 using the horizontal actuator 435A with the direction of travel of the gripping assembly shown by arrow 202. The substrate 200B is oriented with the device side up. FIG. 12C illustrates the first blade assembly 300 having rotated 45 degrees in a clockwise direction about the Y-axis from the horizontal due to the action the first blade actuator 350. In FIG. 12D, the first blade assembly 300 has oriented substrate 200B in a vertical position due to continued operation of the first blade actuator 350 and the first blade assembly has been lowered in the enclosure to a height just above the vertical cleaning modules 109A, 1098 by operation of the vertical actuator 320. Note in FIG. 12D, substrate 200B is oriented with the device side facing the right side of the enclosure.

Figure 12E:
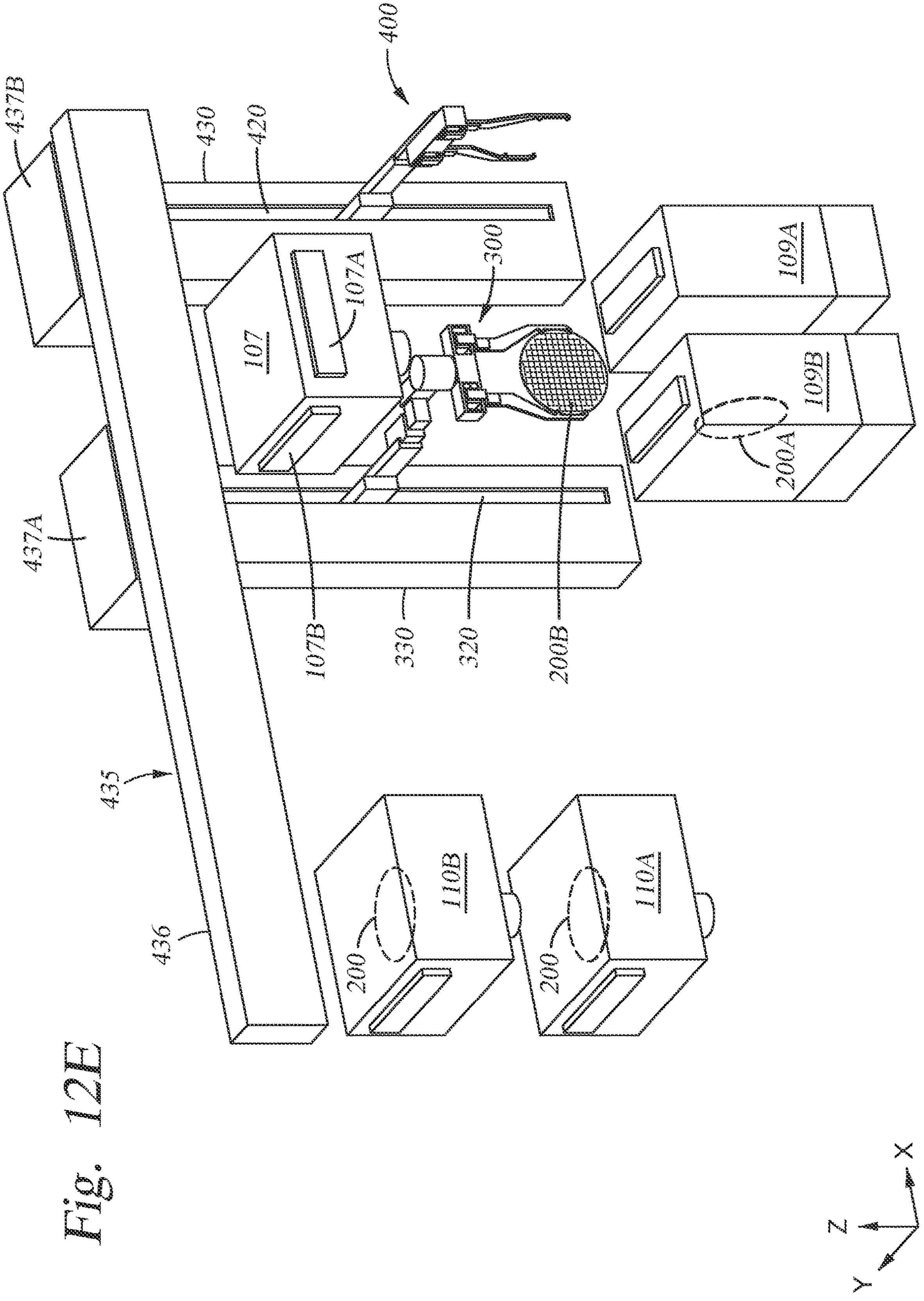
Figure 12F:
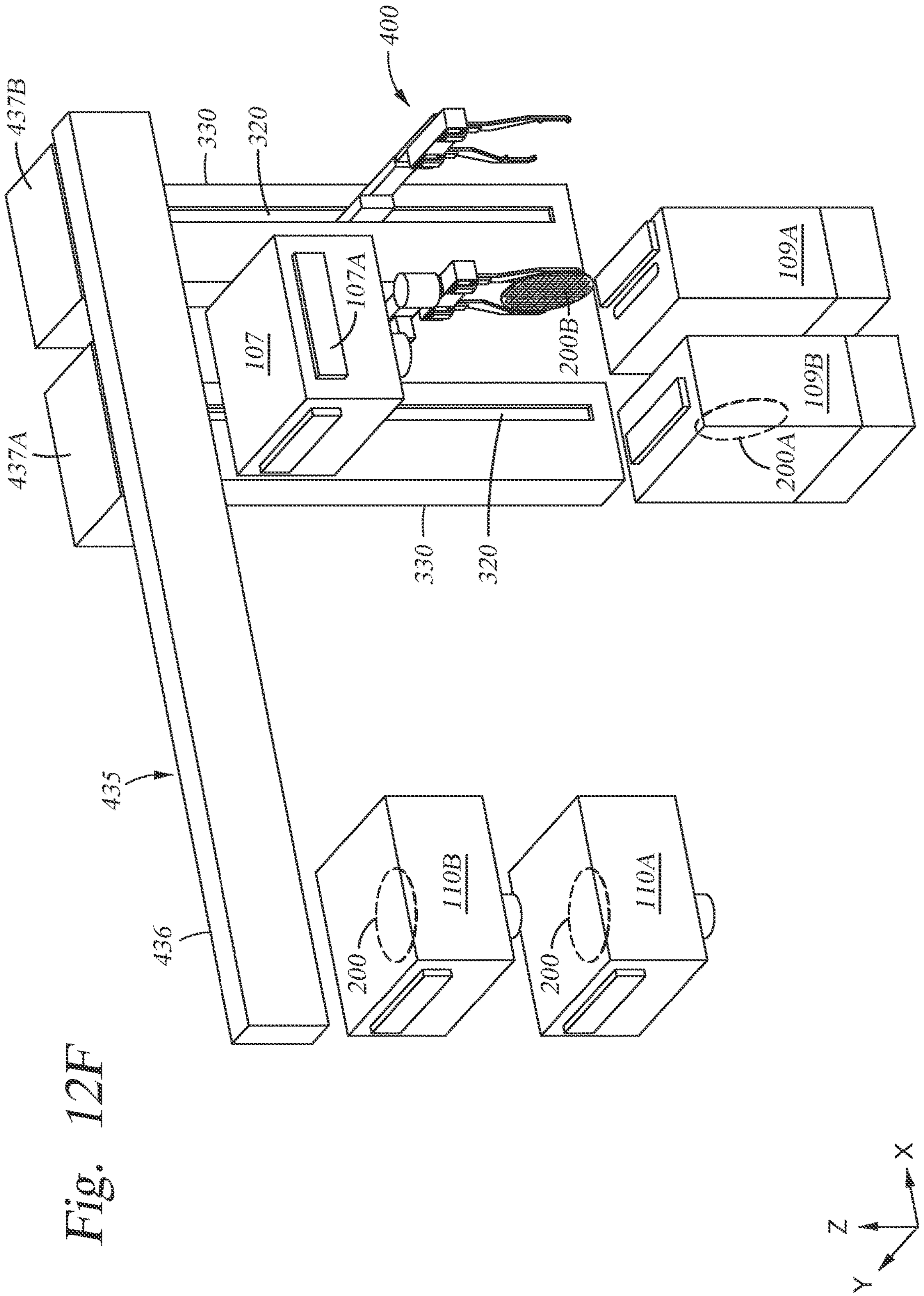

FIG. 12E shows the first blade assembly 300 oriented in a manner whereby substrate 200B has rotated 90 degrees due to operation of the second blade actuator 355 and is facing the side of the enclosure. In FIG. 12F substrate 200B is ready to be lowered into the first vertical cleaning module 109A. Not only has the blade assembly 300 moved horizontally due to the work of the horizontal actuator 435A but in addition the first blade assembly 300, using the second blade actuator 355 has rotated the substrate 180 degrees from the FIG. 12D configuration, thereby causing the device side of the substrate 200B to face the left side of the enclosure which will minimize movements necessary to place the substrate in one of the integrated clean and dry modules 110A, 1108 later in the process sequence.

Figure 12G:
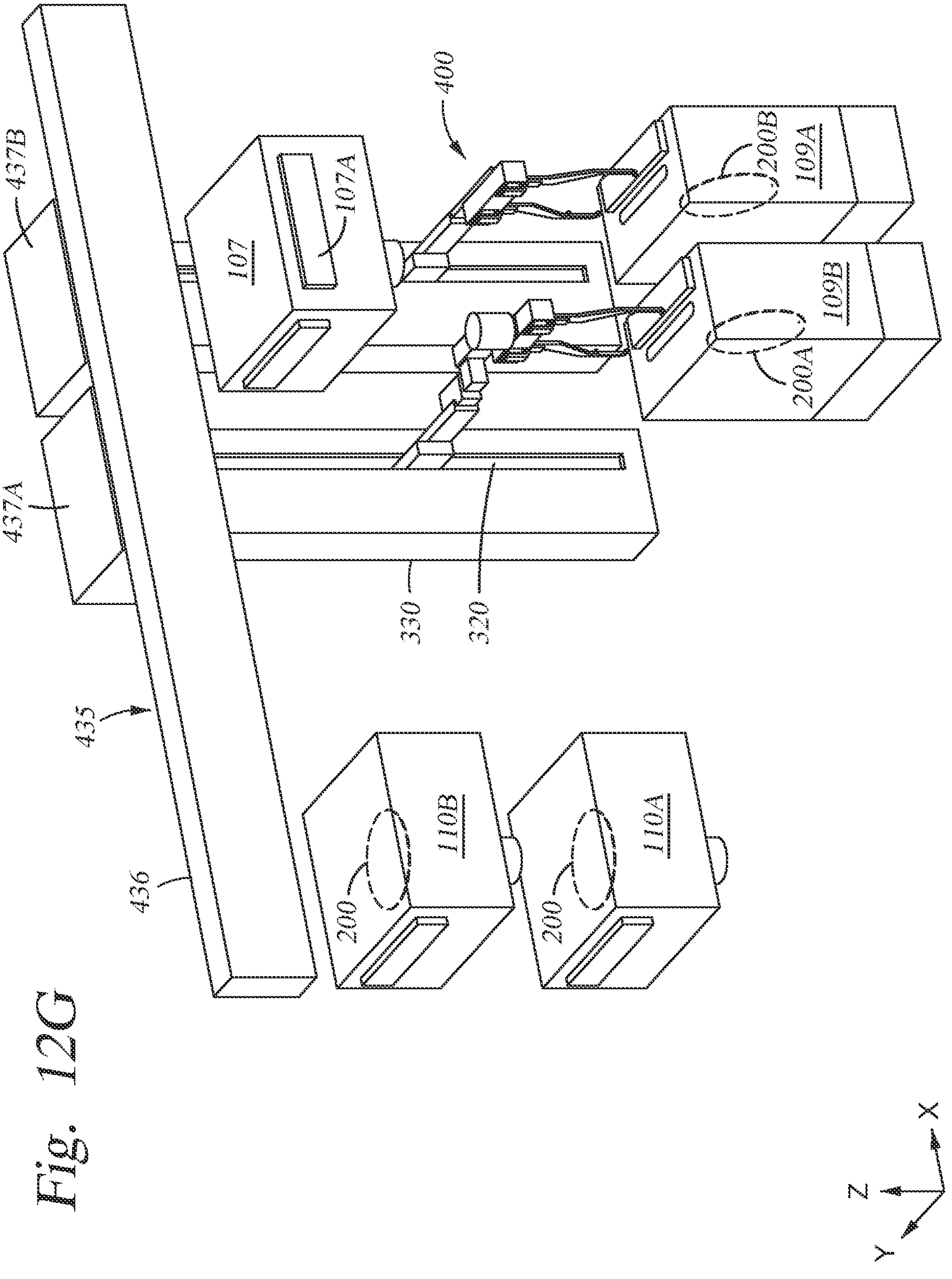
Figure 12H:
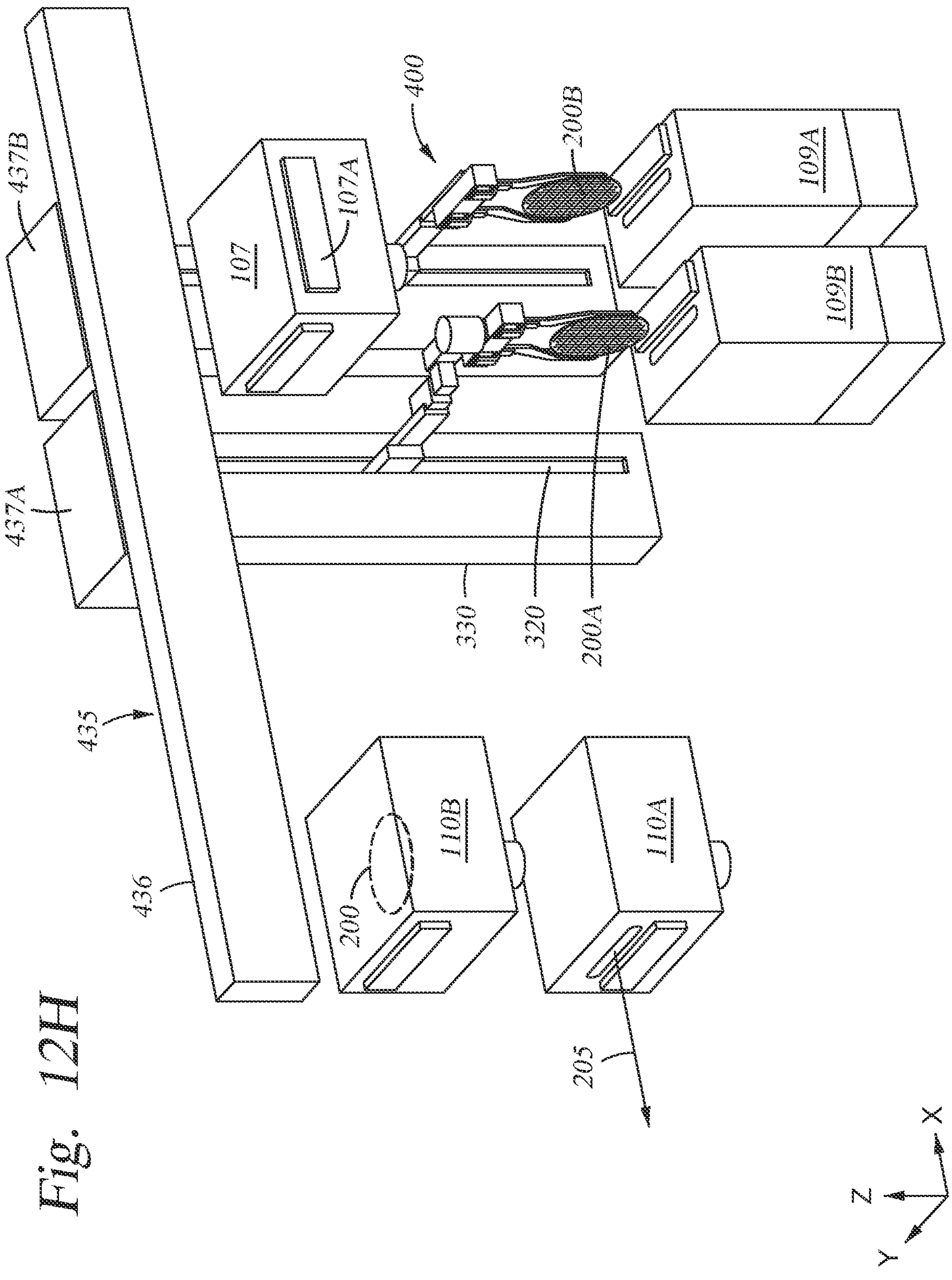

FIG. 12G illustrates the first blade assembly 300, after depositing substrate 200 in the first vertical cleaning module 109A, having repositioned itself over the second vertical cleaning module 109B where the first substrate 200A has already undergone a cleaning operation. The movement and position of the blade assembly 300 is the result of movement by the horizontal and vertical actuators 435A, 320. In addition to the movement of the first blade assembly 300, the second blade assembly 400 has simultaneously utilized its own horizontal and vertical actuators 435B, 420 to position itself above the first vertical cleaning module 109A in preparation to retrieve the second substrate 200B previously deposited there by the first blade assembly 300. In FIG. 12H, each blade assembly 300, 400 has extracted its corresponding substrate 200A, 200B from vertical cleaning modules 109A, 109B using their respective vertical actuators. At this point, the first substrate 200A is ready to be transported to one of the integrated clean and dry modules 110A, 1108 on the left side of the enclosure. The substrate that was in integrated clean and dry module 110A has been processed and has been extracted from the integrated clean and dry module with the movement shown by arrow 205 by use of the first substrate handler 103. It will be understood that in some cleaning operations, some steps take longer than others. For that reason, two integrated clean and dry modules are provided in the cleaning unit 106A to compensate for the additional time needed to complete the clean and dry step performed in an integrated clean and dry module.

In some configurations, two integrated clean and dry modules are provided in the cleaning unit 106A to allow a cleaning process to be performed on a substrate in one of the integrated clean and dry modules, such as integrated clean and dry module 110A, and then a separate rinsing and drying process in a second integrated clean and dry module 110, such as the integrated clean and dry module 110B. In one example, during a processing sequence, after a substrate is processed in the integrated clean and dry module 110A it is then transferred by the first blade assembly 300 to the integrated clean and dry module 110B for further processing before the first substrate handler 103 retrieves the substrate from the integrated clean and dry modules 110B.

Figure 12I:
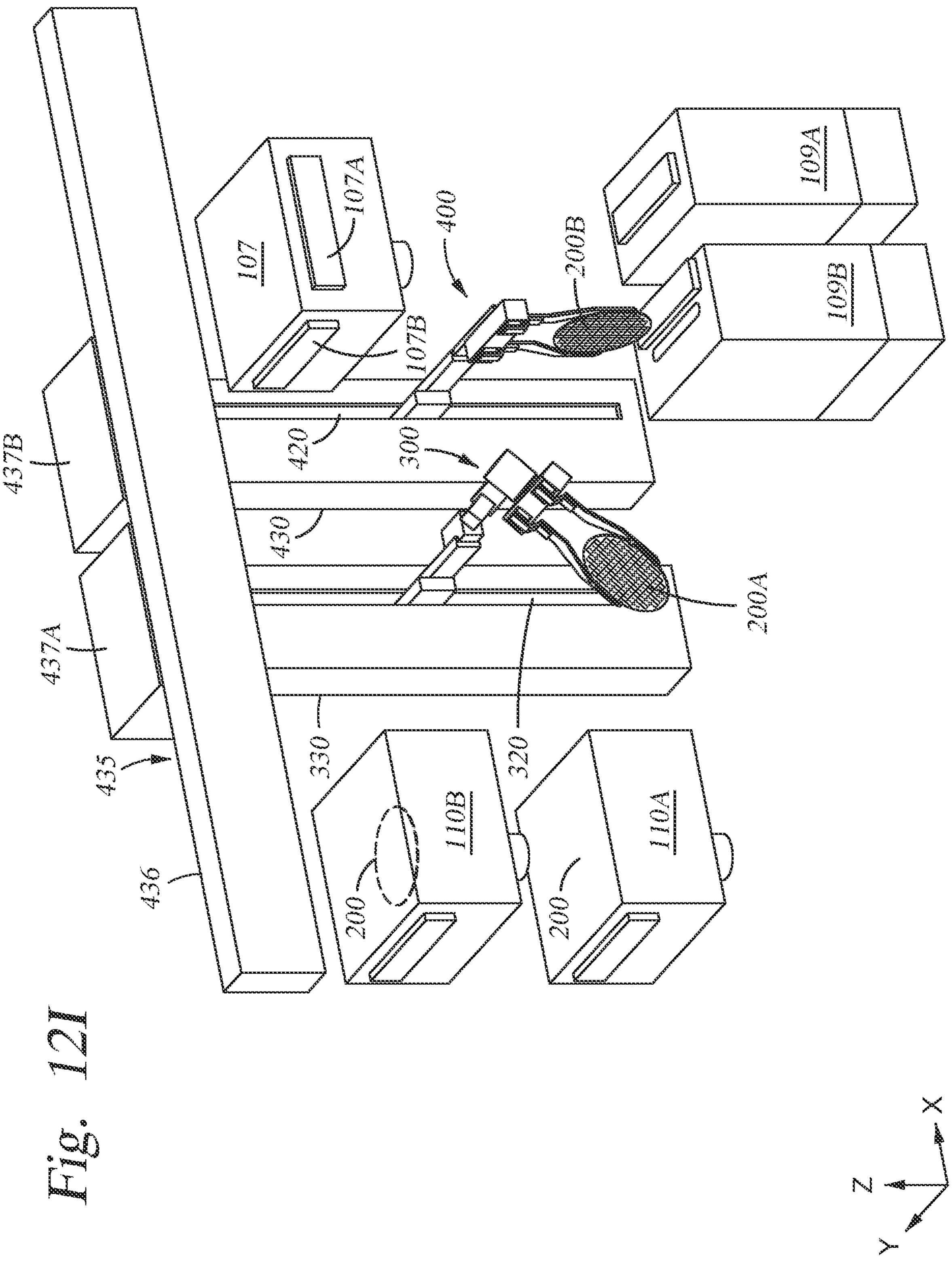
Figure 12J:
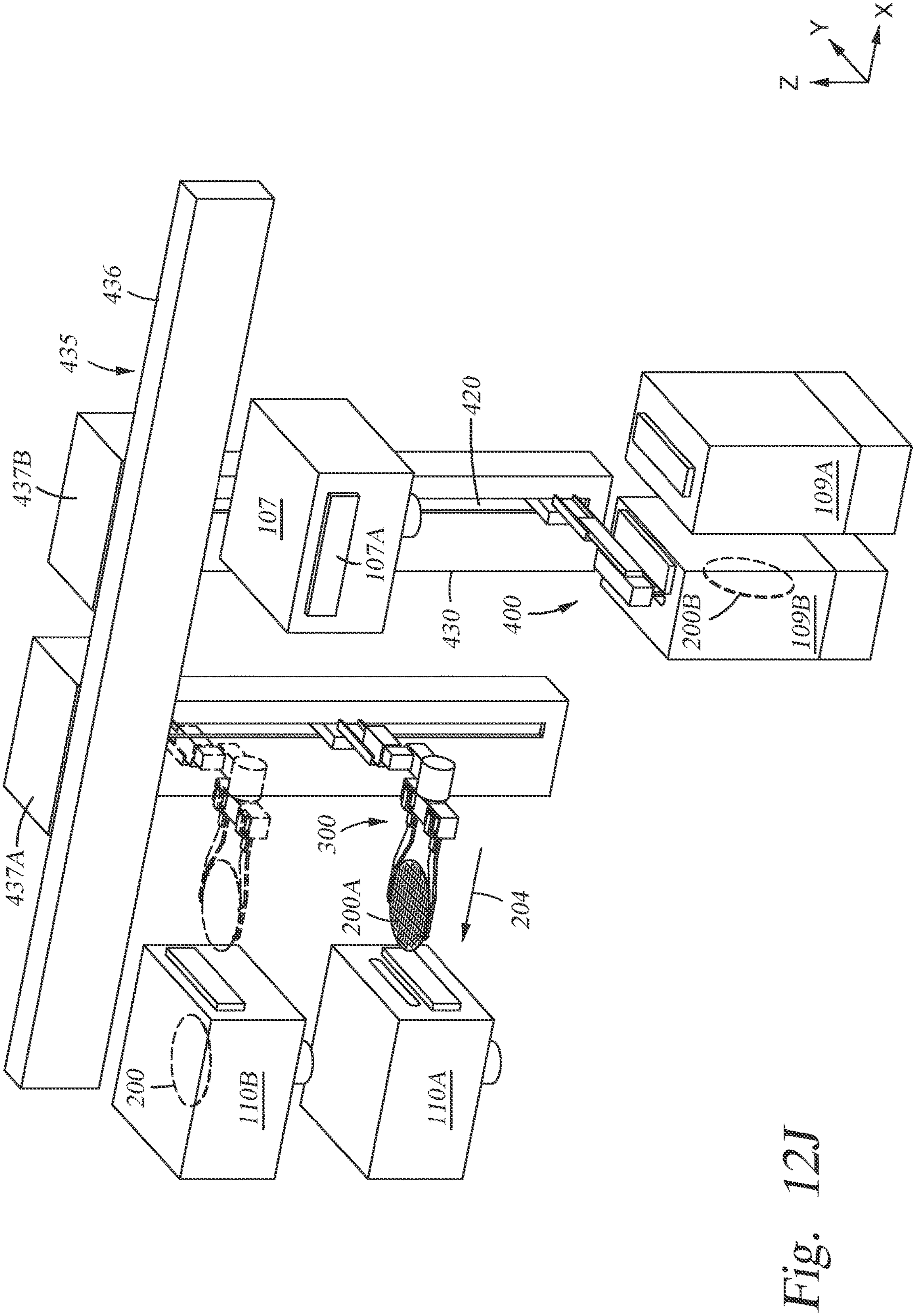

FIG. 12I shows both substrates 200A, 200B having been moved horizontally towards the left side of the enclosure. In the case of substrate 200B, the second blade assembly 400 has been moved by its horizontal actuator 435B to a location just above the second vertical cleaning module 109B for insertion therein. In the case of the substrate 200A, the first blade assembly 300 has been moved by its horizontal actuator 435A towards the integrated clean and dry module 110A, 110B. Additionally, the first blade actuator 350 has rotated the gripping assembly 360 assembly and with it substrate 200A towards a horizontal position. Note that in FIG. 12I both substrates are arranged with their device sides facing the left side of the enclosure. In FIG. 12J, the first substrate 200A has assumed a completely horizontal position with the device side up and is being inserted into integrated clean and dry module 110A with its movement shown by arrow 204 by use of the horizontal actuator 435A.

At the same time, the second substrate 200B has been inserted into the second vertical cleaning module 109B by vertical movement of the second blade assembly 400 by use of the vertical actuator 420. Also shown in dotted lines in FIG. 12J is the first blade assembly 300 placing a subsequent substrate in the second integrated clean and dry module 110B, as it will do every other cycle, thereby giving each substrate twice as long in an integrated clean and dry module as in the other types of modules.

It is important to appreciate that due to the first blade assembly's ability to manipulate the substrate in two different axes early in the process i.e., between the horizontal pre-clean module 107, the first vertical cleaning module 109A, the most critical transfer between the second vertical cleaning module 109B and the integrated clean and dry modules 110 can be performed rapidly in a small amount of space with little manipulation and the device side of the substrate is already facing the correct direction to be inserted within the integrated clean and dry module 110A. The exposure of the substrate to damage from water spots due to premature air drying and unwanted corrosion of materials (e.g., metals) on the substrate surface are thereby substantially reduced. A more realistic distance between two of the cleaning modules is shown in FIGS.

1A-1B and 8 where it can be appreciated that the distance "D" between a first cleaning module and second cleaning module, such as the horizontal pre-clean module 107 and integrated clean and dry module 110B, is only slightly greater than the overall length "L" of the first blade assembly 300. In one embodiment, the distance D between the first cleaning module and the second cleaning module is between 102% and 125%, such as between about 102% and 110% or even between about 104% and 106%, of the overall length L of the first blade assembly 300 with a substrate 200 positioned between the blades 370. As illustrated in FIG. 8, the overall length L is defined as the distance from furthest most point on the edge of substrate 200 to the furthest most point on the opposing side of the first blade assembly 300 that is disposed between the adjacently positioned cleaning modules, such as the horizontal pre-clean module 107 and the integrated clean and dry module 110B. In one example, the overall length L is between about 500 mm and 550 mm for first blade assembly 300 that is configured to transfer 300 mm substrates. In some embodiments, in which a rotational movement about the axis A1 (FIG. 8) is to be performed in a narrow space or region within the cleaning units 106A, 106B, the first blade assembly 300 may be configured to have a sweep envelope length that is a small percentage larger than the overall length L dimension, such as between 0% and 5% larger, or between 0.5% and 3% larger. The sweep envelope length is generally defined by the length of the outer extents of a swept volume of the rotating portion of the blade assembly 300 that is projected on a plane that is parallel to the major surface of the substrate 200 (i.e., X-Y plane in FIG. 8) and contains the axis of rotation (i.e., axis A1). Minimizing the sweep envelope length is useful to assure that portions of the first blade assembly 300 will not collide with components within the cleaning units 106A, 106B as the first blade assembly 300 is rotated during a transferring process (e.g., 90 degree rotation) due to the first blade assembly 300 having a thickness in a direction (e.g., Z-direction in FIG. 8) that is perpendicular to the plane from which the swept envelope length is measured. In configurations where the sweep envelope length is greater 0%, the distance between the first cleaning module and the second cleaning module can be configured to be the sweep envelope length percentage plus an additional percentage to reduce the chance of a collision with components within the cleaning units 106A, 106B due to robot or calibration error. In one example, where it is advantageous to rotate the substrate in a position between cleaning modules, and the sweep envelope length is 3% greater than the overall length L and the desired minimum spacing to avoid robot or calibration error related collisions is 102%, the spacing between modules can be set to 105% of the overall length L. However, in an effort to minimize the footprint of the cleaning units 106A, 106B it may be desirable to prevent the blade assembly from being rotated in certain regions of the cleaning units 106A, 106B, such as between a first cleaning module and a second cleaning module, so that the spacing between modules can be set to a value that is less than the sweep envelope length.

Figure 12K:
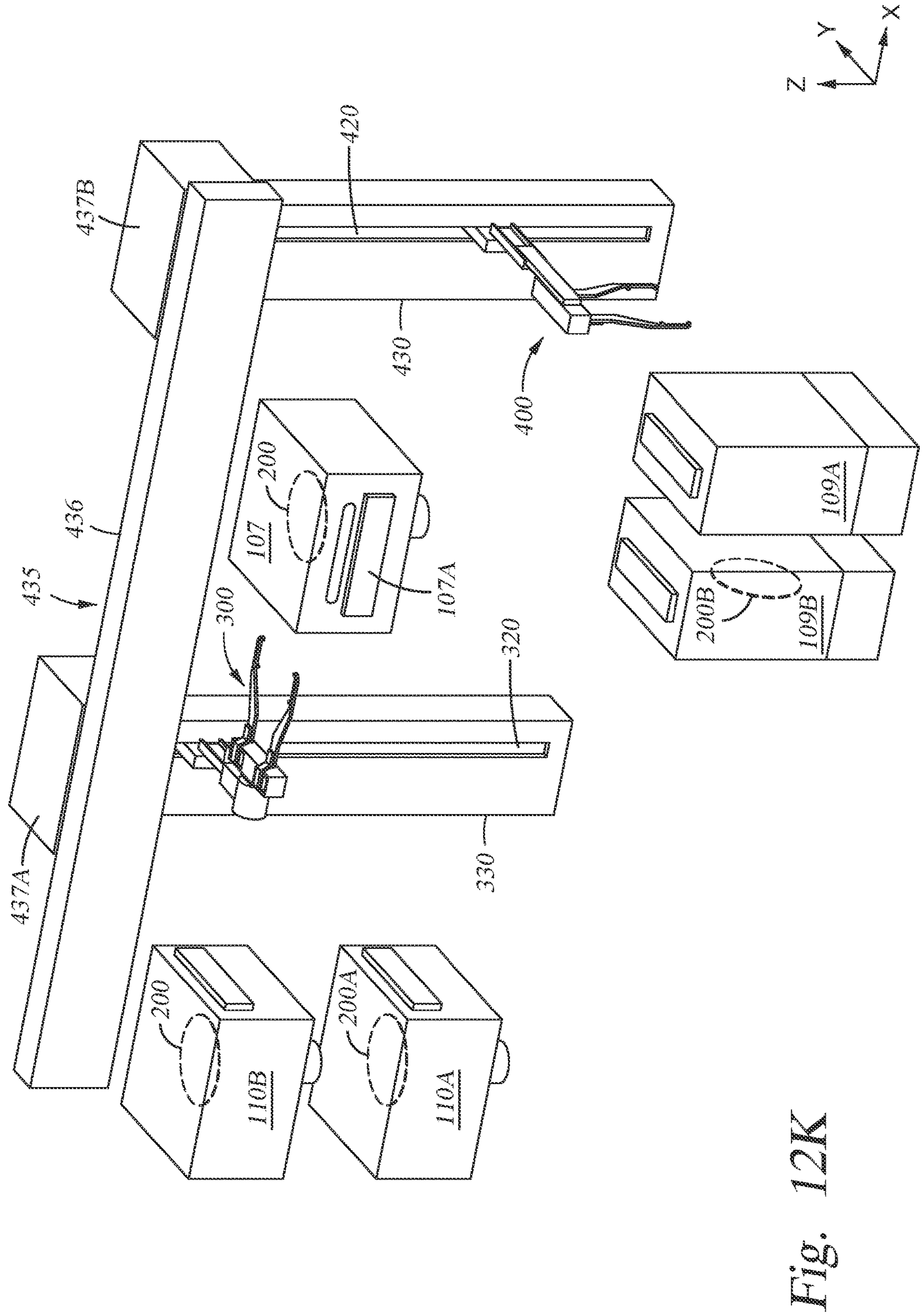

In FIG. 12K, shows the position of the assemblies at the end of a cycle. Each of the two integrated clean and dry modules 110A, 110B are simultaneously acting on a substrate 200 while another substrate is being acted upon by the second vertical cleaning module 109B. Meanwhile, the first blade assembly 300 is ready to remove another substrate 200 from the horizontal pre-clean module 107 so that the substrate can be deposited into the first vertical cleaning module 109A.

FIG. 13A illustrates a portion of cleaning unit 106A, 106B that includes four different types of cleaning chambers, which are configured to include a first cleaning module 107, two second cleaning modules 109, two third cleaning modules 110 and the fourth cleaning module 115. In some embodiments, the fourth cleaning module 115 includes components that are configured to process a substrate in a vertical orientation, as shown in FIG. 13A. During a cleaning processing sequence performed in a cleaning system 106, which includes the use of a fourth cleaning module 115, the processes performed in the fourth cleaning module 115 (e.g., non-contact cleaning processes) are performed after the buffing and/or brush scrubbing processes are performed in the second cleaning module 109 and before the rinsing and drying processes are performed in the third cleaning module 110. As illustrated in FIG. 13A, the fourth cleaning module 115 can also be physically positioned between the second cleaning module 109 and the third cleaning module 110, and the first cleaning module 107 can be positioned over the fourth cleaning module 115.

FIG. 13B illustrates a portion of cleaning unit 106A, 106B that includes five different types of cleaning chambers, which are configured to include a first cleaning module 107, two second cleaning modules 109, two third cleaning modules 110, the fourth cleaning module 115 and a fifth cleaning module 121. In some embodiments, the fifth cleaning module 121 includes components that are configured to process a substrate in a vertical orientation, as shown in FIG. 13B. During a cleaning processing sequence performed in a cleaning system 106, which includes the use of a fifth cleaning module 121, the processes performed in the fifth cleaning module 121 (e.g., vertical vapor drying processes) are performed after the buffing and/or brush scrubbing processes are performed in the second cleaning module 109, after the cleaning processes performed in the fourth cleaning module 115 and/or before the drying processes are performed in the third cleaning module 110. As illustrated in FIG. 13B, the fifth cleaning module 121 can be physically positioned between the fourth cleaning module 115 and the third cleaning module 110, and the first cleaning module 107 can be positioned over the fourth cleaning module 115.

The fifth cleaning module 121 can include a first horizontally oriented spray bar (not shown) that is positioned above and to a side of a substrate that is vertically oriented and position on a support within the fifth cleaning chamber 121. The first horizontally oriented spray bar is adapted to spray a rinsing fluid, such as deionized water (with or without a cleaning agent such as a surfactant), on a major surface of the vertically oriented substrate as the substrate is lifted from the enclosure by a robotic element (not shown) coupled to the fifth cleaning module. In one configuration, the delivery of the rinsing fluid is provided so that a meniscus forms on the surface of the substrate as it is lifted from the enclosure by the robotic element. In another configuration, the fifth cleaning module 121 includes a DI water bath in which the substrate is immersed so that a meniscus forms on the surface of the substrate as it is lifted from the enclosure by the robotic element. A second horizontally oriented spray bar (not shown), which can be positioned vertically above the first horizontally oriented spray bar, is adapted to also direct a drying vapor (e.g., as an isopropyl alcohol (IPA) vapor) to the major surfaces of the substrate and the rinsing fluid's meniscus to utilize the Marangoni effect to dry the substrate as it is being lifted from the chamber by the robotic element. The blade assembly 300 or first substrate handler 103 can then retrieve the dried substrate from the robotic element and then transfer the substrate to a desired position within a FOUP.

Figure 13C:
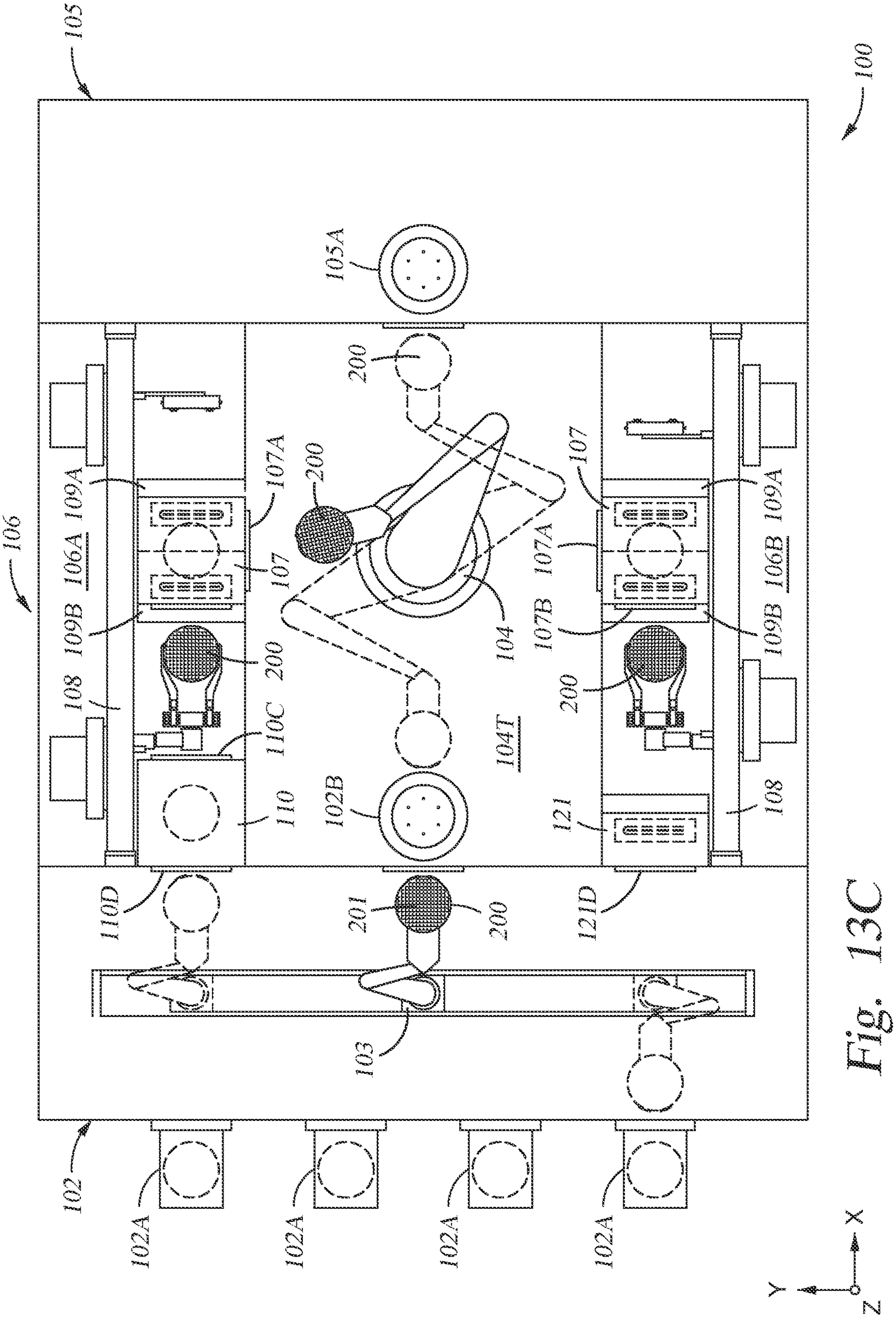
FIG. 13C is a schematic top view of an alternate chemical mechanical polishing (CMP) processing system configuration according to one or more embodiments.

FIG. 13C is a schematic top view of an alternate version of the CMP processing system 100 illustrated in FIG. 1A, according to one or more embodiments. In FIG. 13C illustrates the cleaning units 106A and 106B differently configured such that each of the cleaning units include different types and different numbers of cleaning chambers. In one embodiment, the cleaning unit 106A includes a cleaning unit configurations that is similar to configuration illustrated and discussed in relation to FIGS. 4 and 12A-12K, which are generally configured to include a first cleaning module 107, two second cleaning modules 109, and two third cleaning modules 110. However, in other embodiments, the cleaning unit 106A may include a cleaning unit configuration that is similar to the configuration illustrated and discussed in relation to FIG. 13A, which are configured to include one or more first cleaning modules 107, two or more second cleaning modules 109, two or more third cleaning modules 110 and one or more fourth cleaning modules 115.

As shown in FIG. 13C, in one embodiment, the cleaning unit 106B is configured differently from cleaning unit 106A, and includes one or more first cleaning modules 107, two or more second cleaning modules 109, and one or more fifth cleaning modules 121, while cleaning unit 106A is configured as shown in FIG. 4, 12A-12K or 13A. However, in other embodiments, the cleaning unit 106B may include a cleaning unit configuration that is similar to the configuration illustrated in FIG. 13B, which are configured to include one or more first cleaning modules 107, two or more second cleaning modules 109, one or more third cleaning modules 110, one or more fourth cleaning modules 115 and one or more fifth cleaning modules 121. In yet other embodiments, the cleaning unit 106B may include a cleaning unit configuration that includes one or more first cleaning modules 107, two or more second cleaning modules 109, one or more fourth cleaning modules 115 and one or more fifth cleaning modules 121. In yet other embodiments, the cleaning unit 106B may include a cleaning unit configuration that includes one or more first cleaning modules 107, two or more second cleaning modules 109, and one or more fifth cleaning modules 121.

As described in the forgoing description and corresponding Figures, the embodiments provides a space-saving apparatus and method for moving substrates through an enclosure of cleaning chambers wherein each substrate is moved through two degrees of rotation with a reduced amount of space and airtime, especially in the critical later steps of the cleaning process.

In embodiments herein, operation of the CMP processing system 100, including the third substrate handler 108, is directed by a system controller 160 (FIG. 1B). According to an embodiment, the system controller 160 may be located in the air supply and exhaust section 112. The system controller 160 includes a programmable central processing unit (CPU) 161 which is operable with a memory 162 (e.g., non-volatile memory) and support circuits 163. The support circuits 163 are conventionally coupled to the CPU 161 and comprise cache, clock circuits, input/output subsystems, power supplies, and the like, and combinations thereof coupled to the various components of the CMP processing system 100, to facilitate control thereof. The CPU 161 is one of any form of general purpose computer processor used in an industrial setting, such as a programmable logic controller (PLC), for controlling various components and sub-processors of the processing system. The memory 162, coupled to the CPU 161, is non-transitory and is typically one or more of readily available memories such as random access memory (RAM), read only memory (ROM), floppy disk drive, hard disk, or any other form of digital storage, local or remote.

Typically, the memory 162 is in the form of a non-transitory computer-readable storage media containing instructions (e.g., non-volatile memory), which when executed by the CPU 161, facilitates the operation of the CMP processing system 100. The instructions in the memory 162 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 160 may be used with one or any combination of the various modular polishing systems described herein and/or with the individual polishing chambers thereof.

The system controller 160 controls activities and operating parameters of the automated components found in the CMP processing system 100. In general, the bulk of the movement of a substrate through the processing system is performed using the various automated devices disclosed herein by use of commands sent by the system controller 160. In some embodiments, the system controller 160 is a general use computer that is used to control one or more components found in the CMP processing system 100. The system controller 160 is generally designed to facilitate the control and automation of one or more of the processing sequences disclosed herein and by use of the CPU 161, memory 162, and support circuits (or I/O). Software instructions and data can be coded and stored within the memory (e.g., non-transitory computer readable medium) for instructing the CPU 161. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various cleaning module process recipe steps being performed.

Process Sequence Examples

FIGS. 14A-14D illustrate examples of four different substrate processing sequences that can be performed in a CMP processing system 100 by use of system controller 160 and other supporting components found within the CMP processing system 100. While FIGS. 14A-14D illustrate different substrate processing sequences that can be performed in the CMP processing system illustrated in FIG. 1A, this CMP processing system configuration example is not intended to be limiting as to the scope of the disclosure provided herein.

Figure 14A:
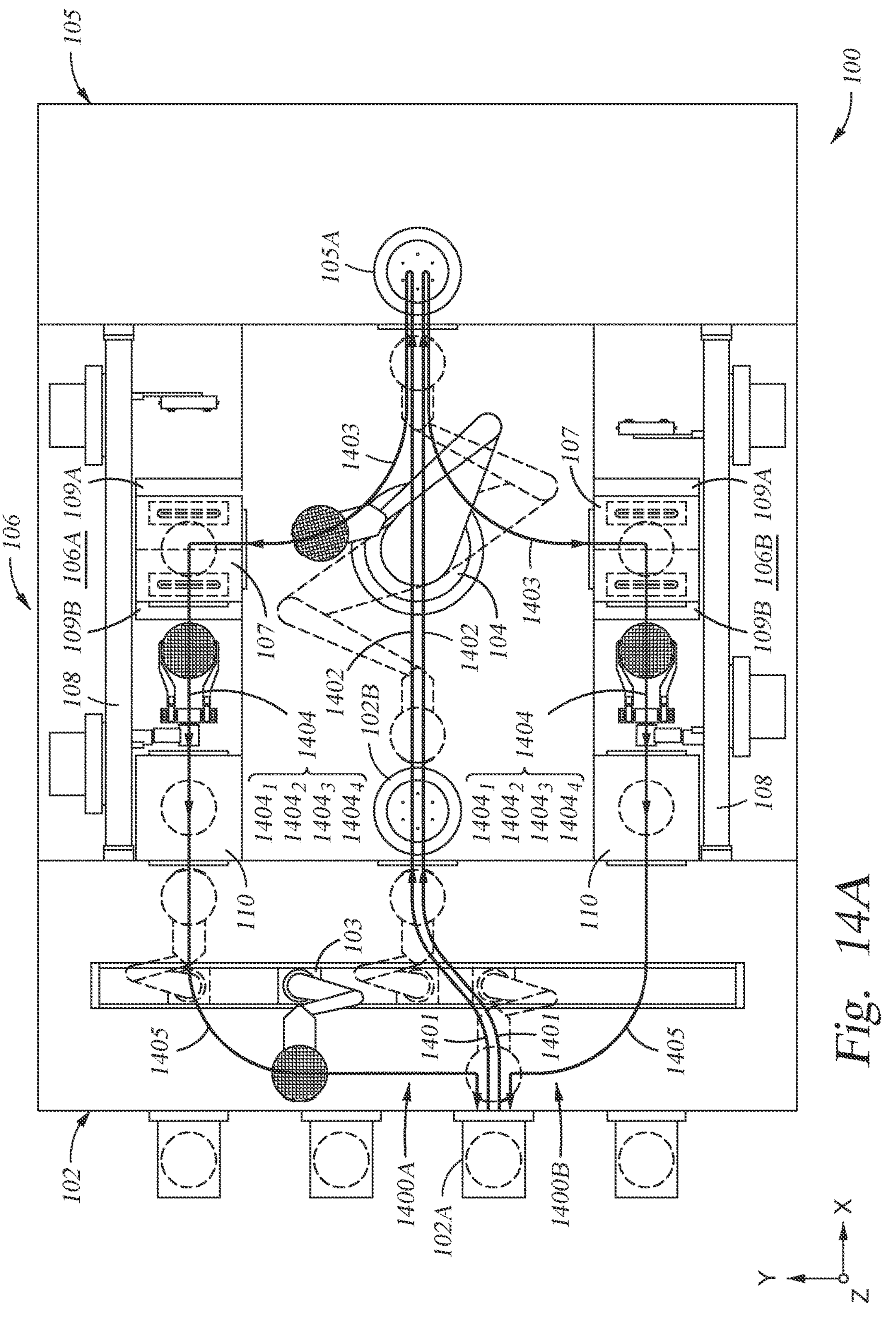
FIGS. 14A-14D illustrate different substrate processing sequences that can be performed in the CMP processing system illustrated in FIG. 1A, according to one or more embodiments.

FIG. 14A illustrates two substrate processing sequences 1400A and 1400B that can be performed in parallel within each of the cleaning units 106A, 106B by use of the first substrate handler 103, second substrate handler 104 and a third substrate handler 108. In one embodiment, the substrate processing sequences 1400A and 1400B include the same processing sequence steps that are performed in parallel on opposing sides of the cleaning system 106. Therefore, in one example, the process sequence 1400A shown in FIG. 14A begins with the first substrate handler 103 removing a substrate 200 from a loading station 102A and positioning the substrate on the cleaner pass-through 102B, as illustrated by path 1401. The second substrate handler 104 then transfers the substrate 200 from the cleaner pass-through 102B to the transfer station 105A of the polishing station 105, as illustrated by path 1402. After the substrate has been processed within one or more of the polishing modules (not shown) within polishing station 105 the substrate is once again placed within the transfer station 105A. The processes performed within the polishing station 105 can include one or more CMP polishing processes that configured to remove and planarize at least a portion of the material on a surface of the substrate. The second substrate handler 104 then transfers the substrate 200 from the transfer station 105A to the first cleaning module 107, as illustrated by path 1403. However, in cases where the first cleaning module 107 has been replaced by a horizontal input module 117 or a vertical input module 119, the second substrate handler 104 will transfer the substrate 200 from the transfer station 105A to either the horizontal input module 117 or the vertical input module 119. After a cleaning process is performed in the first cleaning module 107, the horizontal input module 117 or the vertical input module 119, the third substrate handler 108 then transfers the substrate through the cleaning modules within the a cleaning unit 106A, 106B, as illustrated by path 1404. The substrate cleaning processing sequence performed along path 1404 can include one or more of the processing path steps 14041, 14042, 14043 and 14044 for example, that require the use of the blade assemblies 300 and 400 to transfer the substrates between one or more of the second cleaning modules 109, one or more of third cleaning modules 110 and/or one or more of the fourth cleaning modules 115. In one example, as described above in relation to FIGS. 12A-12J, the substrate cleaning processing sequence performed along path 1404 includes a processing sequence that includes three processing path steps 14041, 14042, and 14044, which includes the performance of cleaning processes in a first cleaning module 107, two second cleaning modules and a third cleaning module 110. In this example, the first processing path step 14041 includes the transfer of the substrate from the first cleaning module 107 to a first second cleaning module 109 by the first blade assembly 300, the second processing path step 14042 includes the transfer of the substrate from the first second cleaning module 109 to a second second cleaning modules 109 by the second blade assembly 400, and the forth processing path step 14044 includes the transfer of the substrate from the second second cleaning module 109 to a third cleaning module 110 by the first blade assembly 300. In this example, the third processing path step 14043 is not included in the substrate processing sequence, since the substrate processing sequence does not include the use of the fourth cleaning module 115, which typically performs a cleaning process between the cleaning processes performed in the second cleaning module 109 and the third cleaning module 110. After the processes are performed within the path 1404, the first substrate handler 103 then removes the substrate 200 from a third cleaning module 110 and positions the substrate within the loading station 102A, as illustrated by path 1405. As noted above, while the process sequence 1400A is being sequentially performed on a plurality of substrates, the process sequence 1400B can also be sequentially performed on a different plurality of substrates simultaneously.

Figure 14B:
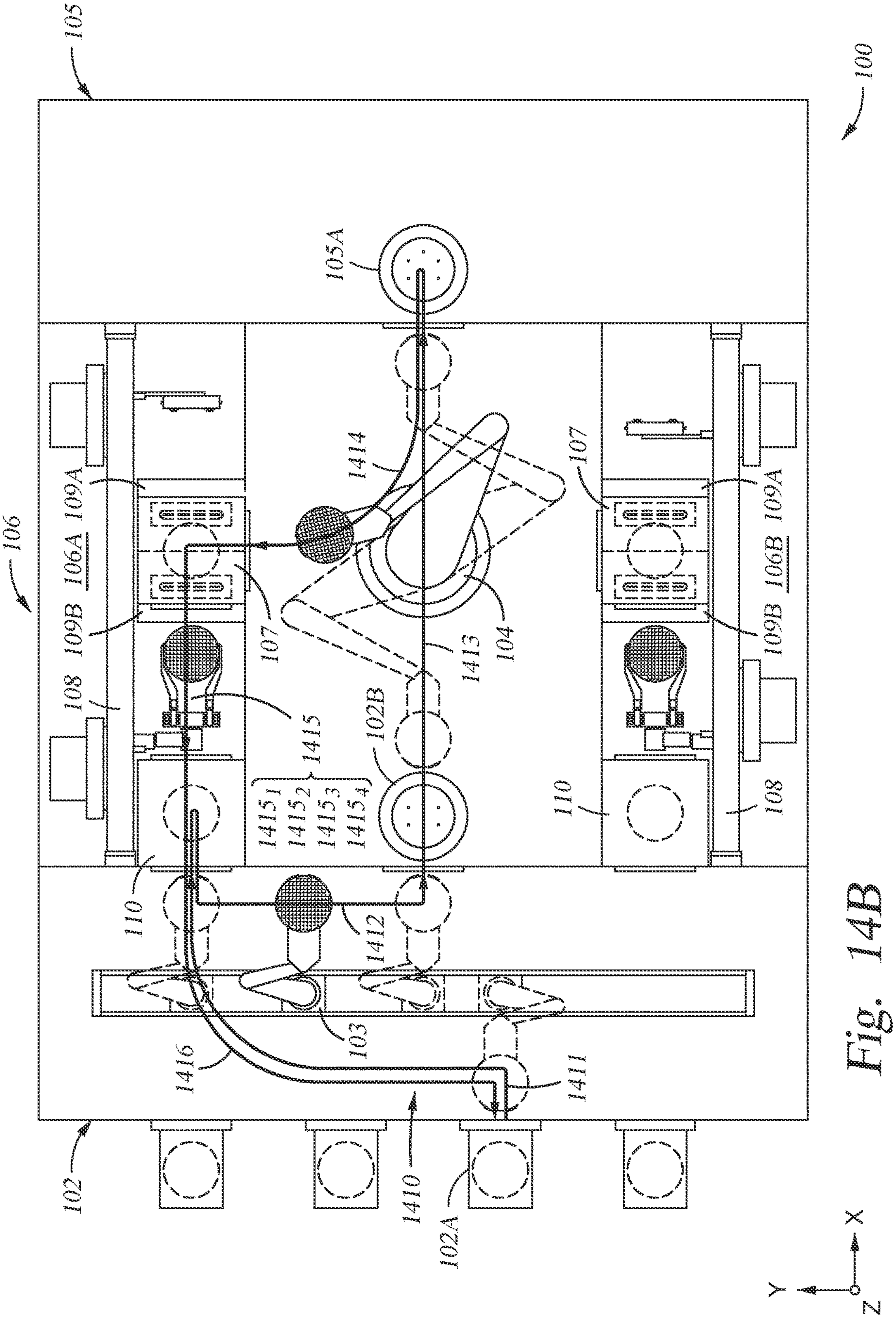

FIG. 14B illustrates substrate processing sequences 1410 that can be performed within either of the cleaning units 106A, 106B by use of the first substrate handler 103, the second substrate handler 104 and a third substrate handler 108. In one embodiment, the substrate processing sequences 1410 is performed in parallel on opposing sides of the cleaning system 106. In one example, the process sequence 1410 shown in FIG. 14B begins with the first substrate handler 103 removing a substrate 200 from a loading station 102A and positioning the substrate in a third cleaning module 110 so that a cleaning process can be performed on the incoming substrate, as illustrated by path 1411. After the cleaning process is performed on the substrate, the first substrate handler 103 removes the substrate from the third cleaning module 110 and positions the substrate on the cleaner pass-through 102B, as illustrated by path 1412. The second substrate handler 104 then transfers the substrate 200 from the cleaner pass-through 102B to the transfer station 105A of the polishing station 105, as illustrated by path 1413. After the substrate has been processed within one or more of the polishing modules (not shown) within polishing station 105 the substrate is once again placed within the transfer station 105A. The second substrate handler 104 then transfers the substrate 200 from the transfer station 105A to the first cleaning module 107, as illustrated by path 1414. However, in cases where the first cleaning module 107 has been replaced by a horizontal input module 117 or a vertical input module 119, the second substrate handler 104 will transfer the substrate 200 from the transfer station 105A to either the horizontal input module 117 or the vertical input module 119. After a cleaning process is performed in the first cleaning module 107, the horizontal input module 117 or the vertical input module 119, the third substrate handler 108 then transfers the substrate through the cleaning modules within the a cleaning unit 106A, 106B, as illustrated by path 1415. The substrate cleaning processing sequence performed along path 1415, as discussed above, can include one or more of the processing path steps 14151, 14152, 14153 and 14154 for example, that require the use of the blade assemblies 300 and 400 to transfer the substrates between one or more of the second cleaning modules 109, one or more of third cleaning modules 110 and/or one or more of the fourth cleaning modules 115. After one or more of the processes are performed within the path 1415, the first substrate handler 103 then removes the substrate 200 from a third cleaning module 110 and positions the substrate within the loading station 102A, as illustrated by path 1416. As noted above, while the process sequence 1410 is being sequentially performed on a plurality of substrates within the cleaning unit 106A, the process sequence 1410 can also be sequentially performed on a different plurality of substrates simultaneously within the cleaning unit 106B.

Figure 14C:
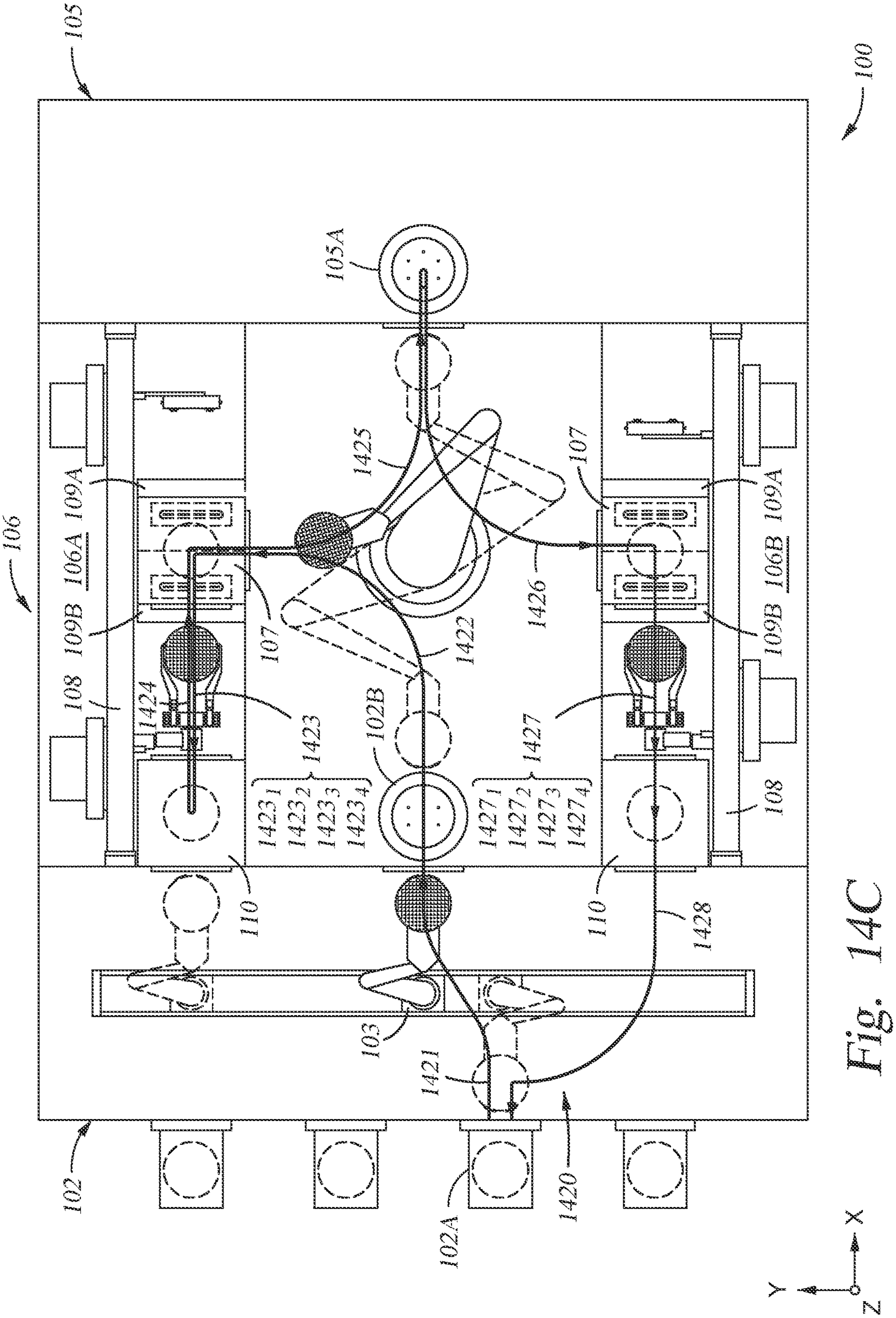

FIG. 14C illustrates substrate processing sequences 1420 that can be performed within either of the cleaning units 106A, 106B by use of the first substrate handler 103, second substrate handler 104 and a third substrate handler 108. In one embodiment, not shown in FIG. 14C, the substrate processing sequences 1420 is performed in parallel on opposing sides of the cleaning system 106. However, in some cases, as illustrated in FIG. 14C, the processing sequence can utilize both cleaning units 106A, 106B to perform different portions of the substrate processing sequence 1420. In one example, the process sequence 1420 shown in FIG. 14C begins with the first substrate handler 103 removing a substrate 200 from a loading station 102A and positioning the substrate on the cleaner pass-through 102B, as illustrated by path 1421. The second substrate handler 104 then transfers the substrate from the cleaner pass-through 102B to a first cleaning module 107 in the cleaning unit 106A, as illustrated by path 1422. However, in cases where the first cleaning module 107 has been replaced by a horizontal input module 117 or a vertical input module 119, the second substrate handler 104 will transfer the substrate 200 from the cleaner pass-through 102B to either the horizontal input module 117 or the vertical input module 119. After a cleaning process is performed in the first cleaning module 107, the horizontal input module 117 or the vertical input module 119, the third substrate handler 108 then transfers the substrate through the cleaning modules within the a cleaning unit 106A, 106B, as illustrated by path 1423. The substrate cleaning processing sequence performed along path 1423, as discussed above, can include one or more of the processing path steps 14231, 14232, 14233 and 14234 for example, that require the use of the blade assemblies 300 and 400 to transfer the substrates between one or more of the second cleaning modules 109, one or more of third cleaning modules 110 and/or one or more of the fourth cleaning modules 115. After one or more of the processes are performed within the path 1423, the first substrate handler 103 then removes the substrate 200 from a third cleaning module 110 and positions the substrate in the first cleaning module 107, the horizontal input module 117 or the vertical input module 119, as illustrated by path 1424. The second substrate handler 104 then transfers the substrate 200 from the first cleaning module 107, the horizontal input module 117 or the vertical input module 119 to the transfer station 105A of the polishing station 105, as illustrated by path 1425. After the substrate has been processed within one or more of the polishing modules (not shown) within polishing station 105 the substrate is once again placed within the transfer station 105A. The second substrate handler 104 then transfers the substrate from the transfer station 105A to a first cleaning module 107 in the cleaning unit 106B, as illustrated by path 1426. After a cleaning process is performed in the first cleaning module 107, the horizontal input module 117 or the vertical input module 119, the third substrate handler 108 then transfers the substrate through the cleaning modules within the a cleaning unit 106A, 106B, as illustrated by path 1427. The substrate cleaning processing sequence performed along path 1427, as similarly discussed above, can include one or more of the processing path steps 14271, 14272, 14273 and 14274 for example, that require the use of the blade assemblies 300 and 400 to transfer the substrates between one or more of the second cleaning modules 109, one or more of third cleaning modules 110 and/or one or more of the fourth cleaning modules 115. After the processes are performed within the path 1427, the first substrate handler 103 then removes the substrate 200 from a third cleaning module 110 and positions the substrate within the loading station 102A, as illustrated by path 1428. As noted above, while the process sequence 1410 is being sequentially performed on a plurality of substrates within the cleaning unit 106A, the process sequence 1410 can also be sequentially performed on a different plurality of substrates simultaneously within the cleaning unit 106B.

Figure 14D:
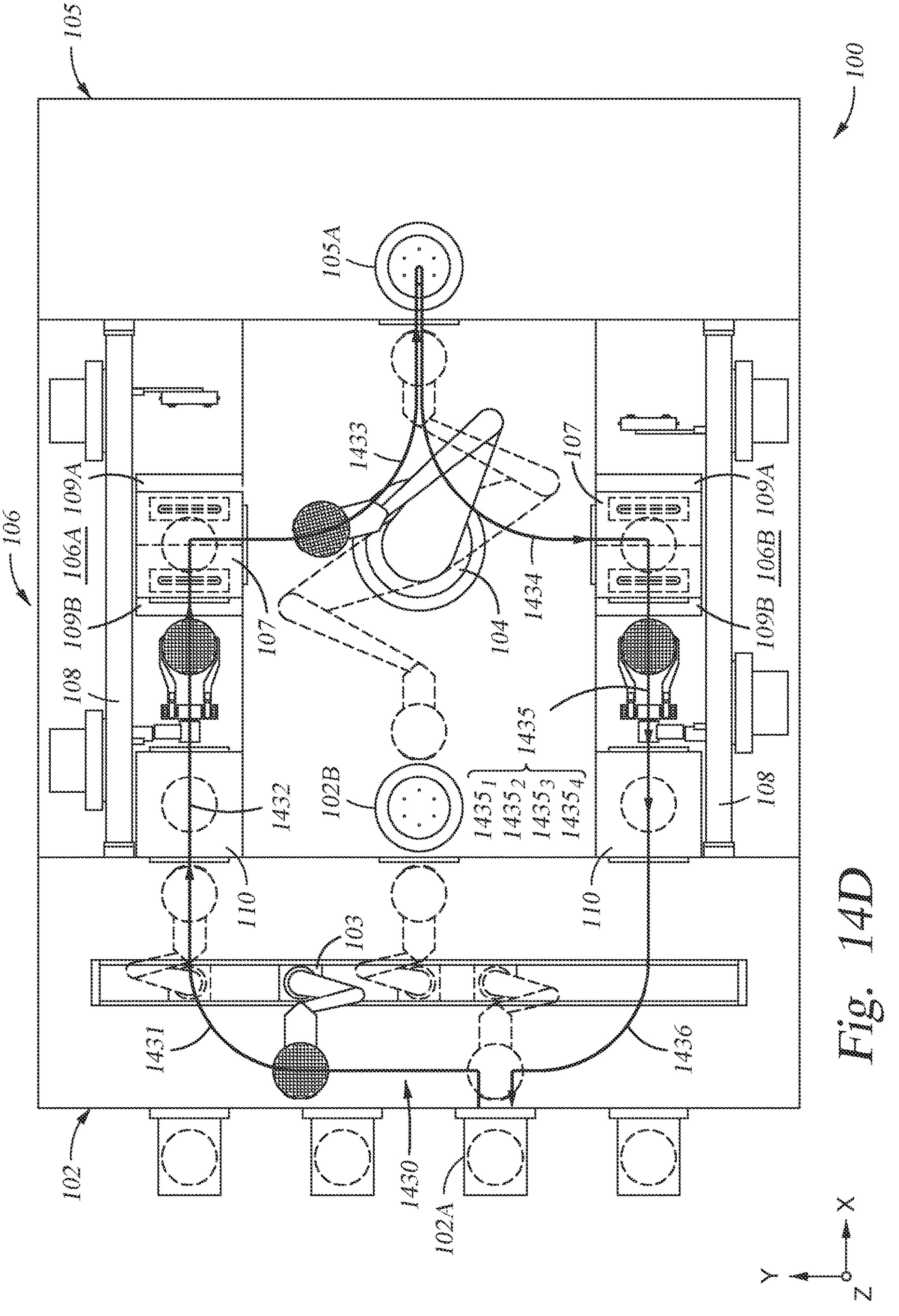

FIG. 14D illustrates substrate processing sequences 1430 that can be performed within either of the cleaning units 106A, 106B by use of the first substrate handler 103, second substrate handler 104 and a third substrate handler 108. In one embodiment, not shown in FIG. 14D, the substrate processing sequences 1430 is performed in parallel on opposing sides of the cleaning system 106. However, in some cases, as illustrated in FIG. 14D, the processing sequence can utilize both cleaning units 106A, 106B to perform different portions of the substrate processing sequence 1430. In one example, the process sequence 1430 shown in FIG. 14D begins with the first substrate handler 103 removing a substrate from a loading station 102A and positioning the substrate within a third cleaning module 110, as illustrated by path 1431. The third substrate handler 108 then transfers the substrate through the cleaning modules within a cleaning unit 106A, 106B to the first cleaning module 107 in the cleaning unit 106A, as illustrated by path 1432. However, in cases where the first cleaning module 107 has been replaced by a horizontal input module 117 or a vertical input module 119, the third substrate handler 108 then transfers the substrate through the cleaning modules from the third cleaning module 110 to either the horizontal input module 117 or the vertical input module 119. The second substrate handler 104 then transfers the substrate from the first cleaning module 107, the horizontal input module 117 or the vertical input module 119 to the transfer station 105A of the polishing station 105, as illustrated by path 1433. After the substrate has been processed within one or more of the polishing modules (not shown) within polishing station 105 the substrate is once again placed within the transfer station 105A. The second substrate handler 104 then transfers the substrate from the transfer station 105A to a first cleaning module 107 in the cleaning unit 106B, as illustrated by path 1434. After a cleaning process is performed in the first cleaning module 107, the horizontal input module 117 or the vertical input module 119, the third substrate handler 108 then transfers the substrate through the cleaning modules within the a cleaning unit 106A, 106B, as illustrated by path 1435. The substrate cleaning processing sequence performed along path 1435, as similarly discussed above, can include one or more of the processing path steps 14351, 14352, 14353 and 14354 for example, that require the use of the blade assemblies 300 and 400 to transfer the substrates between one or more of the second cleaning modules 109, one or more of third cleaning modules 110 and/or one or more of the fourth cleaning modules 115. After the processes are performed within the path 1435, the first substrate handler 103 then removes the substrate from a third cleaning module 110 and positions the substrate within the loading station 102A, as illustrated by path 1436.

In some embodiments of any of the process sequences disclosed herein, the substrate process sequence can include performing a cleaning process (e.g., vertical vapor drying process) in the fifth cleaning module 121 prior to performing a cleaning process in the third cleaning module 110, but after performing a cleaning process in the one or more of the second cleaning modules 109, or after the one or more of the fourth cleaning modules 115 if it is present. In some other embodiments, a substrate process sequence can include performing a cleaning process (e.g., vertical vapor drying process) in the fifth cleaning module 121 as the last step in the process sequence, and thus after performing a cleaning process in the one or more of the second cleaning modules 109, or after the one or more of the fourth cleaning modules 115 if it is present.

While the foregoing is directed to embodiments of the present disclosure, other and further embodiments of the disclosure may be devised without departing from the basic scope thereof, and the scope thereof is determined by the claims that follow.

The invention claimed is:

1. A substrate handling device, comprising:

a first blade assembly comprising:

a first gripping assembly comprising a first pair of gripping blades and a first gripping actuator, wherein the first gripping actuator is configured to cause a substrate to be retained between the first pair of gripping blades during a first transferring process;

a first blade actuator for rotating the first gripping assembly about a first axis, the first blade actuator comprising a first actuator motor that is coupled to a first drive gear and a first offset gear, wherein the first actuator motor is configured to rotate the first drive gear, which causes the first offset gear to rotate about the first axis, and causes the rotation of a second blade actuator and the first gripping assembly; and the second blade actuator configured for rotating the first gripping assembly about a second axis, wherein the second axis is substantially parallel to a front surface of the substrate, the second blade actuator comprising a second actuator motor that is coupled to a second drive gear and an second offset gear, wherein the second actuator motor is configured to rotate the second drive gear, which causes the second offset gear to rotate about the second axis, and causes the rotation of the first gripping assembly, wherein rotation about the first axis by the first blade actuator results in rotation of the second blade actuator and the first gripping assembly, and rotation about the second axis by the second blade actuator results in rotation of the first gripping assembly;

a first vertical actuator assembly comprising a first vertical rail and a first vertical actuator, wherein the first blade assembly is coupled to a portion of the first vertical rail and is configured to be positioned along the first vertical rail by the first vertical actuator; and a horizontal actuator assembly comprising a horizontal rail and a first rail actuator, wherein the first vertical actuator assembly is coupled to a first portion of the horizontal rail and is configured to be positioned along the horizontal rail by the first rail actuator.

2. The substrate handling device of claim 1, further comprising:

a second blade assembly comprising:

a second gripping assembly comprising a second pair of gripping blades and a second gripping actuator, wherein the second gripping actuator is configured to cause a substrate to be retained between the second pair of gripping blades during a second transferring process; and a second vertical actuator assembly comprising a second vertical rail and a second vertical actuator, wherein the second blade assembly is coupled to a portion of the second vertical rail and is configured to be positioned along the second vertical rail by the second vertical actuator, wherein the second vertical actuator assembly is coupled to a second portion of the horizontal rail and is configured to be positioned along the horizontal rail by a second rail actuator.

3. The substrate handling device of claim 2, wherein the second gripping assembly of the second blade assembly is configured to retain the substrate between the second pair of gripping blades in a vertical orientation.

4. The substrate handling device of claim 2, wherein both the first blade assembly and the second blade assembly are independently movable along the horizontal rail by use of the first and second rail actuators, respectively.

5. The substrate handling device of claim 2, wherein the first blade assembly further comprises optical means of determining a position of the first pair of griping blades relative to the substrate.

6. The substrate handling device of claim 2, further comprising:

a processor and a non-transitory computer-readable medium having instructions for performing a method, comprising:

translating a substrate retained by the first blade assembly from a processing region of a first cleaning module, wherein the substrate retained by the first blade assembly is oriented in a horizontal orientation with a device side of the substrate facing up;

rotating the substrate and the first blade assembly from the horizontal orientation to a vertical orientation using the first blade actuator of the first blade assembly;

rotating the substrate and the first blade assembly while the substrate is positioned in the vertical orientation using the second blade actuator of the first blade assembly, causing the device side of the substrate to face an opposite direction;

translating the substrate and the first blade assembly along the horizontal rail, using a first rail actuator, to a location above a second cleaning module;

inserting the substrate into a processing region of the second cleaning module using the first vertical actuator;

translating the first blade assembly along the horizontal rail, using the first rail actuator, to a third cleaning module;

transferring the substrate from the second cleaning module to the third cleaning module using the second blade assembly and the second rail actuator;

retrieving the substrate from a processing region of the third cleaning module using the first blade assembly and the first vertical actuator;

rotating the substrate and the first blade assembly from the vertical orientation to a horizontal orientation using the first blade actuator of the first blade assembly, wherein the substrate is oriented with the device side up; and inserting the substrate and the first blade assembly into a processing region of a fourth cleaning module using the first rail actuator.

7. The substrate handling device of claim 2, wherein the horizontal actuator assembly and the first vertical actuator and the second vertical actuator of the substrate handling device are positioned at an external edge of a cleaning system disposed within a chemical mechanical polishing system.

8. The substrate handling device of claim 1, further comprising a plurality of electrical cabling and/or pneumatic tubing associated with at least one of the second blade actuator and the first gripping actuator to pass through an opening formed within the second offset gear.

9. A substrate handling device, comprising:

a first blade assembly comprising:

a first gripping assembly comprising a first pair of gripping blades and a first gripping actuator, wherein the first gripping actuator is configured to cause a substrate to be retained between the first pair of gripping blades during a first transferring process;

a first blade actuator for rotating the first gripping assembly about a first axis, the first blade actuator comprising a first actuator motor that is coupled to a first drive gear and an first offset gear, wherein the first actuator motor is configured to rotate the first drive gear, which cause the first offset gear to rotate about the first axis, and causes the rotation of a second blade actuator and the first gripping assembly, wherein rotating the first gripping assembly about the first axis is configured to cause the substrate to be rotated between a horizontal and a vertical orientation during the first transferring process; and a second blade actuator configured for rotating the first gripping assembly about a second axis, the second blade actuator comprising a second actuator motor that is coupled to a second drive gear and an second offset gear, wherein the second actuator motor is configured to rotate the second drive gear, which causes the second offset gear to rotate about the second axis, and causes the rotation of the first gripping assembly, wherein the second axis is substantially parallel to a front surface of the substrate, and rotating the first gripping assembly about a second axis is configured to cause the front surface of the substrate to face an opposite direction during the first transferring process, wherein rotation about the first axis by the first blade actuator results in rotation of the second blade actuator and the first gripping assembly, and rotation about the second axis by the second blade actuator results in rotation of the first gripping assembly;

a first vertical actuator assembly comprising a first vertical rail and a first vertical actuator, wherein the first blade assembly is coupled to a portion of the first vertical rail and is configured to be positioned along the first vertical rail by the first vertical actuator;

a second blade assembly comprising:

a second gripping assembly comprising a second pair of gripping blades and a second gripping actuator, wherein the second gripping actuator is configured to cause a substrate to be retained between the second pair of gripping blades during a second transferring process; and a second vertical actuator assembly comprising a second vertical rail and a second vertical actuator, wherein the second blade assembly is coupled to a portion of the second vertical rail and is configured to be positioned along the second vertical rail by the second vertical actuator, a horizontal actuator assembly comprising:

a horizontal rail;

a first horizontal rail actuator; and a second horizontal rail actuator, wherein:

the first vertical actuator assembly is coupled to a first portion of the horizontal rail and is configured to be positioned along the horizontal rail by the first horizontal rail actuator, and the second vertical actuator assembly is coupled to a second portion of the horizontal rail and is configured to be positioned along the horizontal rail by the second horizontal rail actuator.

10. The substrate handling device of claim 9, wherein the second gripping assembly of the second blade assembly is configured to retain the substrate between the second pair of gripping blades in a vertical orientation.

11. The substrate handling device of claim 9, wherein the first blade assembly further comprises optical means of determining a position of the first pair of griping blades relative to the substrate.

12. The substrate handling device of claim 9, wherein both the first blade assembly and the second blade assembly are independently movable along the horizontal rail by use of the first and second horizontal rail actuators, respectively.

13. The substrate handling device of claim 9, wherein the horizontal actuator assembly and the first and second vertical actuators of the substrate handling device are positioned at an external edge of a cleaning system disposed within a chemical mechanical polishing system.

* * * * *